United States Patent
Jones

(10) Patent No.: US 11,328,177 B2
(45) Date of Patent: May 10, 2022

(54) COMPUTER-BASED SYSTEMS, COMPUTING COMPONENTS AND COMPUTING OBJECTS CONFIGURED TO IMPLEMENT DYNAMIC OUTLIER BIAS REDUCTION IN MACHINE LEARNING MODELS

(71) Applicant: HARTFORD STEAM BOILER INSPECTION AND INSURANCE COMPANY, Hartford, CT (US)

(72) Inventor: Richard B. Jones, Georgetown, TX (US)

(73) Assignee: HARTFORD STEAM BOILER INSPECTION AND INSURANCE COMPANY, Hartford, CT (US)

( * ) Notice: Subject to any disclaimer, the term of this patent is extended or adjusted under 35 U.S.C. 154(b) by 0 days.

(21) Appl. No.: 17/204,940

(22) Filed: Mar. 18, 2021

(65) Prior Publication Data

US 2022/0092346 A1 Mar. 24, 2022

Related U.S. Application Data

(63) Continuation-in-part of application No. 17/025,889, filed on Sep. 18, 2020.
(Continued)

(51) Int. Cl.
*G06K 9/62* (2006.01)
*G06N 20/20* (2019.01)

(52) U.S. Cl.
CPC ......... *G06K 9/6227* (2013.01); *G06K 9/6202* (2013.01); *G06N 20/20* (2019.01)

(58) Field of Classification Search
CPC ..... G06K 9/6202; G06K 9/6227; G06N 20/20
See application file for complete search history.

(56) References Cited

U.S. PATENT DOCUMENTS

| 5,339,392 A | 8/1994 | Risberg et al. |
| 6,085,216 A | 7/2000 | Huberman et al. |

(Continued)

FOREIGN PATENT DOCUMENTS

| CA | 2845827 | 2/2013 |
| CN | 1199462 | 11/1998 |

(Continued)

OTHER PUBLICATIONS

North American Electric Reliavility Council; Predicting Unit Availability: Top-Down Analyses for Predicting Electirc Generating Unit Availavility; Predicted Unit Availability Task Force, North American Electirc Reliability Council; US; Jun. 1991; 26 pages.
(Continued)

*Primary Examiner* — Mia M Thomas
(74) *Attorney, Agent, or Firm* — Greenberg Traurig LLP

(57) ABSTRACT

Systems and methods include processors for receiving training data for a user activity; receiving bias criteria; determining a set of model parameters for a machine learning model including: (1) applying the machine learning model to the training data; (2) generating model prediction errors; (3) generating a data selection vector to identify non-outlier target variables based on the model prediction errors; (4) utilizing the data selection vector to generate a non-outlier data set; (5) determining updated model parameters based on the non-outlier data set; and (6) repeating steps (1)-(5) until a censoring performance termination criterion is satisfied; training classifier model parameters for an outlier classifier machine learning model; applying the outlier classifier machine learning model to activity-related data to determine non-outlier activity-related data; and applying the machine learning model to the non-outlier activity-related data to predict future activity-related attributes for the user activity.

20 Claims, 24 Drawing Sheets

Related U.S. Application Data

(60) Provisional application No. 62/902,074, filed on Sep. 18, 2019.

(56) References Cited

U.S. PATENT DOCUMENTS

| | | |
|---|---|---|
| 6,832,205 B1 | 12/2004 | Aragones et al. |
| 6,847,976 B1 | 1/2005 | Peace |
| 6,988,092 B1 | 1/2006 | Tang et al. |
| 7,039,654 B1 | 5/2006 | Eder |
| 7,233,910 B2 | 6/2007 | Hileman et al. |
| 7,239,984 B2 | 7/2007 | Moessner |
| 7,313,550 B2 | 12/2007 | Kulkarni et al. |
| 7,447,611 B2 | 11/2008 | Fluegge et al. |
| 7,469,228 B2 | 12/2008 | Bonissone et al. |
| 7,536,364 B2 | 5/2009 | Subu et al. |
| 7,966,150 B2 | 6/2011 | Smith et al. |
| 8,050,889 B2 | 11/2011 | Fluegge et al. |
| 8,055,472 B2 | 11/2011 | Fluegge et al. |
| 8,060,341 B2 | 11/2011 | Fluegge et al. |
| 8,195,484 B2 | 6/2012 | Jones et al. |
| 8,346,691 B1 | 1/2013 | Subramanian et al. |
| 8,548,833 B2 | 10/2013 | Jones et al. |
| 8,554,588 B2 | 10/2013 | Jones et al. |
| 8,554,589 B2 | 10/2013 | Jones et al. |
| 8,595,036 B2 | 11/2013 | Jones et al. |
| 8,676,610 B2 | 3/2014 | Jones et al. |
| 8,686,364 B1 | 4/2014 | Little, III et al. |
| 8,719,059 B2 | 5/2014 | Jones et al. |
| 8,812,331 B2 | 8/2014 | Jones et al. |
| 9,069,725 B2 | 6/2015 | Jones |
| 9,111,212 B2 | 8/2015 | Jones |
| 9,536,364 B2 | 1/2017 | Talty et al. |
| 9,646,262 B2 | 5/2017 | Phillipps et al. |
| 9,659,254 B2 | 5/2017 | Achin et al. |
| 10,198,339 B2 * | 2/2019 | Salunke ................ G06F 11/34 |
| 10,317,854 B2 | 6/2019 | Nakagawa et al. |
| 10,339,695 B2 | 7/2019 | Petkov et al. |
| 10,409,891 B2 | 9/2019 | Jones |
| 10,452,992 B2 | 10/2019 | Lee et al. |
| 10,557,840 B2 | 2/2020 | Jones |
| 10,638,979 B2 * | 5/2020 | Gupta ................ G06N 20/10 |
| 10,739,741 B2 | 8/2020 | Wenzel et al. |
| 11,007,891 B1 * | 5/2021 | Kamal ................ H02J 7/00032 |
| 2003/0171879 A1 | 8/2003 | Pittalwala et al. |
| 2003/0216627 A1 | 11/2003 | Lorenz et al. |
| 2004/0122625 A1 | 6/2004 | Nasser et al. |
| 2004/0172401 A1 * | 9/2004 | Peace ................ G06F 17/18 |
| 2004/0186927 A1 | 9/2004 | Eryurek et al. |
| 2004/0254764 A1 | 12/2004 | Wetzer et al. |
| 2005/0022168 A1 | 1/2005 | Zhu et al. |
| 2005/0038667 A1 | 2/2005 | Hileman et al. |
| 2005/0125322 A1 | 6/2005 | Lacomb et al. |
| 2005/0131794 A1 | 6/2005 | Lifson |
| 2005/0187848 A1 | 8/2005 | Bonissone et al. |
| 2006/0080040 A1 | 4/2006 | Garczarek et al. |
| 2006/0247798 A1 | 11/2006 | Subbu et al. |
| 2006/0259352 A1 | 11/2006 | Hileman et al. |
| 2006/0271210 A1 | 11/2006 | Subbu et al. |
| 2007/0035901 A1 | 2/2007 | Albrecht et al. |
| 2007/0105238 A1 * | 5/2007 | Mandi ................ G06F 17/18 |
| | | 436/518 |
| 2007/0109301 A1 | 5/2007 | Smith |
| 2008/0015827 A1 | 1/2008 | Tryon et al. |
| 2008/0104624 A1 | 5/2008 | Narasimhan et al. |
| 2008/0201181 A1 | 8/2008 | Hileman et al. |
| 2008/0300888 A1 | 12/2008 | Dell'Anno et al. |
| 2009/0093996 A1 | 4/2009 | Fluegge et al. |
| 2009/0143045 A1 | 6/2009 | Graves et al. |
| 2009/0287530 A1 | 11/2009 | Watanabe et al. |
| 2010/0036637 A1 | 2/2010 | Miguelanez et al. |
| 2010/0152962 A1 | 6/2010 | Bennett et al. |
| 2010/0153328 A1 | 6/2010 | Cormode et al. |
| 2010/0262442 A1 | 10/2010 | Wingenter |
| 2011/0153270 A1 * | 6/2011 | Hoffman ................ G06K 9/6298 |
| | | 702/179 |
| 2012/0296584 A1 | 11/2012 | Itoh |
| 2013/0046727 A1 | 2/2013 | Jones |
| 2013/0173325 A1 | 7/2013 | Coleman et al. |
| 2013/0231904 A1 | 9/2013 | Jones |
| 2013/0262064 A1 | 10/2013 | Mazzaro et al. |
| 2015/0278160 A1 | 10/2015 | Jones |
| 2015/0294048 A1 | 10/2015 | Jones |
| 2015/0309963 A1 | 10/2015 | Jones |
| 2015/0309964 A1 | 10/2015 | Jones |
| 2015/0331023 A1 | 11/2015 | Hwang et al. |
| 2017/0178332 A1 | 6/2017 | Lindner et al. |
| 2018/0189667 A1 | 7/2018 | Tsou et al. |
| 2018/0329865 A1 | 11/2018 | Jones |
| 2019/0034473 A1 | 1/2019 | Jha et al. |
| 2019/0050510 A1 | 2/2019 | Mewes et al. |
| 2019/0108561 A1 | 4/2019 | Shivashankar et al. |
| 2019/0213446 A1 | 7/2019 | Tsou et al. |
| 2019/0271673 A1 | 9/2019 | Jones |
| 2019/0287039 A1 | 9/2019 | Ridgeway |
| 2019/0303662 A1 * | 10/2019 | Madhani ................ G06K 9/6202 |
| 2019/0303795 A1 * | 10/2019 | Khiari ................ G06N 5/003 |
| 2020/0004802 A1 | 1/2020 | Jones |
| 2020/0074269 A1 | 3/2020 | Trygg et al. |
| 2020/0104651 A1 | 4/2020 | Jones |
| 2020/0160180 A1 * | 5/2020 | Lehr ................ G06N 3/08 |
| 2020/0160229 A1 | 5/2020 | Atcheson |
| 2020/0167466 A1 | 5/2020 | Cheng |
| 2020/0175424 A1 * | 6/2020 | Kursun ................ G06K 9/6256 |
| 2020/0182847 A1 | 6/2020 | Jones |
| 2020/0201727 A1 | 6/2020 | Nie et al. |
| 2020/0311615 A1 * | 10/2020 | Jammalamadaka ... G06N 7/005 |
| 2020/0349434 A1 | 11/2020 | Zhang et al. |
| 2020/0364561 A1 | 11/2020 | Ananthanarayanan et al. |
| 2020/0387833 A1 * | 12/2020 | Kursun ................ H04L 63/1425 |
| 2020/0387836 A1 * | 12/2020 | Nasr-Azadani ........ G06N 20/20 |
| 2020/0402665 A1 | 12/2020 | Zhang et al. |
| 2021/0034581 A1 | 2/2021 | Boven et al. |
| 2021/0042643 A1 | 2/2021 | Hong et al. |
| 2021/0110313 A1 * | 4/2021 | Jones ................ G06N 3/08 |
| 2021/0136006 A1 * | 5/2021 | Casey ................ H04L 43/0882 |

FOREIGN PATENT DOCUMENTS

| | | |
|---|---|---|
| CN | 1553712 | 12/2004 |
| CN | 1770158 | 5/2006 |
| CN | 102081765 | 6/2011 |
| CN | 104090861 | 10/2014 |
| CN | 10425488 | 12/2014 |
| CN | 106471475 | 3/2017 |
| CN | 104254848 | 4/2017 |
| CN | 106919539 | 7/2017 |
| CN | 106933779 | 7/2017 |
| CN | 109299156 | 2/2019 |
| CN | ZL201410058245.X | 6/2019 |
| CN | 110378386 | 10/2019 |
| CN | 110411957 | 11/2019 |
| CN | 110458374 | 11/2019 |
| CN | 110543618 | 12/2019 |
| CN | 110909822 | 3/2020 |
| CN | 111080502 | 4/2020 |
| CN | 111157698 | 5/2020 |
| CN | 111709447 | 9/2020 |
| CN | 112257963 | 1/2021 |
| EP | 2745213 | 6/2014 |
| EP | 2770442 | 8/2014 |
| EP | 3129309 | 2/2017 |
| EP | 3483797 | 5/2019 |
| EP | 3493079 | 6/2019 |
| EP | 3514700 | 7/2019 |
| JP | 2004-068729 | 3/2004 |
| JP | 2004-530967 | 10/2004 |
| JP | 2007-522477 | 8/2007 |
| JP | 2007-522658 | 8/2007 |
| JP | 2008-503277 | 2/2008 |
| JP | 4042492 | 2/2008 |
| JP | 2008-166644 | 7/2008 |
| JP | 2009-253362 | 10/2009 |
| JP | 2010-502308 | 1/2010 |
| JP | 2010-250674 | 11/2010 |

(56) References Cited

FOREIGN PATENT DOCUMENTS

| | | |
|---|---|---|
| JP | 2012-155684 | 8/2012 |
| JP | 2014-170532 | 9/2014 |
| JP | 5592813 | 9/2014 |
| JP | 5982489 | 8/2016 |
| JP | 2017-514252 | 6/2017 |
| JP | 6297855 | 3/2018 |
| JP | 2018113048 | 7/2018 |
| JP | 2018116712 | 7/2018 |
| JP | 2018116713 | 7/2018 |
| JP | 2018116714 | 7/2018 |
| JP | 2018136945 | 8/2018 |
| JP | 2018139109 | 9/2018 |
| JP | 6527976 | 5/2019 |
| JP | 6613329 | 11/2019 |
| JP | 6626910 | 12/2019 |
| JP | 6626911 | 12/2019 |
| JP | 6636071 | 12/2019 |
| JP | 6686056 | 4/2020 |
| KR | 10-2012-0117847 | 10/2012 |
| KR | 20140092805 | 7/2014 |
| KR | 10-2024953 | 9/2019 |
| KR | 10-2052217 | 12/2019 |
| WO | 2007/117233 | 10/2007 |
| WO | 2008/126209 | 7/2010 |
| WO | 2011/080548 | 7/2011 |
| WO | 2011/089959 | 7/2011 |
| WO | 2013/028532 | 2/2013 |
| WO | 2015/157745 | 10/2015 |
| WO | 2019/049546 | 3/2019 |
| WO | 2020/260927 | 12/2020 |

OTHER PUBLICATIONS

Cipolla, Roberto et al.; Motion from the Frontier of Curved Surfaces; 5th International Conference on Computer Vision; Jun. 20-23, 1995; pp. 269-275.
Richwine, Robert R.; Optimum Economic Performance: Reducing Costs and Improving Performance of Nuclear Power Plants; Rocky Mountain Electrical League, AIP-29; Keystone Colorado; Sep. 13-15, 1998; 11 pages.
Richwine, Robert R.; Setting Optimum Economic Performance Goals to Meet the Challenges of a Competitive Business Environment; Rocky Mountain Electrical League; Keystone, Colorado; Sep. 13-15, 1998; 52 pages.
Int'l Atomic Energy Agency; Developing Economic Performance Systems to Enhance Nuclear Poer Plant Competitiveness; International Atomic Energy Agency; Technical Report Series No. 406; Vienna, Austria; Feb. 2002; 92 pages.
Richwine, Robert R.; Optimum Economic Availability; World Energy Council; Performance of Generating Plant Committee—Case Study of the Month Jul. 2002; Londong, UK; Jul. 2002; 3 pages.
World Energy Council; Perfrmance of Generating Plant: New Realities, New Needs; World Energy Council London, UK; Aug. 2004; 309 pages.
Richwine, Robert R.; Maximizing Avilability May Not Optimize Plant Economics; World Energy Council, Performance of Generating Plant Committee—Case Study of the Month Oct. 2004; London, UK; Oct. 2004; 5 pages.
Curley, Michael et al.; Benchmarking Seminar; North American Electirc Reliavility Council; San Diego, CA; Oct. 20, 2006; 133 pages.
Richwine, Robert R.; Using Reliability Data in Power Plant Performance Improvement Programs; ASME Power Division Conference Workshop; San Antonio, TX; Jul. 16, 2007; 157 pages.
Gang, Lu et al.; Balance Programming Between Target and Chance with Application in Building Optimal Bidding Strategies for Generation Companies; International Conference on Intelligent Systems Applications to Power Systems Nov. 5-8, 2007; 8 pages.
U.S. Patent and Trademark Office; Notice of Allowance and Fee(s) Due; issued in connection with U.S. Appl. No. 11/801,221; dated Jun. 23, 2008; 8 pages; US.
U.S. Patent and Trademark Office; Supplemental Notice of Allowability; issued in connection with U.S. Appl. No. 11/801,221; dated Sep. 22, 2008; 6 pages; US.
U.S. Patent and Trademark Office; Non-Final Office Action, issued against U.S. Appl. No. 12/264,117; dated Sep. 29, 2010' 19 pages; US.
U.S. Patent and Trademark Office; Non-Final Office Action, issued against U.S. Appl. No. 12/264,127; dated Sep. 29, 2010; 18 pages; US.
U.S. Patent and Trademark Office; Non-Final Office Action, issued against U.S. Appl. No. 12/264,136; dated Sep. 29, 2010; 17 pages; US.
U.S. Patent and Trademark Office; Interview Summary, issued in connection with U.S. Appl. No. 12/264,117; dated Mar. 3, 2011; 9 pages; US.
U.S. Patent and Trademark Office; Interview Summary, issued in connection with U.S. Appl. No. 12/264,136; dated Mar. 4, 2011; 9 pages; US.
U.S. Patent and Trademark Office; Ex Parte Quayle Action, issued in connection with U.S. Appl. No. 12/264,136; dated Apr. 28, 2011; 7 pages; US.
U.S. Patent and Trademark Office; Notice of Allowance and Fee(s) Due; issued in connection with U.S. Appl. No. 12/264,136; dated Juy 26, 2011; 8 pages; US.
U.S. Patent and Trademark Office; Notice of Allowance and Fee(s) Due; issued in connection with U.S. Appl. No. 12/264,117; dated Aug. 23, 2011; 13 pages/ US.
U.S. Patent and Trademark Office; Notice of Allowance and Fee(s) Due; issued in connection with U.S. Appl. No. 12/264,127; dated Aug. 25, 2011; 12 pages; US.
U.S. Patent and Trademark Office; Non-Final Office Action, Issued against U.S. Appl. No. 13/772,212; dated Apr. 9, 2014; 20 pages; US.
European Patent Office, PCT International Search Report and Written Opinion, issued in connection to PCT/US2012/051390; dated Feb. 5, 2013; 9 pages; Europe.
Japanese Patent Office; Office Action, Issued against Application No. JP2014-527202; dated Oct. 13, 2015; Japan.
European Patent Office; Extended European Search Report, issued in connection to EP14155792.6; dated Aug. 18, 2014; 5 pages; Europe.
European Patent Office; Communication Pursuant to Article 94(3) EPC, issued in connection to EP14155792.6; dated May 6, 2015; 2 pages; Europe.
European Patent Office; Invitation Pursuant to Rule 137(4) EPC and Article 94(3) EPC, issued in connection to EP14155792.6; dated Jan. 3, 2018; 4 pages; Europe.
European Patent Office, Result of Consultation, issued in connection to EP14155792.6; dated Jun. 19, 2018; 3 pages; Europe.
European Patent Office; Communicaiton Pursuant to Article 94(3) EPC, issued in connection to EP12769196.2; dated May 6, 2015; 5 pages; Europe.
State Intellectual Property Office of the People's Republic of China; Notification of the First Office Action, issued in connection to CN201710142639.7; dated Sep. 29, 2018; 8 pages; China.
State Intellectual Property Office of the People's Republic of China; Notification of the First Office Action, issued in connection to CN201710142741.7; dated Sep. 4, 2018; 8 pages; China.
Canadian Intellectual Property Office; Examiner's Report, issued in connection to CA2845827; dated Jan. 28, 2019; 5 pages; Canada.
Canadian Intellectual Property Office; Examiner's Report, issued in connection to CA2845827; dated May 10, 2018; 5 pages; Canada.
Korean Intellectual Property Office; Notification of Provisional Rejection, issued in connection to KR10-2014-7007293; dated Oct. 16, 2018; 3 pages; Korea.
State Intellectual Property Office of the People's Republic of China; Notification of the Second Office Action, issued in connection to CN201410058245.X; dated Aug. 6, 2018; 11 pages; China.
State Intellectual Property Office of the People's Republic of China; Notification of the First Office Action, issued in connection to CN201410058245.X; dated Sep. 5, 2017; 20 pages; China.
Japanese Patent Office; Office Action, issued in connection to JP2018-029938; dated Dec. 4, 2018; 5 pages; Japan.

(56) References Cited

OTHER PUBLICATIONS

Daich Takatori, Improvement of Support Vector Machine by Removing Outliers and its Application to Shot Boundary Detection, Institute of Electronics, Information and Communication Engineers (IEICE) 19th Data Engineering Workshop Papers [online], Japan, IEICE Data Engineering Research Committee, Jun. 25, 2009, 1-7, ISSN 1347-4413.
The International Bureau of WIPO; PCT International Preliminary Report on Patentability, issued in connection to PCT/US2012/051390; dated Mar. 6, 2014; 6 pages; Switzerland.
United States Patent and Trademark Office; PCT International Search Report and Written Opinion, issued in connection to PCT/US15/25490; dated Jul. 24, 2015; 12 pages; US.
The International Bureau of WIPO; PCT International Preliminary Report on Patentability, issued in connection to PCT/US15/25490; dated Oct. 20, 2016; 7 pages; Switzerland.
European Patent Office; Communication Pursuant to Rules 70(2) and 70a(2) EPC, issued in connection to EP15776851.6; dated Mar. 13, 2018; 34 pages; Europe.
European Patent Office; Extended European Search Report, issued in connection to EP15776851.6; dated Feb. 22, 2018; 3 pages; Europe.
State Intellectual Property Office of the People's Republic of China; Notification of the First Office Action, issued in connection to CN201580027842.9; dated Jul. 12, 2018; 9 pages; China.
Japanese Patent Office; Notification of Reason for Rejection, issued in connection to JP2017-504630; dated Jan. 1, 2019; 13 pages; Japan.
Ford, AP et al.; IEEE Strandard definitions for use in reporting electric generating unit reliability, availability and productivity; IEEE Power Engineering Society, Mar. 2007; 78 pages.
North American Electric Reliability Council; Predicting Generating Unit Reliability; Dec. 1995; 46 pages.
European Patent Office; Extended European Search Report, issued in connection to EP19153036.9; 8 pages; dated May 8, 2019; Europe.
Japanese Patent Office; Notice of Reasons for Rejection, issued in connection to JP2018-029939; 5 pages; dated Apr. 17, 2019; Japan.
Japanese Patent Office; Notice of Reasons for Rejection, issued in connection to JP2018-029940; 4 pages; dated Apr. 17, 2019; Japan.
Japanese Patent Office; Notice of Reasons for Rejection, issued in connection to JP2018-029941; 7 pages; dated Apr. 17, 2019; Japan.
Japanese Patent Office; Notice of Reasons for Rejection, issued in connection to JP2018-029944; 4 pages; dated May 14, 2019, 2019; Japan.
Japanese Patent Office; Notice of Reasons for Rejection, issued in connection to JP2018-029943; 7 pages; dated May 8, 2019; Japan.
European Patent Office; Extended European Search Report, issued in connection to EP18192489.5; 7 pages; dated Apr. 26, 2019; Europe.
State Intellectual Property Office of the People's Republic of China; Notification of the Second Office Action, issued in connection to CN201580027842.9; dated May 28, 2019; 9 pages; China.
China National Intellectual Property Administration; Notification of the Second Office Action and Search Report, issued in connection with CN201710142639.7; dated Aug. 20, 2019; 23 pages; China.
Qing, Liu; Measurement Error of Thermistor Compensated by CMAC-Based Nonlinear Inverse Filter; Journal of Instrument; vol. 26, No. 10; Oct. 30, 2005; pp. 1077-1080; China.
Hui, Liu; RSSI-Based High-Precision Indoor Three-Dimensional Spatial Positioning Algorithm; Chinese Master's Theses Full-Text Database Information Science and Technology, No. 8; Aug. 15, 2011; 4 pages.
Korean Intellectual Property Office; Notification of Provisional Rejection, issued in connection to application No. 10-2014-0019597; dated Jun. 18, 2019; 7 pages; Korea.
Japanese Patent Office; Notice of Final Decision of Rejection, issued in connection to application No. 2017-504630; dated Dec. 3, 2019; 11 pages; Japan.
Indian Patent Office; First Examination Report, issued in connection to application No. 389/KOLNP/2014; dated Jan. 27, 2020; 7 pages; India.
China National Intellectual Property Administration; Rejection Decision, issued in connection to application No. 201710142741.7; dated Jan. 15, 2020; 8 pages; China.
Canadian Intellectual Property Office; Examination Report, issued in connection to application No. 2843276; dated Feb. 3, 2020; 5 pages; Canada.
Indian Patent Office; First Examination Report, issued in connection to application No. 215/KOL/2014; dated Feb. 21, 2020; 7 pages; India.
Canadian Intellectual Property Office; Examiner's Report, issed in connection to application No. 2845827; dated Feb. 19, 2020; 7 pages; Canada.
China National Intellectual Property Administration; Rejection Decision, issued in connection to application No. 201580027842.9; dated Feb. 3, 2020;—pages; China.
China National Intellectual Property Administration; Third Office Action, issued in connection to application No. 201710142639.7; dated Mar. 5, 2020; 8 pages; China.
Intellectual Property Office of India; Examination Report, issued in connection to application No. 201637036024; dated Feb. 25, 2021; 8 pages; India.
Canadian Intellectual Property Office; Examination Report, issued in connection to application No. 2843276; dated Feb. 22, 2021; 4 pages; Canada.
Canadian Intellectual Property Office; Examiner's Report, issued in connection to application No. 2,945,543; dated May 12, 2020; 4 pages; Canada.
Raj S, Stephen et al.; Detection of Outliers in Regression Model for Medical Data; 2017; International Journal of Medical Research and Health Sciences; pp. 50-56.
Korean Intellectual Property Office; Notification of Provisional Rejection, issued in connection to application No. 10-2016-7031635; dated Aug. 20, 2020; 11 pages; Korea.
China National Intellectual Property Administration; Rejection Decision, issued in connection to application No. 201710142639.7; dated Aug. 25, 2020; 10 pages; China.
Nguyen, Minh N.H. et al.; Outliers Detection and Correction for Cooperative Distributed Online Learning in Wireless Sensor Network; Jan. 11, 2017; pp. 349-353; IEEE Xplore.
Santhanam, T. et al.; Comparison of K-Means Clustering and Statistical Outliers in Reduction Medical Datasets; Nov. 27, 2014; 6 pages; IEEE Xplore.
Yoon, Tae Bok et al.; Improvement of Learning Styles Diagnosis Based on Outliers Reduction of User Interface Behaviors; Dec. 10, 2007; pp. 497-502; IEEE Xplore.
European Patent Office; PCT International Search Report, issued in connection to application No. PCT/US2020/051627; dated Jan. 15, 2021; 4 pages; Europe.
European Patent Office; PCT Written Opinion of the International Searching Authority, issued in connection to application No. PCT/US2020/051627; dated Jan. 15, 2021; 5 pages; Europe.
Sato, Danilo et al.; Continuous Delivery for Machine Learning; Sep. 19, 2019; 41 pages.
Saucedo, Alejandro; The Anatomy of Production ML; Dec. 2020; 58 pages.
Sadik, Md. Shiblee; Online Detection of Outliers for Data Streams; 2013; A Dissertation Submitted to the Graduate Faculty; 289 pages.
Suresh, Anuganti; How to Remove Outliers for Machine Learning; Nov. 30, 2020; 33 pages.
Sharifzadeh, Mahdi et al.; Machne-Learning Methods for Integrated Renewable Power Generation: A Comparative Study of Ai Uncial Neural Networks, Support Vector Regression, and Gaussian Process Regression; Jul. 25, 2018; 26 pages; Elsevier Ltd.
Japanese Patent Office; Office Action, issued in connection to application No. 2020-065773; dated Mar. 9, 2021; 4 pages; Japan.
Japanese Patent Office; Office Action, issued in connection to application No. 2020-065773; dated Jun. 22, 2021; 9 pages; Japan.
European Patent Office; PCT International Search Report, issued in connection to application No. PCT/US2021/022861; dated Jul. 9, 2021; 5 pages; Europe.

(56) References Cited

OTHER PUBLICATIONS

European Patent Office; PCT Written Opinion of the International Searching Authority, issued in connection to application No. PCT/US2021/022861; dated Jul. 9, 2021; 9 pages; Europe.

Rubin, Cynthia et al.; Machine Learning for New York City Power Grid; IEEE Transactions on Patters Analysis and Machine Intelligence; vol. 34, No. 2; IEEE Computer Society; Feb. 1, 2022; pp. 3285-3345; U.S.

Lazarevic, Aleksandar et al.; Feature Bagging for Outlier Detection; Proceedings of the 11th. ACM Sigkdd International Conference on Knowledge Discovery and Data Mining; Aug. 21, 2005; pp. 157-166; U.S.

Zhao, Yue et al.; DCSO: Dynamic Combination of Detector Scores for Outlier Ensembles: Cornell University Library; Nov. 23, 2019; 9 pages; U.S.

European Patent Office; Communication Pursuant to Article 94(3) EPC, issued in connection to application No. EP18192489.5; dated Jul. 12, 2021; 8 pages; Europe.

European Patent Office; Communication Pursuant to Article 94(3) EPC, issued in connection to application No. EP15776851.6; dated Jun. 4, 2021; 5 pages; Europe.

\* cited by examiner

COMPUTER-BASED SYSTEMS, COMPUTING COMPONENTS AND COMPUTING OBJECTS CONFIGURED TO IMPLEMENT DYNAMIC OUTLIER BIAS REDUCTION IN MACHINE LEARNING MODELS

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to the software and data as described below and in drawings that form a part of this document: Copyright, Hartford Steam Boiler Inspection and Insurance Company, All Rights Reserved.

FIELD OF TECHNOLOGY

The present disclosure generally relates to improved computer-based systems, computing components and computing objects configured to implement bias reduction in machine learning models.

BACKGROUND OF TECHNOLOGY

A machine learning model may include one or more computers or processing devices to form predictions or determinations based on patterns and inferences learned from sample/training data. Bias in sample/training data selection can propagate into machine learning model predictions and determinations.

SUMMARY OF THE DISCLOSURE

Embodiments of the present disclosure include methods for dynamic outlier bias reduced machine learning models. The methods include receiving, by at least one processor, a training data set of target variables representing at least one activity-related attribute for at least one user activity; receiving, by the at least one processor, at least one bias criteria used to determine one or more outliers; determining, by the at least one processor, a set of model parameters for a machine learning model including: (1) applying, by the at least one processor, the machine learning model having a set of initial model parameters to the training data set to determine a set of model predicted values; (2) generating, by the at least one processor, an error set of data element errors by comparing the set of model predicted values to corresponding actual values of the training data set; (3) generating, by the at least one processor, a data selection vector to identify non-outlier target variables based at least in part on the error set of data element errors and the at least one bias criteria; (4) utilizing, by the at least one processor, the data selection vector on the training data set to generate a non-outlier data set; (5) determining, by the at least one processor, a set of updated model parameters for the machine learning model based on the non-outlier data set; and (6) repeating, by the at least one processor, steps (1)-(5) as an iteration until at least one censoring performance termination criterion is satisfied so as to obtain the set of model parameters for the machine learning model as the updated model parameters, whereby each iteration re-generates the set of predicted values, the error set, the data selection vector, and the non-outlier data set using the set of updated model parameters as the set of initial model parameters; training, by the at least one processor, based at least in part on the training data set and the data selection vector, a set of classifier model parameters of an outlier classifier machine learning model to obtain a trained outlier classifier machine learning model that is configured to identify at least one outlier data element; applying, by the at least one processor, the trained outlier classifier machine learning model to a data set of activity-related data for the at least one user activity to determine: i) a set of outlier activity-related data in the data set of activity-related data, and ii) a set of non-outlier activity-related data in the data set of activity-related data; and applying, by the at least one processor, the machine learning model to the set of non-outlier activity-related data elements to predict future activity-related attribute related to the at least one user activity.

Embodiments of the present disclosure include systems for dynamic outlier bias reduced machine learning models. The systems include at least one processor in communication with a non-transitory computer-readable storage medium having software instructions stored thereon, where the software instructions, when executed, cause the at least one processor to perform steps to: receive a training data set of target variables representing at least one activity-related attribute for at least one user activity; receive at least one bias criteria used to determine one or more outliers; determine a set of model parameters for a machine learning model including: (1) apply the machine learning model having a set of initial model parameters to the training data set to determine a set of model predicted values; (2) generate an error set of data element errors by comparing the set of model predicted values to corresponding actual values of the training data set; (3) generate a data selection vector to identify non-outlier target variables based at least in part on the error set of data element errors and the at least one bias criteria; (4) utilize the data selection vector on the training data set to generate a non-outlier data set; (5) determine a set of updated model parameters for the machine learning model based on the non-outlier data set; and (6) repeat steps (1)-(5) as an iteration until at least one censoring performance termination criterion is satisfied so as to obtain the set of model parameters for the machine learning model as the updated model parameters, whereby each iteration re-generates the set of predicted values, the error set, the data selection vector, and the non-outlier data set using the set of updated model parameters as the set of initial model parameters; train, based at least in part on the training data set and the data selection vector, a set of classifier model parameters of an outlier classifier machine learning model to obtain a trained outlier classifier machine learning model that is configured to identify at least one outlier data element; apply the trained outlier classifier machine learning model to a data set of activity-related data for the at least one user activity to determine: i) a set of outlier activity-related data in the data set of activity-related data, and ii) a set of non-outlier activity-related data in the data set of activity-related data; and apply the machine learning model to the set of non-outlier activity-related data elements to predict future activity-related attribute related to the at least one user activity.

The systems and methods of embodiments of the present disclosure further including: applying, by the at least one processor, the data selection vector to the training data set to determine an outlier training data set; training, by the at least one processor, using the outlier training data set, at least one outlier-specific model parameter of at least one outlier-specific machine learning model to predict outlier data values; and utilizing, by the at least one processor, the outlier-specific machine learning model to predict outlier activity-related data values for the set of outlier activity-related data.

The systems and methods of embodiments of the present disclosure further including: training, by the at least one processor, using the training data set, generalized model parameters of a generalized machine learning model to predict data values; utilizing, by the at least one processor, the generalized machine learning model to predict outlier activity-related data values for the set of outlier activity-related data; and utilizing, by the at least one processor, the generalized machine learning model to predict the activity-related data values.

The systems and methods of embodiments of the present disclosure further including: applying, by the at least one processor, the data selection vector to the training data set to determine an outlier training data set; training, by the at least one processor, using the outlier training data set, an outlier-specific model parameters of an outlier-specific machine learning model to predict outlier data values; training, by the at least one processor, using the training data set, generalized model parameters of a generalized machine learning model to predict data values; utilizing, by the at least one processor, the outlier-specific machine learning model to predict outlier activity-related data values for the set of outlier activity-related data; and utilizing, by the at least one processor, the outlier-specific machine learning model to predict the activity-related data values.

The systems and methods of embodiments of the present disclosure further including: training, by the at least one processor, using the training data set, generalized model parameters of a generalized machine learning model to predict data values; utilizing, by the at least one processor, the generalized machine learning model to predict the activity-related data values for the set of activity-related data; utilizing, by the at least one processor, the outlier classifier machine learning model to identify outlier activity-related data values of the activity-related data values; and removing, by the at least one processor, the outlier activity-related data values.

The systems and methods of embodiments of the present disclosure where the training data set includes the at least one activity-related attribute of concrete compressive strength as a function of concrete composition and concrete curing exposure.

The systems and methods of embodiments of the present disclosure where the training data set includes the at least one activity-related attribute of energy use data as a function of household environmental conditions and lighting conditions.

The systems and methods of embodiments of the present disclosure further including: receiving, by the at least one processor, an application programming interface (API) request to generate a prediction with at least one data element; and instantiating, by the at least one processor, at least one cloud computing resource to schedule execution of the machine learning model; utilizing, by the at least one processor according to the schedule for execution, the machine learning model to predict at least one activity-related data element value for the at least one data element; and returning, by the at least one processor, the at least one activity-related data element value to a computing device associated with the API request.

The systems and methods of embodiments of the present disclosure where the training data set includes the at least one activity-related attribute of three-dimensional patient imagery of a medical dataset; and where the machine learning model is configured to predict the activity-related data values including two or more physically-based rendering parameters based on the medical dataset.

The systems and methods of embodiments of the present disclosure where the training data set includes the at least one activity-related attribute of simulated control results for electronic machine commands; and where the machine learning model is configured to predict the activity-related data values including control commands for the electronic machine.

The systems and methods of embodiments of the present disclosure further including: splitting, by the at least one processor, the set of activity-related data into a plurality of subsets of activity-related data; determining, by the at least one processor, an ensemble model for each subset of activity-related data of the plurality of subsets of activity-related data; where the machine learning model includes an ensemble of models; where each ensemble model includes a random combination of models from the ensemble of models; utilizing, by the at least one processor, each ensemble model separately to predict ensemble-specific activity-related data values; determining, by the at least one processor, an error for each ensemble model based on the ensemble-specific activity-related data values and known values; and selecting, by the at least one processor, a highest performing ensemble model based on a lowest error.

BRIEF DESCRIPTION OF THE DRAWINGS

Various embodiments of the present disclosure can be further explained with reference to the attached drawings, wherein like structures are referred to by like numerals throughout the several views. The drawings shown are not necessarily to scale, with emphasis instead generally being placed upon illustrating the principles of the present disclosure. Therefore, specific structural and functional details disclosed herein are not to be interpreted as limiting, but merely as a representative basis for teaching one skilled in the art to variously employ one or more illustrative embodiments.

DETAILED DESCRIPTION

Figure 1:
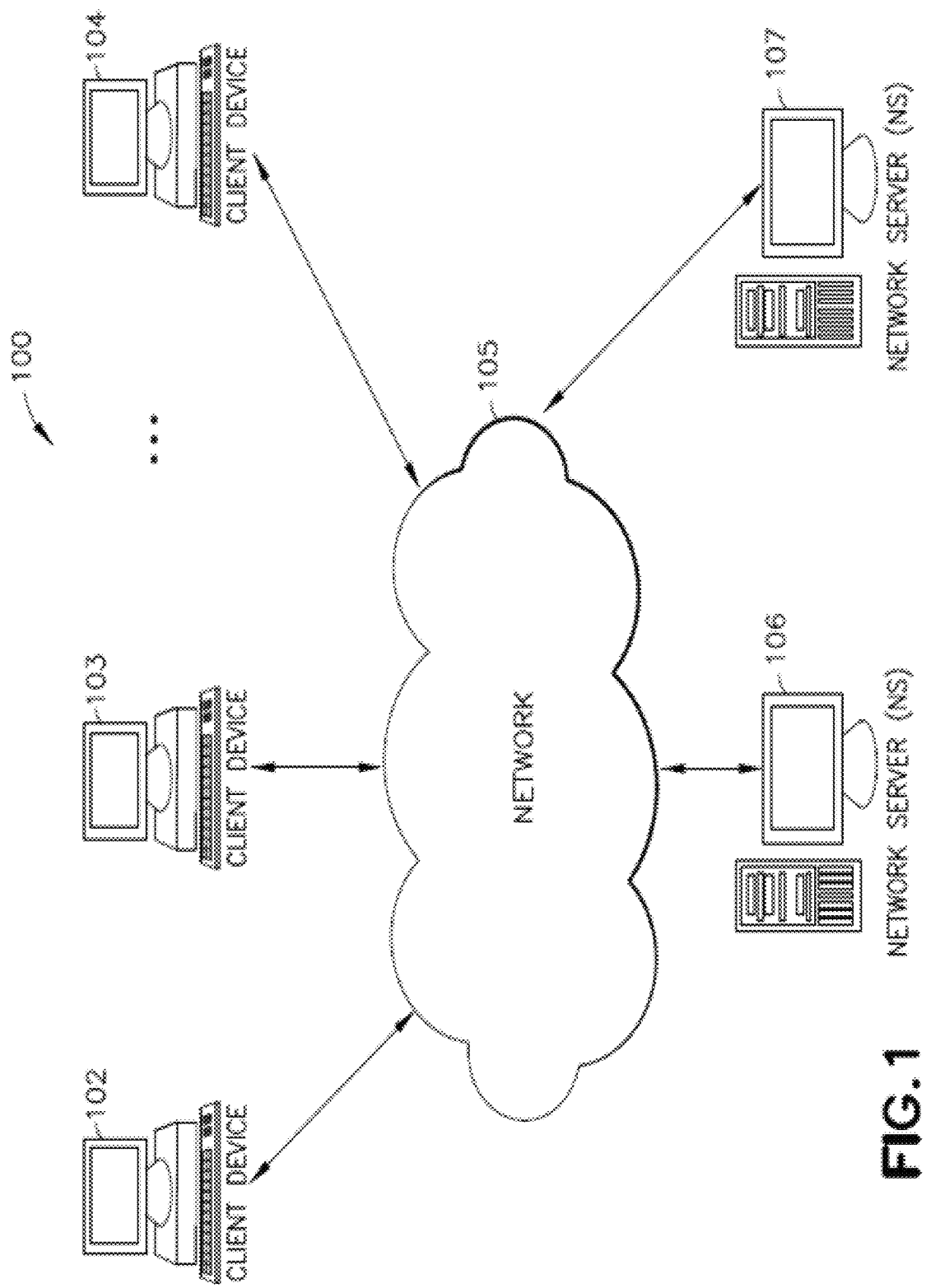
FIG. 1 depicts a block diagram of an exemplary computer-based system 100 for bias reduction in machine learning in accordance with one or more embodiments of the present disclosure.

Various detailed embodiments of the present disclosure, taken in conjunction with the accompanying figures, are disclosed herein; however, it is to be understood that the disclosed embodiments are merely illustrative. In addition, each of the examples given in connection with the various embodiments of the present disclosure is intended to be illustrative, and not restrictive.

Throughout the specification, the following terms take the meanings explicitly associated herein, unless the context clearly dictates otherwise. The phrases "in one embodiment" and "in some embodiments" as used herein do not necessarily refer to the same embodiment(s), though it may. Furthermore, the phrases "in another embodiment" and "in some other embodiments" as used herein do not necessarily refer to a different embodiment, although it may. Thus, as described below, various embodiments may be readily combined, without departing from the scope or spirit of the present disclosure.

In addition, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

It is understood that at least one aspect/functionality of various embodiments described herein can be performed in real-time and/or dynamically. As used herein, the term "real-time" is directed to an event/action that can occur instantaneously or almost instantaneously in time when another event/action has occurred. For example, the "real-time processing," "real-time computation," and "real-time execution" all pertain to the performance of a computation during the actual time that the related physical process (e.g., a user interacting with an application on a mobile device) occurs, in order that results of the computation can be used in guiding the physical process.

As used herein, the term "dynamically" and term "automatically," and their logical and/or linguistic relatives and/or derivatives, mean that certain events and/or actions can be triggered and/or occur without any human intervention. In some embodiments, events and/or actions in accordance with the present disclosure can be in real-time and/or based on a predetermined periodicity of at least one of: nanosecond, several nanoseconds, millisecond, several milliseconds, second, several seconds, minute, several minutes, hourly, several hours, daily, several days, weekly, monthly, etc.

In some embodiments, exemplary inventive, specially programmed computing systems with associated devices are configured to operate in the distributed network environment, communicating with one another over one or more suitable data communication networks (e.g., the Internet, satellite, etc.) and utilizing one or more suitable data communication protocols/modes such as, without limitation, IPX/SPX, X.25, AX.25, AppleTalk™, TCP/IP (e.g., HTTP), near-field wireless communication (NFC), RFID, Narrow Band Internet of Things (NBIOT), 3G, 4G, 5G, GSM, GPRS, WiFi, WiMax, CDMA, satellite, ZigBee, and other suitable communication modes. In some embodiments, the NFC can represent a short-range wireless communications technology in which NFC-enabled devices are "swiped," "bumped," "tap" or otherwise moved in close proximity to communicate.

The material disclosed herein may be implemented in software or firmware or a combination of them or as instructions stored on a machine-readable medium, which may be read and executed by one or more processors. A machine-readable medium may include any medium and/or mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

As used herein, the terms "computer engine" and "engine" identify at least one software component and/or a combination of at least one software component and at least one hardware component which are designed/programmed/configured to manage/control other software and/or hardware components (such as the libraries, software development kits (SDKs), objects, etc.).

Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. In some embodiments, the one or more processors may be implemented as a Complex Instruction Set Computer (CISC) or Reduced Instruction Set Computer (RISC) processors; x86 instruction set compatible processors, multi-core, or any other microprocessor or central processing unit (CPU). In various implementations, the one or more processors may be dual-core processor(s), dual-core mobile processor(s), and so forth.

Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that make the logic or processor. Of note, various embodiments described herein may, of course, be implemented using any appropriate hardware and/or computing software languages (e.g., C++, Objective-C, Swift, Java, JavaScript, Python, Perl, QT, etc.).

In some embodiments, one or more of exemplary inventive computer-based devices of the present disclosure may include or be incorporated, partially or entirely into at least one personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

As used herein, term "server" should be understood to refer to a service point which provides processing, database, and communication facilities. By way of example, and not limitation, the term "server" can refer to a single, physical processor with associated communications and data storage and database facilities, or it can refer to a networked or clustered complex of processors and associated network and storage devices, as well as operating software and one or more database systems and application software that support the services provided by the server. Cloud servers are examples.

In some embodiments, as detailed herein, one or more of exemplary inventive computer-based systems of the present disclosure may obtain, manipulate, transfer, store, transform, generate, and/or output any digital object and/or data unit (e.g., from inside and/or outside of a particular application) that can be in any suitable form such as, without limitation, a file, a contact, a task, an email, a tweet, a map, an entire application (e.g., a calculator), etc. In some embodiments, as detailed herein, one or more of exemplary inventive computer-based systems of the present disclosure may be implemented across one or more of various computer platforms such as, but not limited to: (1) AmigaOS, AmigaOS 4, (2) FreeBSD, NetBSD, OpenBSD, (3) Linux, (4) Microsoft Windows, (5) OpenVMS, (6) OS X (Mac OS), (7) OS/2, (8) Solaris, (9) Tru64 UNIX, (10) VM, (11) Android, (12) Bada, (13) BlackBerry OS, (14) Firefox OS, (15) iOS, (16) Embedded Linux, (17) Palm OS, (18) Symbian, (19) Tizen, (20) WebOS, (21) Windows Mobile, (22) Windows Phone, (23) Adobe AIR, (24) Adobe Flash, (25) Adobe Shockwave, (26) Binary Runtime Environment for Wireless (BREW), (27) Cocoa (API), (28) Cocoa Touch, (29) Java Platforms, (30) JavaFX, (31) JavaFX Mobile, (32) Microsoft XNA, (33) Mono, (34) Mozilla Prism, XUL and XULRunner, (35) .NET Framework, (36) Silverlight, (37) Open Web Platform, (38) Oracle Database, (39) Qt, (40) SAP NetWeaver, (41) Smartface, (42) Vexi, and (43) Windows Runtime.

In some embodiments, exemplary inventive computer-based systems, and/or exemplary inventive computer-based devices of the present disclosure may be configured to utilize hardwired circuitry that may be used in place of or in combination with software instructions to implement features consistent with principles of the disclosure. Thus, implementations consistent with principles of the disclosure are not limited to any specific combination of hardware circuitry and software. For example, various embodiments may be embodied in many different ways as a software component such as, without limitation, a stand-alone software package, a combination of software packages, or it may be a software package incorporated as a "tool" in a larger software product.

For example, exemplary software specifically programmed in accordance with one or more principles of the present disclosure may be downloadable from a network, for example, a website, as a stand-alone product or as an add-in package for installation in an existing software application. For example, exemplary software specifically programmed in accordance with one or more principles of the present disclosure may also be available as a client-server software application, or as a web-enabled software application. For example, exemplary software specifically programmed in accordance with one or more principles of the present disclosure may also be embodied as a software package installed on a hardware device.

In some embodiments, exemplary inventive computer-based systems/platforms, exemplary inventive computer-based devices, and/or exemplary inventive computer-based components of the present disclosure may be configured to handle numerous concurrent users that may be, but is not limited to, at least 100 (e.g., but not limited to, 100-999), at least 1,000 (e.g., but not limited to, 1,000-9,999), at least 10,000 (e.g., but not limited to, 10,000-99,999), at least 100,000 (e.g., but not limited to, 100,000-999,999), at least 1,000,000 (e.g., but not limited to, 1,000,000-9,999,999), at least 10,000,000 (e.g., but not limited to, 10,000,000-99,999,999), at least 100,000,000 (e.g., but not limited to, 100,000,000-999,999,999), at least 1,000,000,000 (e.g., but not limited to, 1,000,000,000-10,000,000,000).

In some embodiments, exemplary inventive computer-based systems and/or exemplary inventive computer-based devices of the present disclosure may be configured to output to distinct, specifically programmed graphical user interface implementations of the present disclosure (e.g., a desktop, a web app., etc.). In various implementations of the present disclosure, a final output may be displayed on a displaying screen which may be, without limitation, a screen of a computer, a screen of a mobile device, or the like. In various implementations, the display may be a holographic display. In various implementations, the display may be a transparent surface that may receive a visual projection. Such projections may convey various forms of information, images, and/or objects. For example, such projections may be a visual overlay for a mobile augmented reality (MAR) application.

As used herein, terms "cloud," "Internet cloud," "cloud computing," "cloud architecture," and similar terms correspond to at least one of the following: (1) a large number of computers connected through a real-time communication network (e.g., Internet); (2) providing the ability to run a program or application on many connected computers (e.g., physical machines, virtual machines (VMs)) at the same time; (3) network-based services, which appear to be provided by real server hardware, and are in fact served up by virtual hardware (e.g., virtual servers), simulated by software running on one or more real machines (e.g., allowing to be moved around and scaled up (or down) on the fly without affecting the end user).

In some embodiments, the exemplary inventive computer-based systems and/or the exemplary inventive computer-based devices of the present disclosure may be configured to securely store and/or transmit data by utilizing one or more of encryption techniques (e.g., private/public key pair, Triple Data Encryption Standard (3DES), block cipher algorithms (e.g., IDEA, RC2, RC5, CAST and Skipjack), cryptographic hash algorithms (e.g., MD5, RIPEMD-160, RTR0, SHA-1, SHA-2, Tiger (TTH), WHIRLPOOL, RNGs).

The aforementioned examples are, of course, illustrative and not restrictive.

As used herein, the term "user" shall have a meaning of at least one user. In some embodiments, the terms "user", "subscriber" "consumer" or "customer" should be understood to refer to a user of an application or applications as described herein and/or a consumer of data supplied by a data provider. By way of example, and not limitation, the terms "user" or "subscriber" can refer to a person who receives data provided by the data or service provider over the Internet in a browser session, or can refer to an automated software application which receives the data and stores or processes the data.

FIG. 1 depicts a block diagram of an exemplary computer-based system 100 for bias reduction in machine learning in accordance with one or more embodiments of the present disclosure. However, not all of these components may be required to practice one or more embodiments, and variations in the arrangement and type of the components may be made without departing from the spirit or scope of various embodiments of the present disclosure. In some embodiments, the exemplary inventive computing devices and/or the exemplary inventive computing components of the exemplary computer-based system 100 may be configured to manage a large number of members and/or concurrent transactions, as detailed herein. In some embodiments, the exemplary computer-based system/platform 100 may be based on a scalable computer and/or network architecture that incorporates varies strategies for assessing the data, caching, searching, and/or database connection pooling, including dynamic outlier bias reduction (DOBR) as described in embodiments herein. An example of the scalable architecture is an architecture that is capable of operating multiple servers.

In some embodiments, referring to FIG. 1, members 102-104 (e.g., clients) of the exemplary computer-based system 100 may include virtually any computing device capable of receiving and sending a message over a network (e.g., cloud network), such as network 105, to and from another computing device, such as servers 106 and 107, each other, and the like. In some embodiments, the member devices 102-104 may be personal computers, multiprocessor systems, microprocessor-based or programmable consumer electronics, network PCs, and the like. In some embodiments, one or more member devices within member devices 102-104 may include computing devices that typically connect using a wireless communications medium such as cell phones, smart phones, pagers, walkie talkies, radio frequency (RF) devices, infrared (IR) devices, CBs, integrated devices combining one or more of the preceding devices, or virtually any mobile computing device, and the like. In some embodiments, one or more member devices within member devices 102-104 may be devices that are capable of connecting using a wired or wireless communication medium such as a PDA, POCKET PC, wearable computer, a laptop, tablet, desktop computer, a netbook, a video game device, a pager, a smart phone, an ultra-mobile personal computer (UMPC), and/or any other device that is equipped to communicate over a wired and/or wireless communication medium (e.g., NFC, RFID, NBIOT, 3G, 4G, 5G, GSM, GPRS, WiFi, WiMax, CDMA, satellite, ZigBee, etc.). In some embodiments, one or more member devices within member devices 102-104 may include may run one or more applications, such as Internet browsers, mobile applications, voice calls, video games, videoconferencing, and email, among others. In some embodiments, one or more member devices within member devices 102-104 may be configured to receive and to send web pages, and the like. In some embodiments, an exemplary specifically programmed browser application of the present disclosure may be configured to receive and display graphics, text, multimedia, and the like, employing virtually any web based language, including, but not limited to Standard Generalized Markup Language (SMGL), such as HyperText Markup Language (HTML), a wireless application protocol (WAP), a Handheld Device Markup Language (HDML), such as Wireless Markup Language (WML), WMLScript, XML, JavaScript, and the like. In some embodiments, a member device within member devices 102-104 may be specifically programmed by either Java, .Net, QT, C, C++ and/or other suitable programming language. In some embodiments, one or more member devices within member devices 102-104 may be specifically programmed include or execute an application to perform a variety of possible tasks, such as, without limitation, messaging functionality, browsing, searching, playing, streaming or displaying various forms of content, including locally stored or uploaded messages, images and/or video, and/or games.

In some embodiments, the exemplary network 105 may provide network access, data transport and/or other services to any computing device coupled to it. In some embodiments, the exemplary network 105 may include and implement at least one specialized network architecture that may be based at least in part on one or more standards set by, for example, without limitation, Global System for Mobile communication (GSM) Association, the Internet Engineering Task Force (IETF), and the Worldwide Interoperability for Microwave Access (WiMAX) forum. In some embodiments, the exemplary network 105 may implement one or more of a GSM architecture, a General Packet Radio Service (GPRS) architecture, a Universal Mobile Telecommunications System (UMTS) architecture, and an evolution of UMTS referred to as Long Term Evolution (LTE). In some embodiments, the exemplary network 105 may include and implement, as an alternative or in conjunction with one or more of the above, a WiMAX architecture defined by the WiMAX forum. In some embodiments and, optionally, in combination of any embodiment described above or below, the exemplary network 105 may also include, for instance, at least one of a local area network (LAN), a wide area network (WAN), the Internet, a virtual LAN (VLAN), an enterprise LAN, a layer 3 virtual private network (VPN), an enterprise IP network, or any combination thereof. In some embodiments and, optionally, in combination of any embodiment described above or below, at least one computer network communication over the exemplary network 105 may be transmitted based at least in part on one of more communication modes such as but not limited to: NFC, RFID, Narrow Band Internet of Things (NBIOT), ZigBee, 3G, 4G, 5G, GSM, GPRS, WiFi, WiMax, CDMA, satellite and any combination thereof. In some embodiments, the exemplary network 105 may also include mass storage, such as network attached storage (NAS), a storage area network (SAN), a content delivery network (CDN) or other forms of computer or machine-readable media.

In some embodiments, the exemplary server 106 or the exemplary server 107 may be a web server (or a series of servers) running a network operating system, examples of which may include but are not limited to Microsoft Windows Server, Novell NetWare, or Linux. In some embodiments, the exemplary server 106 or the exemplary server 107 may be used for and/or provide cloud and/or network computing. Although not shown in FIG. 1, in some embodiments, the exemplary server 106 or the exemplary server 107 may have connections to external systems like email, SMS messaging, text messaging, ad content providers, etc. Any of the features of the exemplary server 106 may be also implemented in the exemplary server 107 and vice versa.

In some embodiments, one or more of the exemplary servers 106 and 107 may be specifically programmed to perform, in non-limiting example, as authentication servers, search servers, email servers, social networking services servers, SMS servers, IM servers, MMS servers, exchange servers, photo-sharing services servers, advertisement providing servers, financial/banking-related services servers, travel services servers, or any similarly suitable service-base servers for users of the member computing devices 101-104.

In some embodiments and, optionally, in combination of any embodiment described above or below, for example, one or more exemplary computing member devices 102-104, the exemplary server 106, and/or the exemplary server 107 may include a specifically programmed software module that may be configured to send, process, and receive information using a scripting language, a remote procedure call, an email, a tweet, Short Message Service (SMS), Multimedia Message Service (MMS), instant messaging (IM), internet relay chat (IRC), mIRC, Jabber, an application programming interface, Simple Object Access Protocol (SOAP) methods, Common Object Request Broker Architecture (CORBA), HTTP (Hypertext Transfer Protocol), REST (Representational State Transfer), or any combination thereof.

Figure 2:
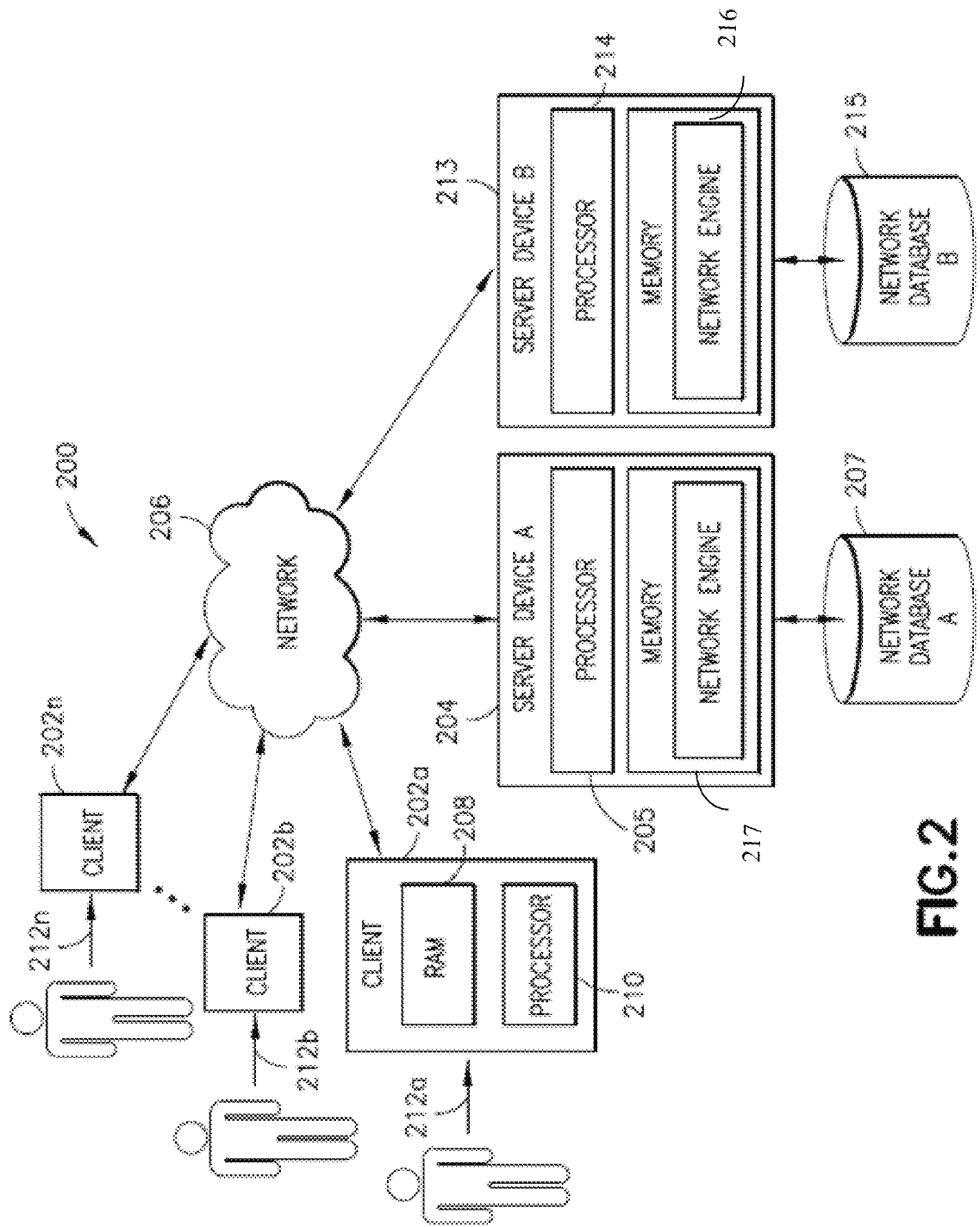
FIG. 2 depicts a block diagram of another exemplary computer-based system/platform 200 in accordance with one or more embodiments of the present disclosure.

FIG. 2 depicts a block diagram of another exemplary computer-based system/platform 200 in accordance with one or more embodiments of the present disclosure. However, not all of these components may be required to practice one or more embodiments, and variations in the arrangement and type of the components may be made without departing from the spirit or scope of various embodiments of the present disclosure. In some embodiments, the member computing devices 202a, 202b through 202n shown each at least includes a computer-readable medium, such as a random-access memory (RAM) 208 coupled to a processor 210 or FLASH memory. In some embodiments, the processor 210 may execute computer-executable program instructions stored in memory 208. In some embodiments, the processor 210 may include a microprocessor, an ASIC, and/or a state machine. In some embodiments, the processor 210 may include, or may be in communication with, media, for example computer-readable media, which stores instructions that, when executed by the processor 210, may cause the processor 210 to perform one or more steps described herein. In some embodiments, examples of computer-readable media may include, but are not limited to, an electronic, optical, magnetic, or other storage or transmission device capable of providing a processor, such as the processor 210 of client 202a, with computer-readable instructions. In some embodiments, other examples of suitable media may include, but are not limited to, a floppy disk, CD-ROM, DVD, magnetic disk, memory chip, ROM, RAM, an ASIC, a configured processor, all optical media, all magnetic tape or other magnetic media, or any other medium from which a computer processor can read instructions. Also, various other forms of computer-readable media may transmit or carry instructions to a computer, including a router, private or public network, or other transmission device or channel, both wired and wireless. In some embodiments, the instructions may comprise code from any computer-programming language, including, for example, C, C++, Visual Basic, Java, Python, Perl, JavaScript, and etc.

In some embodiments, member computing devices 202a through 202n may also comprise a number of external or internal devices such as a mouse, a CD-ROM, DVD, a physical or virtual keyboard, a display, or other input or output devices. In some embodiments, examples of member computing devices 202a through 202n (e.g., clients) may be any type of processor-based platforms that are connected to a network 206 such as, without limitation, personal computers, digital assistants, personal digital assistants, smart phones, pagers, digital tablets, laptop computers, Internet appliances, and other processor-based devices. In some embodiments, member computing devices 202a through 202*n* may be specifically programmed with one or more application programs in accordance with one or more principles/methodologies detailed herein. In some embodiments, member computing devices 202*a* through 202*n* may operate on any operating system capable of supporting a browser or browser-enabled application, such as Microsoft™, Windows™, and/or Linux. In some embodiments, member computing devices 202*a* through 202*n* shown may include, for example, personal computers executing a browser application program such as Microsoft Corporation's Internet Explorer™, Apple Computer, Inc.'s Safari™, Mozilla Firefox, and/or Opera. In some embodiments, through the member computing client devices 202*a* through 202*n*, users, 212*a* through 212*n*, may communicate over the exemplary network 206 with each other and/or with other systems and/or devices coupled to the network 206. As shown in FIG. 2, exemplary server devices 204 and 213 may be also coupled to the network 206. In some embodiments, one or more member computing devices 202*a* through 202*n* may be mobile clients.

In some embodiments, at least one database of exemplary databases 207 and 215 may be any type of database, including a database managed by a database management system (DBMS). In some embodiments, an exemplary DBMS-managed database may be specifically programmed as an engine that controls organization, storage, management, and/or retrieval of data in the respective database. In some embodiments, the exemplary DBMS-managed database may be specifically programmed to provide the ability to query, backup and replicate, enforce rules, provide security, compute, perform change and access logging, and/or automate optimization. In some embodiments, the exemplary DBMS-managed database may be chosen from Oracle database, IBM DB2, Adaptive Server Enterprise, FileMaker, Microsoft Access, Microsoft SQL Server, MySQL, PostgreSQL, and a NoSQL implementation. In some embodiments, the exemplary DBMS-managed database may be specifically programmed to define each respective schema of each database in the exemplary DBMS, according to a particular database model of the present disclosure which may include a hierarchical model, network model, relational model, object model, or some other suitable organization that may result in one or more applicable data structures that may include fields, records, files, and/or objects. In some embodiments, the exemplary DBMS-managed database may be specifically programmed to include metadata about the data that is stored.

Figure 3:
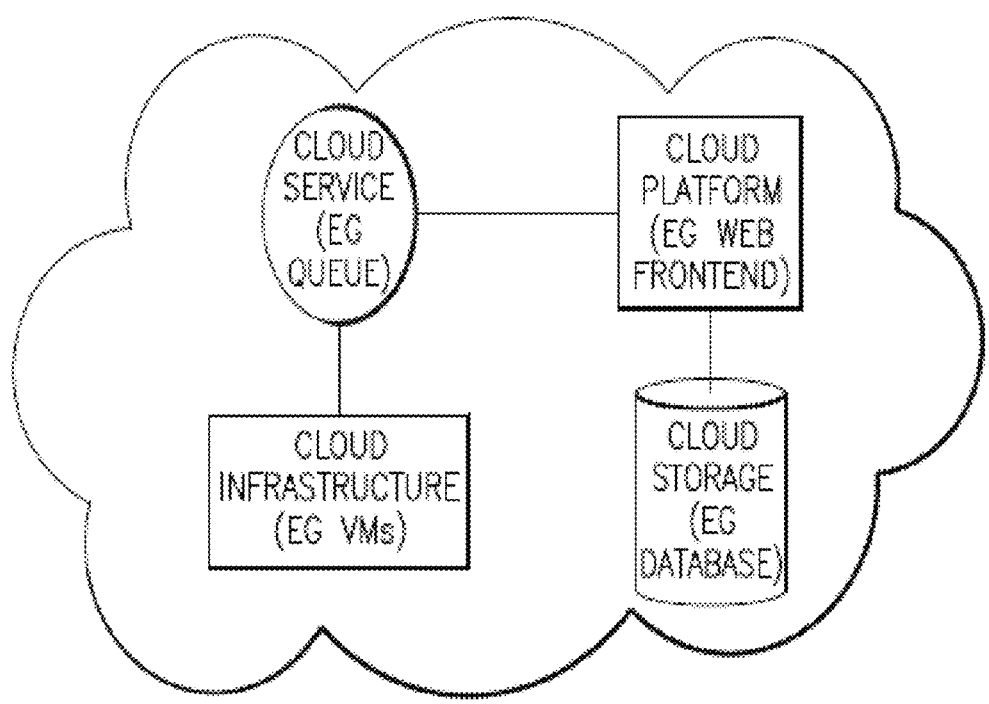
FIG. 3 illustrates schematics of exemplary implementations of the cloud computing/architecture(s) in which the exemplary inventive computer-based systems/platforms, the exemplary inventive computer-based devices, and/or the exemplary inventive computer-based components of the present disclosure may be specifically configured to operate.
Figure 4:
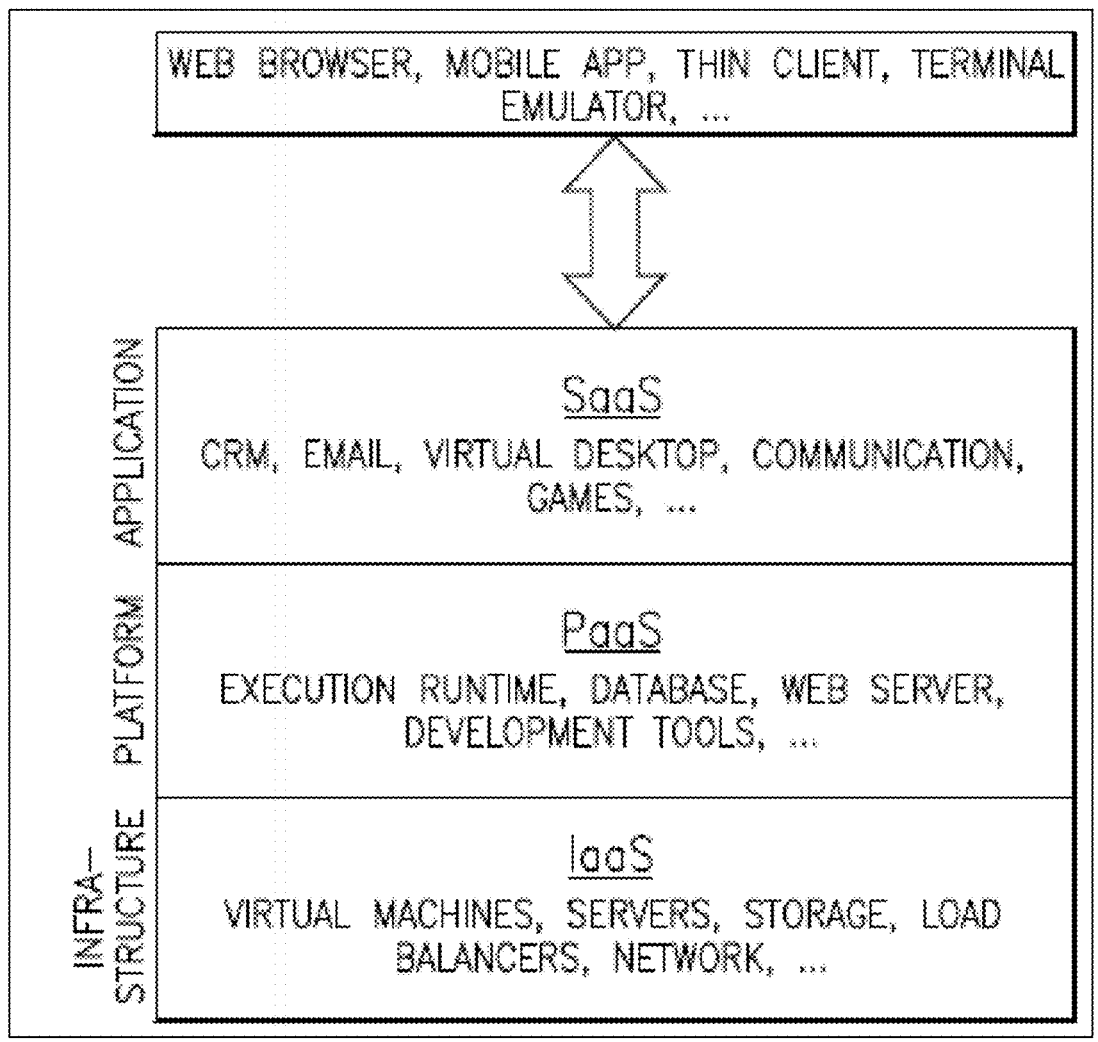
FIG. 4 illustrates schematics of exemplary implementations of the cloud computing/architecture(s) in which the exemplary inventive computer-based systems/platforms, the exemplary inventive computer-based devices, and/or the exemplary inventive computer-based components of the present disclosure may be specifically configured to operate.

In some embodiments, the exemplary inventive computer-based systems/platforms, the exemplary inventive computer-based devices, and/or the exemplary inventive computer-based components of the present disclosure may be specifically configured to operate in a cloud computing/architecture such as, but not limiting to: infrastructure a service (IaaS), platform as a service (PaaS), and/or software as a service (SaaS). FIG. 3 and FIG. 4 illustrate schematics of exemplary implementations of the cloud computing/architecture(s) in which the exemplary inventive computer-based systems/platforms, the exemplary inventive computer-based devices, and/or the exemplary inventive computer-based components of the present disclosure may be specifically configured to operate.

In embodiments of the inventive exemplary computer-based systems and/or devices, Dynamic Outlier Bias Reduction (DOBR) may be used to improve the accuracy and understanding of generalized linear models specifically for benchmarking studies. However, it is a method that may be applied to a wide variety of analysis models where there are one or more independent variables and one dependent variable. The present disclosure, and embodiments therein, are illustrative of the inventive application of DOBR to improving the accuracy of machine learning model predictions.

In embodiments, DOBR is not a predictive model. Instead, in embodiments, it is an add-on method to predictive or interpretive models that can improve the accuracy of model predictions. In embodiments, DOBR identified outliers are based on the difference between the data supplied target variable and the model computed value. As outliers are identified, via a pre-determined selection criterion, the outlier dependent data records and model produced dependent variables are removed from the analysis. Further analysis may continue with these records permanently removed. However, in other embodiments of the exemplary inventive system and methods, at each model iteration, the outlier identification process includes the entire dataset so that all records undergo outlier scrutiny using the last iteration's predictive model as defined by its calculation parameters. Accordingly, exemplary embodiments of the present invention reduce bias in the machine learning model by, e.g., including an entire dataset at each iteration to reduce the propagation of selection bias of training data. Thus, machine learning models can be trained and implemented more accurately and more efficiently to improve the operation of machine learning systems.

Figure 5:
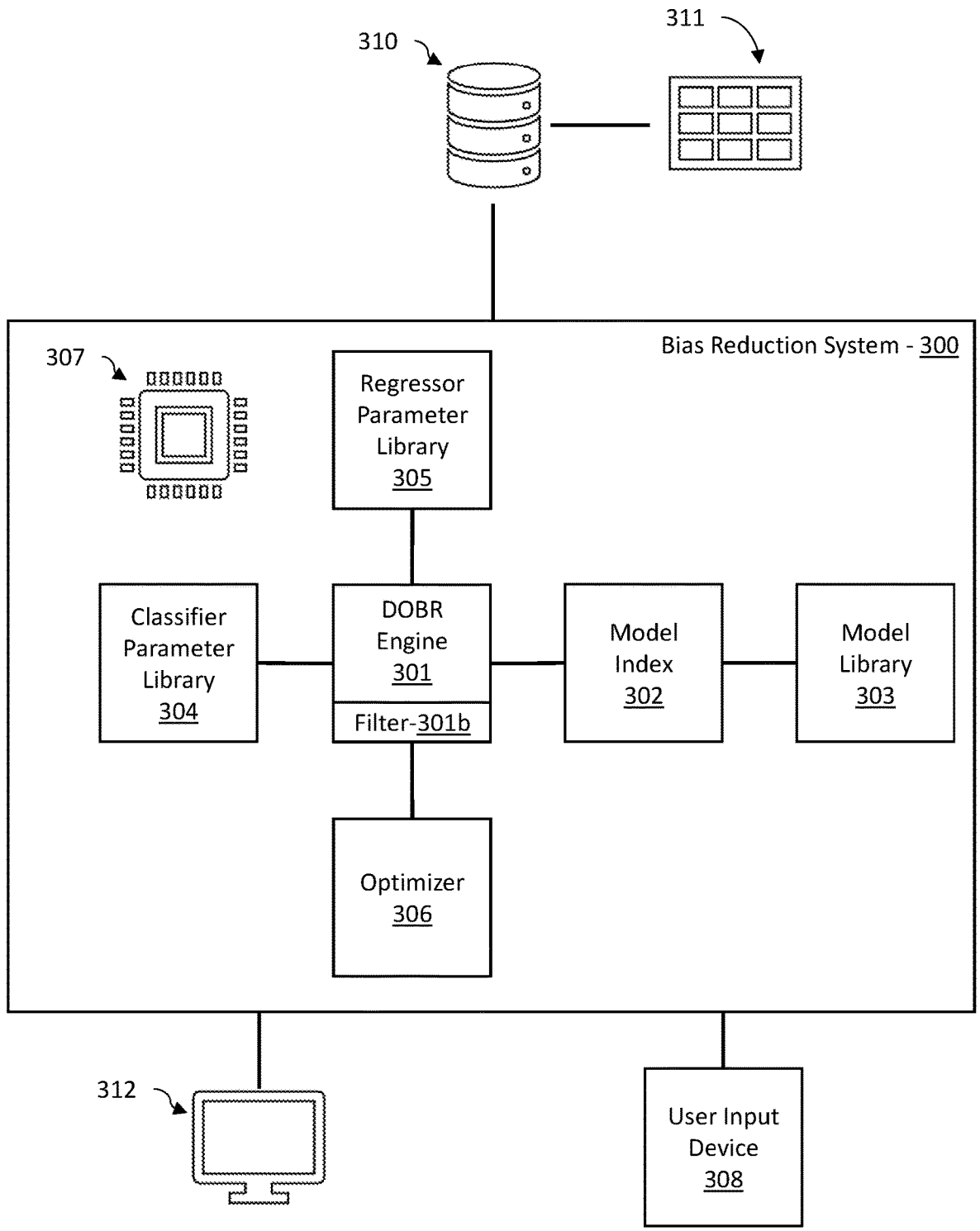
FIG. 5 illustrates a block diagram of an exemplary inventive bias reduction system in machine learning in accordance with one or more embodiments of the present disclosure.

FIG. 5 illustrates a block diagram of an exemplary inventive bias reduction system in machine learning in accordance with one or more embodiments of the present disclosure.

In some embodiments, a bias reduction system 300 may include component for dynamic outlier bias reduction (DOBR) in datasets under analysis by, e.g., machine learning engines. In some embodiments, DOBR provides an iterative process to remove outlier records subject to a pre-defined criterion. This condition is the user-defined error acceptance value expressed as a percentage. It refers to how much error the user is willing to accept in the model based potentially on their insights and other analysis results that will be described later in this discussion. A value of 100% signifies that all of the error is accepted and no records will be removed in the DOBR process. If 0% is chosen, then all of the records are removed. Generally, error acceptance values in the range of 80 to 95% have been observed for industrial applications.

In some embodiments, a user may interact with the bias reduction system 300 to administer the error acceptance value via a user input device 308 and view results via a display device 312, among other user interaction behaviors using the display device 312 and user input device 308. Based on the error acceptance value, the bias reduction system 300 may analyze a dataset 311 received into a database 310 or other storage in communication with the bias reduction system 300. The bias reduction system 300 may receive the dataset 311 via the database 310 or other storage device and make predictions using one or more machine learning models with dynamic outlier bias reduction for improved accuracy and efficiency.

In some embodiments, the bias reduction system 300 includes a combination of hardware and software components, including, e.g., storage and memory devices, cache, buffers, a bus, input/output (I/O) interfaces, processors, controllers, networking and communications devices, an operating system, a kernel, device drivers, among other components. In some embodiments, a processor 307 is in communication with multiple other components to implement functions of the other components. In some embodiments, each component has time scheduled on the processor 307 for execution of component functions, however in some embodiments, each component is scheduled to one or more processors in a processing system of the processor 307. In other embodiments, each component has its own processor included therewith.

In some embodiments, components of the bias reduction system 300 may include, e.g., a DOBR engine 301 in communication with a model index 302 and model library 303, a regressor parameter library 305, a classifier parameter library 304 and a DOBR filter 306, among other possible components. Each component may include a combination of hardware and software to implement component functions, such as, e.g., memory and storage devices, processing devices, communications devices, input/output (I/O) interfaces, controllers, networking and communications devices, an operating system, a kernel, device drivers, a set of instructions, among other components.

In some embodiments, the DOBR engine 301 includes a model engine for instantiating and executing machine learning models. The DOBR engine 301 may access models for instantiation in a model library 303 through the use of a model index 302. For example, the model library 303 may include a library of machine learning models that may be selectively accessed and instantiated for use by an engine such as the DOBR engine 301. In some embodiments, the model library 303 may include machine learning models such as, e.g., a support vector machine (SVM), a Linear Regressor, a Lasso model, Decision Tree regressors, Decision Tree classifiers, Random Forest regressors, Random Forest classifiers, K Neighbors regressors, K Neighbors classifiers, Gradient Boosting regressors, Gradient Boosting classifiers, among other possible classifiers and regressors. For example, the model library 303 may import models according to the following example pseudo-code 1:

Pseudo-Code 1

```
import sys
sys.path.append("analytics-lanxess-logic")
import numpy as np
import pandas as pd
import random, time
import xgboost as xgb
from xgboost                                        import XGBClassifier,XGBRegressor
from scipy                                          import stats
from scipy.stats                                    import mannwhitneyu,wilcoxon
from sklearn.metrics                                import mean_squared_error,
roc_auc_score,classification_report,confusion_matrix
from sklearn                                        import svm
from sklearn.svm                                    import SVR, SVC
from sklearn.model_selection                        import train_test_split
from sklearn.linear_model                           import LinearRegression, Lasso
from sklearn.tree                                   import DecisionTreeRegressor,
DecisionTreeClassifier
from sklearn.ensemble                               import RandomForestRegressor,
RandomForestClassifier,BaggingClassifier,BaggingRegressor,
from sklearn.neighbors                              import KNeighborsRegressor ,
KNeighborsClassifier
from sklearn.ensemble                               import GradientBoostingRegressor,
GradientBoostingClassifier
from optimizers.hyperparameters.hyperband_optimizer import Hyperband,
HyperparameterOptimizer
from optimizers.hyperparameters.base_optimizer      import Hyperparameter
Optimizer
import warnings
from warnings import simplefilter
simplefilter(action='ignore', category=FutureWarning)
simplefilter(action='ignore', category=DeprecationWarning)
warnings.filterwarnings(module='numpy*' , action='ignore', category=
DeprecationWarning)
warnings.filterwarnings(module='numpy*' , action='ignore', category=
FutureWarning)
warnings.filterwarnings(module='scipy*' , action='ignore', category=
FutureWarning)
warnings.filterwarnings(module='scipy*' , action='ignore', category=
DeprecationWarning)
warnings.filterwarnings(module='sklearn*', action='ignore'', category=
DeprecationWarning)
```

However, in some embodiments, to facilitate access to the library of machine learning models in the model library 303, the DOBR engine 301 may employ a model index 302 that indexes each model to a model identifier to use as a function by the DOBR engine 301. For example, models including, e.g., Linear Regression, XGBoost Regression, Support Vector Regression, Lasso, K Neighbors Regression, Bagging Regression, Gradient Boosting Regression, Random Forest Regression, Decision Tree Regression, among other regression models and classification models, may be indexed by a number identifier and labeled with a name. For example, pseudo-code 2, below, depicts an example of a model index code for use by the model index 302.

Pseudo-Code2

```
model0 = LinearRegression( )
model1 = xgb.XGBRegressor( )
model2 = SVR( )
```

Pseudo-Code2

```
model3 = Lasso( )
model4 = KNeighborsRegressor( )
model5 = BaggingRegressor( )
model6 = GradientBoostingRegressor( )
model7 = RandomForestRegressor( )
model8 = DecisionTreeRegressor( )

ModelName0 = " Linear Regression"
ModelName1 = "XGBoost Regression"
ModelName2 = "Support Vector Regression"
ModelName3 = " Lasso"
ModelName4 = "K Neighbors Regression"
ModelName5 = "Bagging Regression"
ModelName6 = "Gradient Boosting Regression"
ModelName7 = "Random Forest Regression"
ModelName8 = "Decision Tree Regression"
```

Other embodiments of the pseudo-code for the model library 303 and the model index 302 are contemplated. In some embodiments, the software instructions are stored within a memory of the respective model library 303 or model index 302 and buffered in a cache for provision to the processor 307. In some embodiments, the DOBR engine 301 may utilize the model index 302 by accessing or calling the index via communications and/or I/O devices, the use the index to call models as functions from the model library 303 via communications and/or I/O devices.

In some embodiments, to facilitate optimization and customization of the models called by the DOBR engine 301, the bias reduction system 300 may record model parameters in, e.g., memory or storage, such as, e.g., hard drives, solid state drives, random access memory (RAM), flash storage, among other storage and memory devices. For example, regressor parameters may be logged and adjusted in a regressor parameter library 305. Thus, the regressor parameter library 305 may include storage and communication hardware configured with sufficient memory and bandwidth to store, adjust and communicate a multitude of parameters for multiple regressors, e.g., in real time. For example, for each regression machine learning model instantiated by the DOBR engine 301, respective parameters may be initialized and updated in the regressor parameter library 305. In some embodiments, a user, via the user input device 308, may establish an initial set of parameters. However, in some embodiments, the initial set of parameters may be predetermined or randomly generated. Upon instantiation of a regression machine learning model, the DOBR engine 301 may correlate a model from as identified in the model index 302 to a set of parameters in the regressor parameter library 305. For example, the DOBR engine 301 may call a set of parameters according to, e.g., an identification (ID) number associated with a given regression model. For example, the regressor parameter library 305 may identify parameters for each regression model similar to pseudo-code 3 below:

Pseudo-Code 3

```
#from utilities.defaults import DefaultParameters
#print(DefaultParameters(ctr=0).__dict__)
#!conda install -y -c conda-forge xgboost
def gen_params(id):
    # XGBoost
    if id==1:
        """ default parameters - best achieved in prototyping XGBOOST """
        HYPERPARAMETERS = {"objective": "reg:linear",
                           "tree_method": "exact",
                           "eval_metric": "rmse",
                           "eta": 1,
                           "gamma": 5,
                           "max_depth": 2,
                           "colsample_bytree": .5,
                           "colsample_bylevel": .5,
                           "min_child_weight": 1,
                           "subsample": 1,
                           "reg_lambda": 1,
                           "reg_alpha": 0,
                           "silent": 1}
        """ fixed parameters which will not change in optimisation """
        FIXED = {"objective": "reg:linear",
                 "tree_method": "exact",
                 "eval_metric": "rmse"}
        """ boundaries & types of optimisable parameters """
        BOUNDARIES = {"eta": (0, 1, np.float64),
                      "gamma": (0, 100, np.float64),
                      "max_depth": (1, 30, np.int32),
                      "colsample_bytree": (0, 1, np.float64),
                      "colsample_bylevel": (0, 1, np.float64),
                      "min_child_weight": (0, 100, np.int32),
                      "subsample": (0, 1, np.float64),
                      "reg_lambda": (0, 1, np.float64),
                      "reg_alpha": (0, 1, np.float64)}
    elif id==2:
        # SVR
        """ default parameters - """
        HYPERPARAMETERS = {"kernel": "rbf",
                           "cache_size": 100000,
                           "C": 0.5,
                           "gamma": 0.023 }
```

Pseudo-Code 3

```
""""" fixed parameters which will not change in optimisation "
"""
        FIXED = {"kernel": "rbf",
                "cache_size": 100000,
                    "tol": 0.00001 }
        """" boundaries & types of optimisable parameters """"
        BOUNDARIES = { "C": (0.01 , 1000, np.float64),
                    "gamma": (0.001, 100, np.float64)}
#                    "epsilon":    (0.001, 100, np.float64)
    elif id==3:
        # LASSO
        """" default parameters - """"
        HYPERPARAMETERS = {"fit_intercept": "False",
                                            "max_iter": 100000,
                                                "tol": 0.0001,
                                                "alpha": 25}
        """" fixed parameters which will not change in optimisation "
"""
        FIXED = {"fit_intercept": "False",
                "max_iter": 100000,
                    "tol": 0.0001 }
        """" boundaries & types of optimisable parameters """"
        BOUNDARIES = {"alpha": (0.1, 100, np.float64) }
    elif id==4:
        # KNN PARAMETERS
        """" default parameters - """"
        HYPERPARAMETERS = { "algorithm": "auto",
                                        "n_neighbors": 7,
                                            "leaf_size": 30}
        """" fixed parameters which will not change in optimisation "
"""
        FIXED = {"algorithm": "auto"}
        """" boundaries & types of optimisable parameters """"
        BOUNDARIES = {"n_neighbors": (3 , 51,  np.int32),
                            "leaf_size": (2 , 500, np.int32)}
    elif id==5:
            # Bagging Regression
                                HYPERPARAMETERS = { "bootstrap_features": "False",
                                                    "bootstrap": "True",
                                                    "n_estimators": 21,
                                                    "max_samples": 23}
        """" fixed parameters which will not change in optimisation "
"""
        FIXED = { "bootstrap_features": "False",
                            "bootstrap": "True"}
        """" boundaries & types of optimisable parameters """"
        BOUNDARIES = {"n_estimators": (1 , 50, np.int32),
                            "max_samples": (1 , 50, np.int32)}
    elif id==6:
            # GRADIENT BOOSTING PARAMETERS
        """" default parameters - """"
                                HYPERPARAMETERS = {"criterion": "friedman_mse",
                                            "min_impurity_split": 1.0e-07,
                                                "max_features": "auto",
                                                "learning_rate": 0.2,
                                                "n_estimators": 100,
                                                "max_depth": 10}
        """" fixed parameters which will not change in optimisation "
"""
        FIXED = {"criterion": "friedman_mse",
        "min_impurity_split": 1.0e-07,
                "max_features": "auto"}
        """" boundaries & types of optimisable parameters """"
                                BOUNDARIES = {"learning_rate": (0.01, 1, np.float64),
                                        "n_estimators": (50, 500, np.int32),
                                            "max_depth": (1, 50, np.int32)}
    elif id==7:
            # RANDOM FOREST PARAMETERS
        """" default parameters - """"
                                HYPERPARAMETERS = {"bootstrap": "True",
                                                "criterion": "mse",
                                            "n_estimators": 100,
                                            "max_features": 'auto',
                                                "max_depth": 50,
                                        "min_samples_leaf": 1,
                                        "min_samples_split": 2}
        """" fixed parameters which will not change in optimisation "
```

Pseudo-Code 3

```
""""
        FIXED = {"bootstrap": "True",
                 "criterion": "mse",
                 "max_features": 'auto' }
        """" boundaries & types of optimisable parameters """"
                                    BOUNDARIES = {"n_estimators": (1 , 1000, np.int32),
                                                  "max_depth": (1 , 500, np.int32),
                                                  "min_samples_leaf": (1 , 50, np.int32),
                                                  "min_samples_split": (2 , 50, np.int32)}
    else:
        # DECISION TREE PARAMETERS
        """" default parameters - """"
        HYPERPARAMETERS = {"criterion":            "mse",
                           "max_features":         "auto",
                           "max_depth":            2,
                           "min_samples_leaf":     0.25,
                           "min_samples_split":    2 }
        """" fixed parameters which will not change in optimisation "
""""
        FIXED = {"criterion": "mse",
                 "max_features": "auto"}
        """" boundaries & types of optimisable parameters """"
                                    BOUNDARIES = { "max_depth": (1 , 500, np.int32),
                                                   "min_samples_leaf": (1 , 50, np.int.32),
                                                   "min_samples_split": (2 , 50, np.int32)}
    return HYPERPARAMETERS,FIXED,BOUNDARIES
```

Similarly, in some embodiments, classifier parameters may be logged and adjusted in a classifier parameter library 304. Thus, the classifier parameter library 304 may include storage and communication hardware configured with sufficient memory and bandwidth to store, adjust and communicate a multitude of parameters for multiple regressors, e.g., in real time. For example, for each classification machine learning model instantiated by the DOBR engine 301, respective parameters may be initialized and updated in the regressor parameter library 305. In some embodiments, a user, via the user input device 308, may establish an initial set of parameters. However, in some embodiments, the initial set of parameters may be predetermined. Upon instantiation of a regression machine learning model, the DOBR engine 301 may correlate a model from as identified in the model index 302 to a set of parameters in the regressor parameter library 305. For example, the DOBR engine 301 may call a set of parameters according to, e.g., an identification (ID) number associated with a given regression model. For example, the regressor parameter library 305 may identify parameters for each regression model similar to pseudo-code 4 below:

Pseudo-Code 4

```
def gen_paramsClass(II):
        #    XGBoost CLASSIFER PARAMETERS
    if II==0:
        """" default parameters - best achieved in prototyping """"
                HYPERPARAMETERS = {"objective": "binary:hinge",
                                   "tree_method": "exact",
                                   "eval_metric": "error",
                                   "n_estimators": 5,
                                   "eta": 0.3,
                                   "gamma": 0.1,
                                   "max_depth": 5,
                                   "min_child_weight": 5,
                                   "subsample": 0.5,
                                   "scale_pos_weight": 1,
                                   "silent": 1}
        """" fixed parameters which will not change in optimization "
""""
                FIXED = { "objective":    "binary:hinge",
                          "tree_method":  "exact",
                          "eval_metric":  "error"}
        """" boundaries & types of optimisable parameters """"
                BOUNDARIES = { "eta":              (0, 10,    np.float64),
                               "gamma":            (0, 10,    np.float64) ,
                               "min_child_weight": (0, 50,    np.float64),
                               "subsample":        (0, 1,     np.float64),
                               "n_estimators":     (1 ,1000, np.int32),
                               "max_depth":        (1, 1000, np.int32),
                               "scale_pos_weight": (0, 1,     np.float64) }
    else:
        # RANDOM FOREST CLASSIFIER PARAMETERS
        """" default parameters - """"
```

| Pseudo-Code 4 |
|---|
| ```
HYPERPARAMETERS = {"bootstrap":    "True",
                   "n_estimators":  500,
                   "max_features":  'auto',
                   "max_depth":     200,
                   "min_samples_leaf": 1,
                   "min_samples_split": 2 }
""" fixed parameters which will not change in optimisation """

FIXED = {"bootstrap": "True",
         "max_features": "auto" }
""" boundaries & types of optimisable parameters """
BOUNDARIES = {"n_estimators":     (10 , 1000,   np.int32),
              "max_depth":        (10 , 50,     np.int32),
              "min_samples_leaf": (1 , 40,      np.int32),
              "min_samples_split":(2 , 40,      np.int32)}#
return HYPERPARAMETERS,FIXED,BOUNDARIES
``` |

In some embodiments, by calling and receiving a set of models from a model library 303 via the model index 302 and respective parameters from the regressor parameter library 305 and/or the classifier parameter library 304, the DOBR engine 301 may load one or more instantiated and initialized models, e.g., into a cache or buffer of the DOBR engine 301. In some embodiments, the dataset 311 may then be loaded from the database 310 into, e.g., a same or different cache or buffer or other storage device of the DOBR engine 301. The processor 307 or a processor in the DOBR engine 301 may then execute each model to transform the dataset 311 into, e.g., a respective prediction of activity-related data values that characterize the results or parameters of an activity based on certain input attributes related to the activity. For example, appliance energy usage in home and/or commercial environments, concrete compressive strength in a variety of applications and formulations, object or image recognition, speech recognition, or other machine learning applications. For example, the DOBR engine 301 may be modelling appliance energy usage based on a dataset 311 of historical energy usage, time of year, time of day, location, among other factors. The DOBR engine 301 may called a set of regressors from the model library 303 via the model index 302 connected to a bus of the DOBR engine 301. The DOBR engine 301 may then called a parameter file or log associated with regressors for appliance energy usage estimation in the regressor parameter library 305 connected to a bus of the DOBR engine 301. The DOBR engine 301 may then utilize a processor 307 to predict a future energy consumption based on the models and model parameters, time and date, location, or other factor and combinations thereof.

Similarly, for example, the DOBR engine 301 may be modelling concrete compressive strength based on a dataset 311 of concrete materials, time of year, time of day, location, humidity, curing time, age, among other factors. The DOBR engine 301 may called a set of regressors from the model library 303 via the model index 302 connected to a bus of the DOBR engine 301. The DOBR engine 301 may then called a parameter file or log associated with regressors for concrete compressive strength estimation in the regressor parameter library 305 connected to a bus of the DOBR engine 301. The DOBR engine 301 may then utilize a processor 307 to predict a future concrete compressive strength based on the models and model parameters for a particular concrete formulation, time and date, location, or other factor and combinations thereof.

As another example, the DOBR engine 301 may be performing speech recognition based on a dataset 311 of utterances and ground-truth transcriptions, among other factors. The DOBR engine 301 may called a set of classifiers from the model library 303 via the model index 302 connected to a bus of the DOBR engine 301. The DOBR engine 301 may then called a parameter file or log associated with classifiers for speech recognition in the classifier parameter library 304 connected to a bus of the DOBR engine 301. The DOBR engine 301 may then utilize a processor 307 to predict a transcription of recorded speech data based on the models and model parameters for a set of one or more utterances.

As another example, the DOBR engine 301 may be automatically predicting rendering settings for medical imagery based on a dataset 311 of settings for multiple rendering parameters across imaging and/or visualizations, among other factors, as described in U.S. Pat. No. 10,339,695, herein incorporated by reference in its entirety for all purposes. The DOBR engine 301 may called a set of classifiers from the model library 303 via the model index 302 connected to a bus of the DOBR engine 301. The DOBR engine 301 may then called a parameter file or log associated with classifiers for rendering settings in the classifier parameter library 304 connected to a bus of the DOBR engine 301. The DOBR engine 301 may then utilize a processor 307 to predict a rendering settings data based on the models and model parameters for a set of one or more medical datasets.

As another example, the DOBR engine 301 may be performing robotic control of machinery based on a dataset 311 of machine control command results and simulated results of machine control commands, among other factors, as described in U.S. Pat. No. 10,317,854, herein incorporated by reference in its entirety for all purposes. The DOBR engine 301 may called a set of regression models from the model library 303 via the model index 302 connected to a bus of the DOBR engine 301. The DOBR engine 301 may then called a parameter file or log associated with regression model for robotic control in the regressor parameter library 305 connected to a bus of the DOBR engine 301. The DOBR engine 301 may then utilize a processor 307 to predict a a success or failure of a particular control commands based on the models and model parameters for a set of control commands, environmental information, sensor data and/or simulations of the commands.

In some embodiments, the bias reduction system 300 may implement the machine learning models in a cloud environment, e.g., as a cloud service for remote users Such a cloud service may be designed to support large numbers of users and a wide variety of algorithms and problem sizes, including those described above, as well as other potential models, datasets and parameter tunings specific to a users use case, as described in U.S. Pat. No. 10,452,992, herein incorporated by reference in its entirety for all purposes. In one embodiment, a number of programmatic interfaces (such as application programming interfaces (APIs)) may be defined by the service in which the bias reduction system 300 is implemented, which guide non-expert users to start using machine learning best practices relatively quickly, without the users having to expend a lot of time and effort on tuning models, or on learning advanced statistics or artificial intelligence techniques. The interfaces may, for example, allow non-experts to rely on default settings or parameters for various aspects of the procedures used for building, training and using machine learning models, where the defaults are derived from the one or more sets of parameters in the classifier parameter library 304 and/or regressor parameter library 305 for similar models to the individual user. The default settings or parameters may be used as a starting point to customize a user's machine learning model using training with the user's datasets via the DOBR engine 301 and optimizer 306. At the same time, users may customize the parameters or settings they wish to use for various types of machine learning tasks, such as input record handling, feature processing, model building, execution and evaluation. In at least some embodiments, in addition to or instead of using pre-defined libraries implementing various types of machine learning tasks, Additionally, the cloud-service bias reduction system 300 may have extendable built-in capabilities of the service, e.g., by registering customized functions with the service. Depending on the business needs or goals of the clients that implement such customized modules or functions, the modules may in some cases be shared with other users of the service, while in other cases the use of the customized modules may be restricted to their implementers/owners.

In some embodiments, whether implemented as a cloud service, a local or remote system, or in any other system architecture, the bias reduction system 300 may include models in the model library 303 that enable an ensemble approach to machine learning model training and implementation, as described in U.S. Pat. No. 9,646,262, herein incorporated by reference in its entirety for all purposes. Such an approach may be useful for applications to data analytics using electronic datasets of electronic activity data. In some embodiments, the database 310 may include one or more structured or unstructured data sources. An unsupervised learning module, in certain embodiments, is configured to assemble an unstructured data set into an organized data set using a plurality of unsupervised learning techniques, e.g., in an ensemble of models from the model library 303. For example, the unsupervised learning module is configured to assemble an unstructured data set into multiple versions of an organized data set, while a supervised learning module, in certain embodiments, is configured to generate one or more machine learning ensembles based on each version of multiple versions of an organized data set and to determine which machine learning ensemble exhibits a highest predictive performance according to, e.g., model error after training each model in each ensemble using the DOBR engine 301 and optimizer 306.

An example of the DOBR engine 301 instructions for controlling hardware to make predictions based on the dataset 311 is depicted in pseudo-code 5 below:

```
Pseudo-Code 5 filename          = 'energydataBase'
filename          = 'Concrete_Data'
path              = '.'
filetype          = '.csv'
path1             = filename + filetype
data              = pd.read_csv(path1).values
YLength           = len(data)
X_Data = data[:, 1:]
y_Data = data[:,0]

#                            ***** Set Run Parameters *****

ErrCrit           = 0.005
trials            = 2
list_model        = [ model0, model1, model2, model3, model4 ]
list_modelname    = [ ModelName0, ModelName1, ModelName2, ModelName3, ModelName4]
Acceptance        = [87.5, 87.5, 87.5, 87.5, 87.5]

mcnt = −1
for model in list_model:
    f = open("DOBR04trainvaltestRF"+".txt","a")
    mcnt += 1
    print("------------running----------------", mcnt,list_modelname[mcnt])
    timemodelstart = time.time( )
    Error00       = [0]*trials
    PIM           = [0]*trials
    modelfrac     = [0]*trials
    DOBRFULL0,DOBRFULL0a,DOBRFULL0e = ([0] * trials for i in range(3))
    DOBRFULL1,DOBRFULL1a,DOBRFULL1e = ([0] * trials for i in range(3))
    DOBRFULL2,DOBRFULL2a,DOBRFULL2e = ([0] * trials for i in range(3))

#                            Bootstrapping Loop starts here

    X_train, X_temp, y_train, y_temp = train_test_split(X_Data, y_Data,
test_size = 0.60)
    if mcnt > 0:
```

| Pseudo-Code 5 |
| --- |

```
                new_paramset = gen_params(mcnt)
                hyperband = Hyperband(X_train, y_train, new_paramset[0], new_par
amset[1], new_paramset[2])
                hyperband.optimise(model)
#                  print("Best parameters", hyperband.best_parameters)
                RefModel = model.set_params(**hyperband.best_parameters)
        else:
                RefModel = model
        print(RefModel,file=f)

        for mc in range(0,trials):
                x_val, x_test, y_val, y_test = train_test_split(X_temp, y_temp,
test_size = 0.20)
                timemodelstart1    = time.time( )
                len_yval           = len(y_val)
                len_ytest          = len(y_test)
                Errmin             = 999
                Errvalue           = 999
                cnt                = 0

                BaseModel = RefModel.fit(x_val,y_val).predict(x_test)
                Error00[mc] = (mean_squared_error(BaseModel, y_test))**0.5

                DOBRModel = RefMode1.fit(x_val,y_val).predict(x_val)
                Errorval = (mean_squared_error(DOBRModel, y_val))**0.5
                print("Train Error ", Error00[mc],"Test Error ",Errorval," Ratio
: ",Error00[mc]/Errorval,"mc=",mc)
#                  Data_xin0_values     = x_val
#                  Data_yin0_values     = y_val
#                  XinBest              = x_val
   #               YinBest              = y_val

                rmsrbf1 = Error00[mc]
                while Errvalue > ErrCrit:
                    cnt += 1
                    timemodelstart1 = time.time( )
                    if cnt > 500:
                            print("Max iter. cnt for Error Acceptance: ",Errvalue,Acceptance[mcnt])
                            break

#                                       Absolute Errors & DOBR Filter

                    AError = RMS(DOBRModel, y_val)
                    inout1 = DOBR(AError, Acceptance[mcnt])

                    Data_yin_scrub, dumb1 = scrub1(inout1, y_val)
                    Data_xin_scrub, dumb2 = scrub2(inout1, x_val)
                    DOBR_yin_scrub, dumb3 = scrub1(inout1, DOBRModel)
                    rmsrbf2 = (mean_squared_error(DOBR_yin_scrub ,Data_yin_sc
rub) )**0.5

                    if rmsrbf2 < Errmin:
XinBest = Data_xin0_values
YinBest = Data_yin0_values
                        Errmin = rmsrbf2
                    Errvalue = abs(rmsrbf2 − rmsrbf1)/rmsrbf2
print(cnt,Errvalue," ",rmsrbf2,rmsrbf1,sum(inout1)/len_yva
l)
                    rmsrbf1 = rmsrbf2
                    DOBRModel = RefModel.fit(Data_xin_scrub,Data_yin_scrub).pred
ict(x_val)#<---------------
#                  Data_xin0_values = Data_xin_scrub
Data_yin0_values = Data_yin_scrub

DOBRModel = RefModel.fit(Data_xin_scrub,Data_yin_scrub).predic
t(x_val)
#                AError = RMS(DOBRModel, y_val)
#                inout1 DOBR(AError, Acceptance[mcnt])
                print( " Convergence in ",cnt," iterations with Error Value = ",
Errvalue)

#++++++++++++++++++++++++++++++++++++++++++++++++++++++++++++++++++++++++
+++++++++++++++++++++++++++++++++
                if mc == mc:
                    timemodelstart2 = time.time( )
                    new_paramset = gen_paramsClass(1)
                    hyperband = Hyperband(np.array(x_val), np,array(inout1),
```

Pseudo-Code 5

```
new_paramset[0], new_paramset[1], new_paramset[2])
                modelclass = RandomForestClassifier( ) #xgb.XGBClassifier( )
                hyperband.optimize(modelclass, True)
                Classmodel = modelClass.set_params(**hyperband.best_parameters)
                print(hyperband.best_parameters,file = f)
                print(hyperband.best_parameters)

                inout2 = Classmodel.fit(x_val, inout1).predict(x_test)
                modelfrac[mc] = sum(inout1)/len_yval
                PIM[mc] = sum(inout2)/len_ytest

#                               MODEL DOBR CENSORED DATASETS

                Data_yin_scrub, Data_yout_scrub = scrub1 (inout1, y_val)
                Data_xin_scrub, Data_xout_scrub = scrub2 (inout1, x_val)

#                               TEST DOBR CENSORED DATASET
                Data_xtestin_scrub, Data_xtestout_scrub = scrub2 (inout2, x_te
st)
                y_testin_scrub, y_testout_scrub = scrub1 (inout2, y_te
st)
                y_test_scrub = [*y_testin_scrub, *y_testout_scrub]

#                   DOBR INFORMATION APPLIED BASE MODEL PREDICTOR DATASET
                BaseModel_yin_scrub, BaseModel_yout_scrub = scrub1(inout2, Base
Model)

                DOBR_Model_testin = model.fit(Data_xin_scrub, Data_yin_scrub )
.predict(Data_xtestin_scrub )
                if len(y_test) == sum(inout2):
                    DOBR_Model0 = DOBR_Model_testin
                    DOBR_Model1 = DOBR_Model_testin
                    DOBR_Model2 = BaseModel_yin_scrub
                    print("inout2:",sum(inout2),"len = ",len(y_test))
                else:
                    DOBR_Model_testout = model.fit(Data_xout_scrub, Data_yout_sc
rub).predict(Data_xtestout_scrub)
                    DOBR_Model0 = [*DOBR_Model_testin, *DOBR_Model_testout
]
                    DOBR_Model1 = [*DOBR_Model_testin , *BaseModel_yout_scru
b]
                    DOBR_Model2 = [*BaseModel_yin_scrub, *DOBR_Model_testout
]

                DOBRFULL0[mc] = (mean_squared_error(DOBR_Model0, y_test_scrub))*
*0.5
                DOBRFULL1[mc] = (mean_squared_error(DOBR_Model1, y_test_scrub))*
*0.5
                DOBRFULL2[mc] = (mean_squared_error(DOBR_Model2, y_test_scrub))*
*0.5

    ModelFrac   = np.mean(modelfrac ,axis=0)
    Error00a    = np.mean(Error00 ,axis=0)
    DOBRFULL0a = np.mean(DOBRFULL0 ,axis=0)
    DOBRFULL1a = np.mean(DOBRFULL1 ,axis=0)
    DOBRFULL2a = np.mean(DOBRFULL2, axis=0)
    Error00e    = 1.96 * stats.sem(Error00 ,axis=0)
    DOBRFULL0e = 1.96 * stats.sem(DOBRFULL0 ,axis=0)
    DOBRFULL1e = 1.96 * stats.sem(DOBRFULL1 ,axis=0)
    DOBRFULL2e = 1.96 * stats.sem(DOBRFULL2 ,axis=0)

    PIM_Mean = np.mean(PIM)
    PIM_CL = 1.96 * stats.sem(PIM)

    print("   "+ list_modelname[mcnt], " # of Trials =",trials,
file=f)
    print(Classmodel,file=f)
    print(" Test Dataset Results for {0:3.0%} of Data Included in DOBR M
odel {1:3.0%} ± {2:4.1%} "
                .format(ModelFrac,PIM_Mean, PIM_CL),file=f)
    print(" Base Model={0:5.2f} ± {1:5.2f} DOBR_Model #1 = {2:5.2f} ±
{3:5.2f}"
                .format(Error00a,Error00e,DOBRFULL0a, DOBRFULL0e),file=f)
    print("                                    DOBR_Model #2 = {0:5.2f} ± {1:5.
2f}".format(DOBRFULL1a, DOBRFULL1e),file=f)
    print("                                    DOBR_Model #3 = (0:5.2f} ± {1:5.
2f}".format(DOBRFULL2a, DOBRFULL2e),file=f)
```

-continued

Pseudo-Code 5

```
    print(" "+ list_modelname[mcnt], " # of Trials =",trials)
    print(Classmodel,file=f)
    print(" Test Dataset Results for {0:3.0%} of Data Included in DOBR M
odel {1:3.0%} ± {2:4.1%} "
              .format(ModelFrac,PIM_Mean, PIM_CL))
    print(" Base Model={0:5.2f} ± (1:5.2f} DOBR_Model #1 = {2:5.2f} ±
{3:5.2f}"
              .format(Error00a,Error00e,DOBRFULL0a, DOBRFULL0e))
    print("                              DOBR_Model #2 = {0:5.2f} ± {1:5.
2f}".format(DOBRFULL1a, DOBRFULL1e))
    print("                              DOBR_Model #3 = {0:5.2f} ± {1:5.
2f}".format(DOBRFULL2a, DOBRFULL2e))
    print("+++++++++++++++++++++++++++++++++++++++++++++++++++++++++++++
++++++++++++++++++++++++++++++++++++++++++++")

    f.close( )
modeltime = (time.time( ) − timemodelstart) / 60
print("Total Run Time for {0:3} iterations = {1:5.1f} min".format(trials
,modeltime))
```

However, in some embodiments, outliers in the dataset 311 may reduce the accuracy of the implemented models, thus increasing the number of training iterations. To improve accuracy and efficiency, the DOBR engine 301 may include a DOBR filter 301*b* to dynamically test data point errors in the dataset to determine outliers. Thus, outliers may be removed to provide a more accurate or representative dataset 311. In some embodiments the DOBR filter 301*b* may provide an iterative mechanism for removing outlier data points subject to a pre-defined criterion, e.g., the user-defined error acceptance value described above and provided, e.g., by a user via the user input device 308. In some embodiments, the user-defined error acceptance value expressed as a percentage where, e.g., a value of 100% signifies that all of the error is accepted and no data points will be removed by the filter 301*b*, while a value of, e.g., 0% results in all of the data points being removed. In some embodiments, the filter 301*b* may be configured with an error acceptance value in the range of between, e.g., about 80% and about 95%. For example, the filter 301*b* may be configured to perform functions as depicted in pseudo-code 6 below:

Pseudo-Code 6

```
#              Absolute Errors & DOBR Filter

        AError = RMS(DOBRModel, y_val)
        inout1 = DOBR(AError, Acceptance[mcnt])

        Data_yin_scrub, dumb1 = scrub1(inout1, y_val)
        Data_xin_scrub, dumb2 = scrub2(inout1, x_val)
        DOBR_yin_scrub, dumb3 = scrub1(inout1, DOBRModel)
        rmsrbf2 = (mean_squared_error(DOBR_yin_scrub ,Data_yin_sc
rub) )**0.5

        if rmsrbf2 < Errmin:
XinBest = Data_xin0_values
YinBest = Data_yin0_values
               Errmin = rmsrbf2
        Errvalue = abs(rmsrbf2 − rmsrbf1)/rmsrbf2
print(cnt,Errvalue," ",rmsrbf2,rmsrbf1,sum(inout1)/len_yva
l)
        rmsrbf1 = rmsrbf2
        DOBRModel = RefModel.fit(Data_xin_scrub,Data_yin_scrub).pred
ict(x_val)#<----------------
#        Data_xin0_values = Data_xin_scrub
Data_yin0_values = Data_yin_scrub

DOBRModel = RefModel.fit(Data_xin_scrub,Data_yin_scrub).predic
t(x_val)
#        AError              = RMS(DOBRModel, y_val)
#        inout1              = DOBR(AError, Acceptance[mcnt])
     print( " Convergence in ",cnt," iterations with Error Value = ",
Errvalue)

```

In some embodiments, the DOBR filter 301*b* works in conjunction with an optimizer 306, which is configured to determine error and optimize parameters for each model in the regressor parameter library 305 and the classifier parameter library 304. Thus, in some embodiments, the optimizer 306 may determine model and communicate the error to the filter 301*b* of the DOBR engine 301. Thus, in some embodiments, the optimizer 306 may include, e.g., storage and/or memory devices and communication devices with sufficient memory capacity and bandwidth to receive the dataset 311 and model predictions and determine, e.g., outliers, convergence, error, absolute value error, among other error measures. For example, the optimizer 306 may be configured to perform functions as depicted in pseudo-code 7 below:

---

Pseudo-Code 7

---

```
def DOBR(AErrors,Accept):
    length = len(AErrors)
    Inout = [1]*length
    AThres = stats.scoreatpercentile(AErrors, Accept)
    for i in range(0,length):
        if AErrors[i] > AThres:
            Inout[i]=0
    return Inout
def RMS(Array1,Array2):
    length = len(Array1)
    Array3 = [0 for m in range(0,length)]
    for i in range(0,length):
        Array3[i] = (Array1[i] − Array2[i])**2
    return Array3
def scrub1(IO,ydata):
    lendata = len(ydata)
    outlen = sum(IO)
    Yin = [ ]*outlen
    Yout = [ ]*(lendata − outlen)
    for i in range(0,lendata):
        if IO[i] > 0:
            Yin.append(ydata[i])
        else:
            Yout.append(ydata[i])
    return Yin,Yout
def scrub2(IO,Xdata):
    lendata = len(Xdata)
    inlen = sum(IO)
    outlen = len(IO) − inlen
    cols = len(Xdata[0])
    Xin = [[0 for k in range(cols)] for m in range(inlen )]
    Xout = [[0 for k in range(cols)] for m in range(outlen)]
    irow = −1
    jrow = −1
    for i in range(0,lendata):
        if IO[i] > 0:
            irow += 1
            for j in range(0,cols):
                Xin[irow][j] = Xdata[i][j]
        else:
            jrow += 1
            for k in range(0,cols):
                Xout[jrow][k] = Xdata[i][k]
    return Xin,Xout
```

---

In some embodiments, the bias reduction system 300 may then return to a user, via, e.g., the display 312, machine learning model predictions, an outlier analysis, a convergence of predictions, among other data produced by the DOBR engine 301 in a more accurate and efficient manner due to the reduction in outliers that would otherwise bias predictions.

Figure 6:
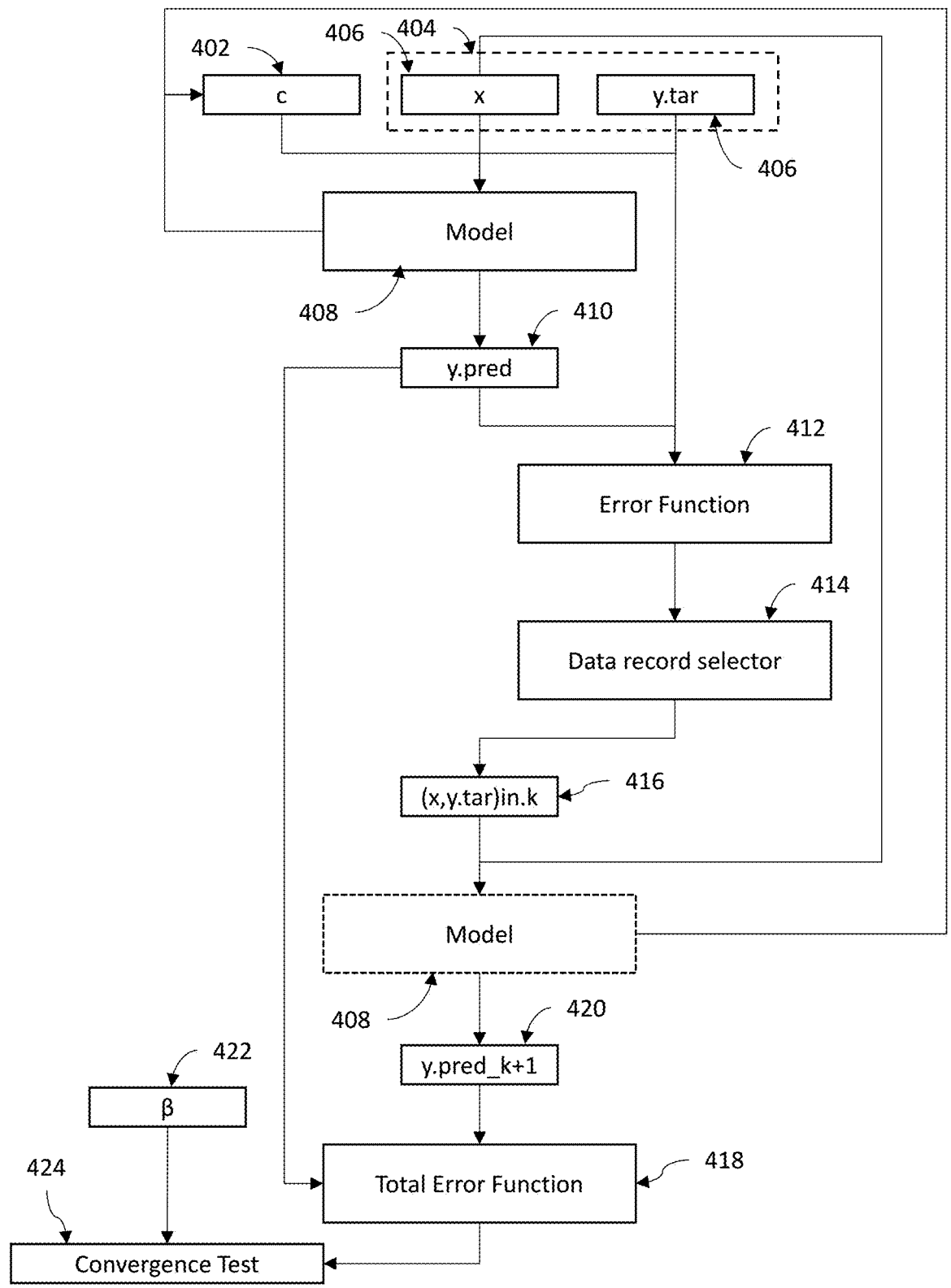
FIG. 6 illustrates a flowchart of an exemplary inventive methodology in accordance with one or more embodiments of the present disclosure.

FIG. 6 illustrates a flowchart of an exemplary inventive methodology in accordance with one or more embodiments of the present disclosure.

DOBR, such as the DOBR engine 301 and filter 301b described above, provides an iterative process to remove outlier records subject to a pre-defined criterion. This condition is the user-defined error acceptance value expressed as a percentage. It refers to how much error the user is willing to accept in the model based potentially on their insights and other analysis results that will be described later in this discussion. A value of 100% signifies that all of the error is accepted and no records will be removed in the DOBR process. If 0% is chosen, then all of the records are removed. Generally, error acceptance values in the range of 80 to 95% have been observed for industrial applications.

However, in some embodiments, it should also be noted that if a dataset contains no outliers then DOBR provides no value. But it is rare in practical situations that the analyst will have this knowledge before working with a dataset. As will be demonstrated later in this discussion, embodiments of the DOBR methodology can also determine the percentage of the dataset that represents model outliers. This pre-analysis step can assist in setting the proper error acceptance value or if outliers are present at all.

The following steps outline the fundamental DOBR method as it is applied to a complete dataset.

Pre-analysis: in an embodiment, first we choose the error acceptance criterion, say we select $\alpha=80\%$. (How to determine this value from the data will be demonstrated after the DOBR method is explained.) Then define the error acceptance criterion, $C(\alpha)$ according to, e.g., equation 1 below:

$$C(\alpha)=f(y_{pred},y_{tar}), \quad \text{Equation 1}$$

where $\alpha$ is the error acceptance criterion, C is a function of the error acceptance criterion, f( ) is a comparative function, y is a value of a data record, $y_{pred}$ is a predicted value and $y_{tar}$ is a target value.

Other functional relationships may be used to set $C(\alpha)$ but the percentile function is an intuitive guide in understanding why the model includes or excludes certain data records, such as equation 2 below:

$$C(\alpha)=P_\alpha((y_{pred_i}-y_{tar_i})^2), i \in (1,m), \quad \text{Equation 2}$$

where $P_\alpha$ is a percentile function, i is an index of a record entry, and m is the number of record entries.

Since the DOBR procedure is iterative, in an embodiment, we also define a convergence criterion which in this discussion is set at 0.5%.

In an embodiment, given a dataset $\{x, y_{tar}\}$ 404, a solution model M 408, and an error acceptance criterion $\alpha$ 424, DOBR can be implemented to reduce bias in training the model M 408. In some embodiments, the solution model M 408 is implemented by a model engine, including, e.g., a processing device and a memory and/or storage device. According to an embodiment, the exemplary methodology computes model coefficients, M(c) 402 and model estimates $\{y_{pred}\}$ 410 for all records applying the solution model, M 408, to the complete input dataset $\{x, y_{tar}\}$ 404 according to, e.g., equation 3 below:

$$\{y_{pred}\}_0, M(c_0)=M\{x, y_{tar}\}, \quad \text{Equation 3}$$

where 0 indicates an initial state, and x refers to an input record.

Then, according to an illustrative embodiment, a total error function 418 computes initial model total error $e_0$ according to, e.g., equation 4 below:

$$e_0 = \|\{y_{pred}\}_0, \{y_{tar}\}\| \quad \text{Equation 4}$$

where $e_0$ is the initial model total error and 0 denotes the initial value.

Then, according to an illustrative embodiment, an error function 412 computes model errors according to, e.g., equation 5 below:

$$\{E_k\}=\{(y_{pred_k}-y_{tar})_i^2, \forall i \in (1,m)\}, \quad \text{Equation 5}$$

where E are predicted record errors, and k denotes an iteration of record selection.

Then, according to an illustrative embodiment, the error function 412 computes new a data record selection vector $\{I_k\}$ according to, e.g., equation 6 below:

$$\{I_k\} = \left\{ i : \begin{cases} 1 \text{ if } E_{k_i} \le P_\infty(E_k) \\ 0 \text{ if } E_{k_i} > P_\infty(E_k) \end{cases}, \forall\, i \in (1, m) \right\},\quad \text{Equation 6}$$

where I is the record selection vector.

Then, according to an illustrative embodiment, a data record selector 414 computes the non-outlier data records to be included in model computation by selecting only records where the record selection vector is equal to 1, according to, e.g., equation 7 below:

$$(x,y)_{in_k} = \{(x_i, y_i) : I_{i_k}, \forall i \in (1, m)\},\quad \text{Equation 7}$$

where in is an index referring to the set of DOBR included records as non-outliers.

Then, according to an illustrative embodiment, the model 408 with the latest coefficients 402 computes new predicted values 420 and model coefficients 402 from the DOBR selected data records 416 according to, e.g., equation 8 below:

$$\left\{(y_{pred})_{in_k}\right\}_{k+1}, M(c_{k+1}) = M\{c_k, (x, y)_{in_k}\}.\quad \text{Equation 8}$$

Then, according to an illustrative embodiment, the model 408 using the new model coefficients, computes new prediction values 420 for the complete dataset. This step reproduces computing the predicted values 420 for the DOBR selected records in the formal steps, but in practice the new model can be applied to just the DOBR removed records according to, e.g., equation 9 below:

$$\{y_{pred}\}_{k+1} = M\{c_{k+1}, x\}.\quad \text{Equation 9}$$

Then, according to an illustrative embodiment, the total error function 418 computes model total error according to, e.g., equation 10 below:

$$e_{k+1} = \|\{\hat{y}_{pred}\}_{k+1}, \{\hat{y}_{tar}\}_{k+1}\|,\quad \text{Equation 10}$$

where ŷ is the target output.

Then, according to an illustrative embodiment, a convergence test 424 tests model convergence according to, e.g., equation 11 below:

$$\frac{|e_{k+1} - e_k|}{e_k} < \beta,\quad \text{Equation 11}$$

where β is a convergence criteria 422, such as, e.g., 0.5%.

In some embodiments, the convergence test 424 may terminate the iterative process if, for example, the percent error is less than, e.g., 0.5%. Otherwise, the process may return to the initial dataset 404. Each of the steps above may then be performed and the convergence criteria 422 retested. The process is repeated until the convergence test 424 is below the convergence criteria 424.

Figure 7:
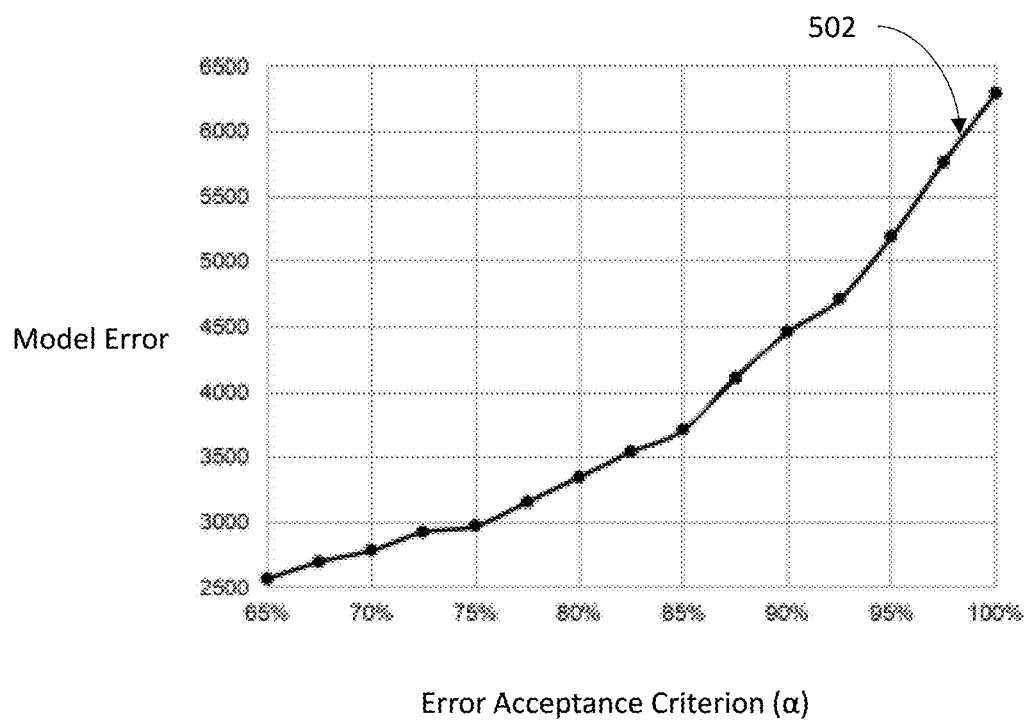
FIG. 7 depicts a graph illustrating an example of relationship between model error and an error acceptance criterion of another exemplary computer-based machine learning model with reduced bias in accordance with one or more embodiments of the present disclosure.

FIG. 7 is a graph illustrating an example of relationship between model error and an error acceptance criterion of another exemplary computer-based machine learning model with reduced bias in accordance with one or more embodiments of the present disclosure.

Since ∝ is an input parameter to DOBR and the model results can vary based on the value selected, in an embodiment, it is important to document a data-based procedure to justify which value is used. In the practical applications where DOBR was developed and applied there is no theoretical basis (yet) for its selection. However, in practice, a plot of model error versus ∝ may produce a change in slope where the apparent effects of outliers are reduced. FIG. 1 shows this plot for a nonlinear regression 402 calculation related to Power Generation benchmarking according to an embodiment of the present invention.

In an embodiment, the general shape of this curve predetermined in that it will always start with the largest error at ∝=100% and model error is zero when ∝=0%. In FIG. 7 notice that the curve slope changes around ∝=85%. And for all lesser ∝ values, the slope is nearly constant. The change in slope at this point suggests the model's variability is not changing with respect to removing data records, or in other words, no outliers are present at these levels of error acceptance. Above ∝=85% there are at least two slope apparent slope changes which suggests that certain dataset fractions contain behaviors or phenomena that are not accounted for in the model. This visual test can help set the appropriate error acceptance level and also determine if DOBR is needed at all. If the slope of the line in FIG. 7 does not change, then the model accounts satisfactorily for the observed variability in the data. There are no model outliers and DOBR does not need to be applied.

In simulation studies where specific percentages of additional variability was added to a dataset, the curves like FIG. 6 show an initially steep slope line that intersects a lessor value slope at approximately the error acceptance value programmed into the simulation. In practice, however, when outliers have been observed, the transition to a constant slope generally occurs gradually suggesting there is more than one type of variability that is not accounted for in the model.

The calculation of the appropriate error acceptance value is a necessary part of using DOBR and it also visually shows the amount and severity of outlier influences on model results. This step documents the selection of ∝ and can justify not using DOBR if the outlier influence is judged to be minimal compared to the value of the model predictions from the outlier data.

In some embodiments, the c and model error versus c value can be used as a metric for identifying a best performing model or ensemble of models for a particular scenario. Because different datasets may vary in degree of linearity, the exact c value for the data and for the model may change the performance of the model. Thus, the model error as a function of error acceptance level can be used to determine the degree to which a given model can account for variability in data by having a model error that indicates more or less tolerance for data variability in order to form accurate predictions. For example, precision and accuracy in model predictions may be tuned by selecting a model and/or model parameters that exhibit, e.g., low model error for a high error acceptance value to select for a model that is more tolerant to outlier data.

In some embodiments, model selection may be automated by employing, e.g., rule-based programming and/or machine learning models to identify the best performing model for a dataset according to a balance of model error and error acceptance criteria. Thus, a model may be automatically selected that optimally accounts for outliers in the dataset. For example, model error may be compared across models for one or more error acceptance values, with the model having the lowest model error being automatically selected to generate predictions.

As a result, the DOBR machine learning techniques according to aspects of the present disclosure provide more effective model training, as well as improved visibility into data and model behaviors for individual dataset. As a result, in fields such as artificial intelligence, data analytics, business intelligence, as well as other areas, machine learning models can be more effectively and efficiently trialed for various types of data. The model performance can then be more efficiently assessed to determine that an optimal model for the application and for the type of data. For example, artificial intelligence applications may be improved with models selected and trained using DOBR for the type of intelligence being produced. Similarly, business intelligence and data analytics, as well as other applications such as physical behavior prediction, content recommendation, resource use predictions, natural language processing, and other machine learning applications, may be improved by using DOBR to both tune model parameters and select models based on outlier characteristics and model error in response to outliers.

Figure 8:
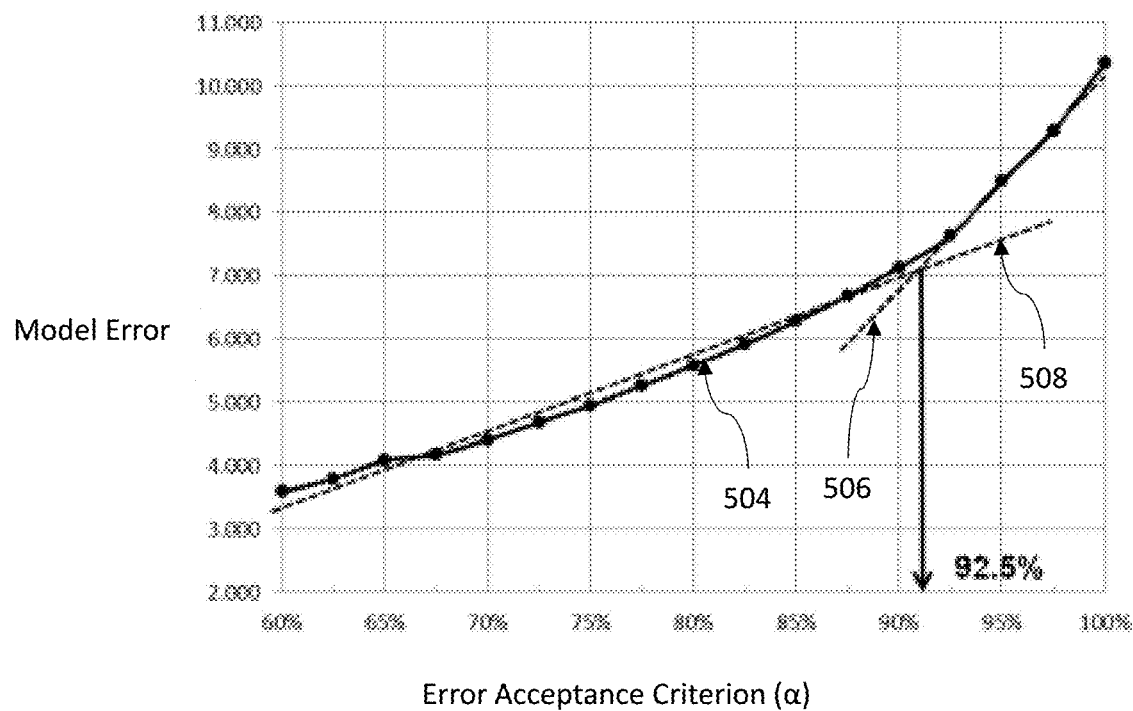
FIG. 8 depicts a graph illustrating an example of relationship between model error and an error acceptance criterion of another exemplary computer-based machine learning model with reduced bias in accordance with one or more embodiments of the present disclosure.

FIG. 8 is a graph illustrating an example of relationship between model error and an error acceptance criterion of another exemplary computer-based machine learning model with reduced bias in accordance with one or more embodiments of the present disclosure.

As an example of an embodiment of DOBR on a dataset, we use the concrete compression strength dataset 504 downloaded from the University of California-Irvine's machine learning data repository. This data set contains 1030 observations, records, or instances with 8 independent variables. The first seven describe the concrete composition with age given in days: cement amount, superplasticizer, blast furnace slag, coarse aggregate, fly ash, fine aggregate, water, and age.

The output variable is concrete compressive strength measured in megapascals (MPa). For comparison, 1 MPa≈145 psi. A linear regression model is constructed according to, e.g., equation 12 below:

$$\text{Concrete Compressive Strength} = \sum_{i=1}^{8} a_i x_i, \quad \text{Equation 12}$$

where $a_i$ are coefficient computed by a linear regression model, $x_i$ are observations of the 8 variables, and i is the variable index.

FIG. 8 is constructed by running the linear regression model 504 as a function of the DOBR error acceptance percentage, $\propto$, from 100 to 60%. From $\propto$=100% to about $\propto$=95% there is a rapid drop in model error, as shown by regression 506, then the error reduction as a function of a decreases at a slightly lower rate until $\propto$=85%. From this point on, $\propto$ decreases at a constant rate, as shown by regression 508. The point where the error begins to decrease at a constant rate is where the model outlier influence is omitted from the model calculation. In this case the selection point is $\propto$=85%.

Figure 9:
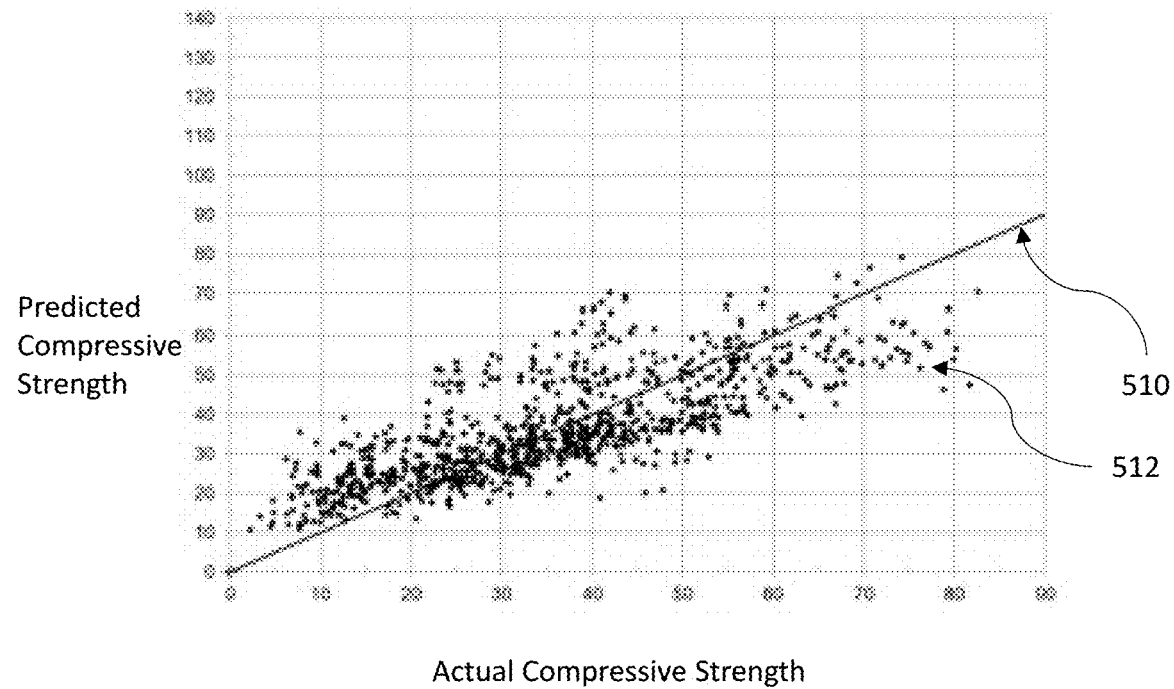
FIG. 9 depicts a graph illustrating an example of relationship between compressive strength and predicted compressive strength of a baseline computer-based machine learning model without reduced bias in accordance with one or more embodiments of the present disclosure.
Figure 10:
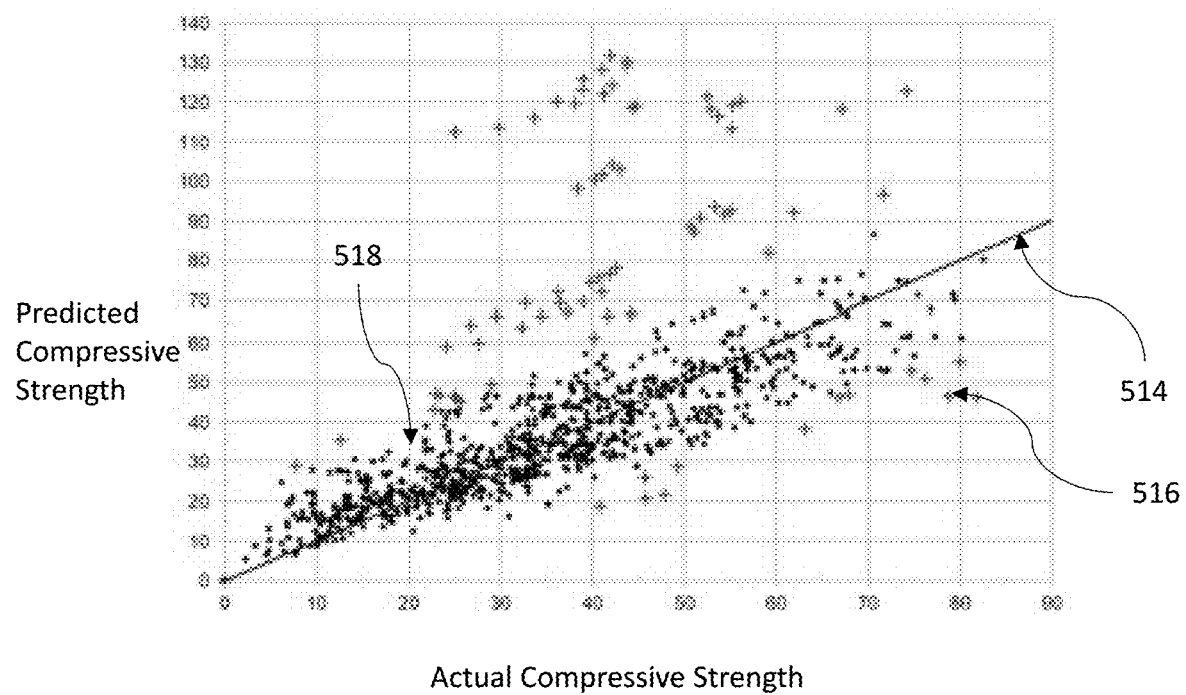
FIG. 10 depicts a graph illustrating an example of relationship between compressive strength and predicted compressive strength of another exemplary computer-based machine learning model with reduced bias in accordance with one or more embodiments of the present disclosure

In an embodiment, the DOBR is then modified linear regression model is re-run for $\propto$=92.5% to determine the best model that fits the non-outlier data. FIG. 9 and FIG. 10 displays the results of these calculations using the complete dataset 512 (FIG. 9) and the DOBR version (FIG. 10) with the outliers identified and removed from the calculation. The outlier values 516, marked in red crosses, are computed from the non-outlier model. Both of these plots show the actual versus predicted target values with the diagonal line 510 and 514, respectively for FIG. 9 and FIG. 10, depicting equality. The complete dataset calculation (FIG. 9) shows how outliers can bias results. The DOBR modified plot (FIG. 10) shows the bias removed with the diagonal line 514 bisecting the non-outlier values 518 and also apparent groups of outlier data points 516 that may warrant further study.

FIG. 9 is a graph illustrating an example of relationship between compressive strength and predicted compressive strength of a baseline computer-based machine learning model without reduced bias in accordance with one or more embodiments of the present disclosure.

FIG. 10 is a graph illustrating an example of relationship between compressive strength and predicted compressive strength of another exemplary computer-based machine learning model with reduced bias in accordance with one or more embodiments of the present disclosure The identification of outliers and the patterns they sometime form in the above type of plots have been useful for additional benefits of the DOBR method in industrial applications. The outliers can form patterns or groups that simply are not observed by other methods. This information is created by simply using DOBR with the analyst supplied model. No additional information or assumptions are required. In practice, the DOBR defined outlier set can supply useful information to improve, provide insights, or validate the underlying model.

Figure 11:
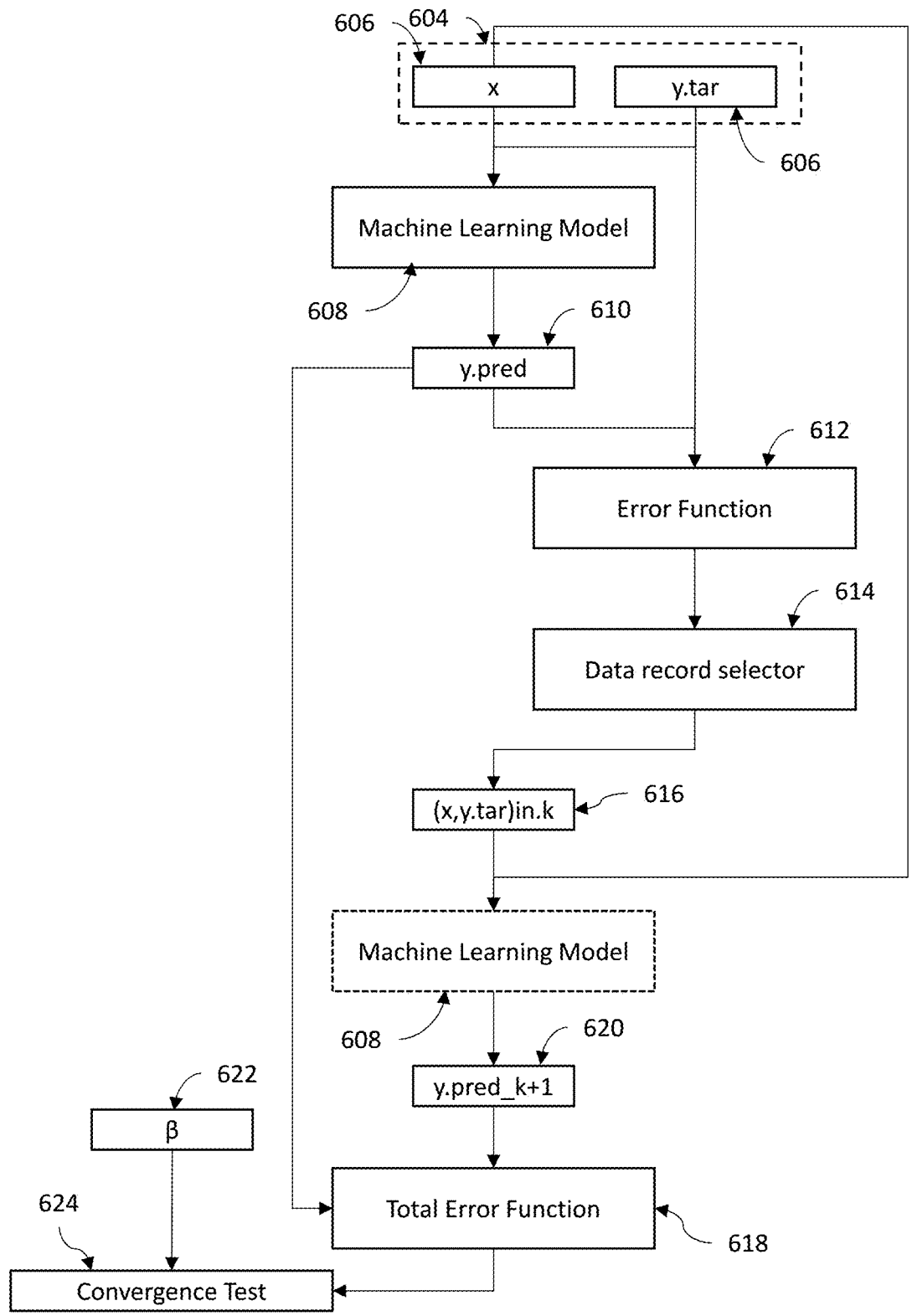
FIG. 11 depicts a block diagram of another exemplary computer-based system for machine learning predictions with DOBR in accordance with one or more embodiments of the present disclosure.

FIG. 11 is a block diagram of another exemplary computer-based system for machine learning predictions with DOBR in accordance with one or more embodiments of the present disclosure.

In an embodiment of the present invention, a machine learning procedure starts with a dataset, $\hat{X}$, consisting of n independent variables and m records in length and an array (m×1) of target variables, $\hat{Y}$. In an embodiment, to train the machine learning model, the dataset $\{\hat{X}, \hat{Y}\}$ is divided into two randomly selected subsets of pre-determined size: one to train the model and the other to test its predictive accuracy, as per, e.g., equation 13 below:

$$\{\hat{X}, \hat{Y}\} = \begin{cases} (\hat{x}, \hat{y})_{train}, \\ (\hat{x}, \hat{y})_{test} \end{cases}, \quad \text{Equation 13}$$

where $\hat{x}$ is a subset of the independent variables $\hat{X}$ of the dataset, and $\hat{y}$ is a subset of the independent variables $\hat{Y}$ of the dataset.

For this discussion, a 70%/30% split of $\{\hat{X}, \hat{Y}\}$ is used for training (n records) and testing (j records) (e.g., 70% of the records are training and 30% are testing), however any suitable split may be employed, such as, e.g., 50%/50%, 60%/40%, 80%/20%, 90%/10%, 95%/5%, or other suitable train/test split. A machine learning model, L, trained using $(\hat{x}, \hat{y})_{train}$, is tested by computing a set of predicted target variables, $\{y_{pred}\}$, expressed as in, e.g., equation 14 below:

$$\{y_{pred}\} = L[(\hat{x}, \hat{y})_{train}, \hat{x}_{test}]. \quad \text{Equation 14}$$

In an illustrative embodiment, the model accuracy is then measured as the norm, $\|y_{pred}, \hat{y}_{test}\|$, which may have, e.g., the following form:

$$\|y_{pred}, \hat{y}_{test}\| = \sqrt{\frac{1}{m}\sum_{i=1}^{m}(y_{pred_i} - \hat{y}_{test})^2}. \quad \text{Equation 15}$$

In an illustrative embodiment, in the training and testing environments, we can directly measure outliers since we have both the input and output variables. In general, outliers in model predictions, $\{y_{pred}\}$, such as with large deviations from the actual target variable values, are due to the inability of the model L, to transform the specific input values to prediction values near the known target variable. The input data for these records contain effects of factors and/or phenomena that the model cannot map to reality as given by the target variables. Keeping these records in the dataset can bias the results since the model coefficients are computed under the assumption that all data records are equally valid.

In some embodiments, the DOBR process described above, e.g., with reference to FIG. 6 above, works for a given dataset where the analyst desires the best model that fits the data by removing outliers that adversely biases the results. It increases the predictive accuracy of the model by restricting the model solution to a subset of the initial dataset that has the outliers removed. In an illustrative embodiment, a DOBR assisted solution has two output results:
a) A set of x values, model parameters, and model solutions for which the model describes the data, and
b) A set of x values, model parameters, and model solutions for which the model does not describes the data.

Therefore, in addition to computing a more accurate model for the restricted dataset, in embodiments, DOBR also provides an outlier dataset that can be further studied relative to the given model to understand the cause or causes of high model prediction error.

In an illustrative embodiment of a machine learning framework as shown earlier in this section, the predictive model is computed from the training data and that model alone is used in the testing phase. Since, by design the testing phase may not use the target values to determine outliers, the DOBR methodology described above with reference to FIG. 6 may not apply. However, there is an exemplary aspect of the DOBR methodology may not have been utilized above: the outlier—non-outlier classification potential as suggested by DOBR's output results mentioned previously.

To describe DOBR in a machine learning application of an embodiment of the present invention, the dataset may be divided into two randomly selected parts: one for training and one for testing. In the training phase both the independent and target variables are kept, but in testing the target variables are hidden and the independent variables are used to predict the target variable. The known target variable values are only used to measure the model's predictive error.

In an embodiment, given a training dataset $\{x, y_{tar}\}_{train}$ 604 with n records, a machine learning model L 608, and an error acceptance criterion $\propto$ 622, DOBR can be implemented to reduce bias in training the machine learning model L 608. In some embodiments, the machine learning model L 608 is implemented by a model engine, including, e.g., a processing device and a memory and/or storage device. According to an embodiment, the exemplary methodology model estimates, $\{y_{train}\}$ 606 for all records applying the machine learning model L 608, to the complete input dataset $\{x, y_{tar}\}_{train}$ 604 according to, e.g., equation 16 below:

$$\{y_{pred}\}_0 = L\{(x,y)_{train}, x_{train}\}, \quad \text{Equation 16}$$

where 0 indicates an initial state, and x refers to an input record.

Then, according to an illustrative embodiment, the total error function 618 compute initial model total error $e_0$ according to, e.g., equation 17 below:

$$e_0 = \|\{y_{pred}\}_0, \{y_{train}\}\|, \quad \text{Equation 17}$$

where $e_0$ is the initial model total error.

Then, according to an illustrative embodiment, error function 612 computes model errors according to, e.g., equation 18 below:

$$\{E_k\} = \{(y_{pred_k} - y_{tar})_i^2, \forall i \in (1,n)\}, \quad \text{Equation 18}$$

where E is a predicted record error, and k denotes an iteration.

Then, according to an illustrative embodiment, the error function 612 computes new data record selection vector according to, e.g., equation 19 below:

$$\{I_k\} = \left\{ i : \begin{cases} 1 \text{ if } E_{k_i} \leq P_\infty(E_k) \\ 0 \text{ if } E_{k_i} > P_\infty(E_k) \end{cases}, \forall i \in (1, n) \right\}, \quad \text{Equation 19}$$

where I is the record selection vector.

Then, according to an illustrative embodiment, a data record selector 614 computes the non-outlier data records to be included in model computation by selecting only records where the record selection vector is equal to 1, according to, e.g., equation 20 below:

$$(x,y)_{in_k} = \{(x_i, y_i)_{train} : I_{i_k} \forall i \in (1,n)\}, \quad \text{Equation 20}$$

where in is an index referring to the set of DOBR included records as non-outliers.

Then, according to an illustrative embodiment, the machine learning module 608 with the latest coefficients 602 compute new predicted values 620 for the complete training set 604 using the DOBR selected data records according to, e.g., equation 21 below:

$$\{y_{pred}\}_{k+1} = L\{(x,y)_{in_k}, x_{train}\}. \quad \text{Equation 21}$$

Then, according to an illustrative embodiment, the total error function 618 compute model total error according to, e.g., equation 22 below:

$$e_{k+1} = \|\{\hat{y}_{pred}\}_{k+1}, \{I_k\} * \{y_{train}\}\|, \quad \text{Equation 22}$$

Then, according to an illustrative embodiment, a convergence test 624 test model convergence according to, e.g., equation 23 below:

$$\frac{|e_{k+1} - e_k|}{e_k} < \beta, \quad \text{Equation 23}$$

where $\beta$ is a convergence criteria 622, such as, e.g., 0.5%.

In some embodiments, the convergence test 624 may terminate the iterative process if, for example, the percent error is less than, e.g., 0.5%. Otherwise, the process may return to the training dataset 604.

In some embodiments, the DOBR iteration procedure measures how well the model can predict itself rather than measuring its accuracy relative to the test dataset. The objective here is to test the capability of the model to predict the target variable and records with large deviations are systematically removed to improve the model's ability to focus on the larger majority of the data where the data predictions are relatively good. This process must be done on the same dataset. It doesn't make any sense to remove records from the training set if outliers are identified in the testing set. This process is fundamental to the DOBR method in that the records that are removed in a previous iteration are re-entered after a new model (new model parameters) have been computed. This process requires that the same dataset be used.

In an embodiment, this iteration procedure is performed after the learning model is defined. Based on the problem to be solved, in an embodiment, the user selects the machine learning algorithm and then determines the specific hyperparameters that "tune" or configure the model. These parameters can be chosen using standard techniques such as cross-validation or simply by plotting testing error as a function of the specific, user-supplied parameter ranges. The particular values used may optimize prediction accuracy versus computing time while ensuring the model is neither under- or over-fitted. There are several robust tools to assist in this process but the user experience and intuition are also valuable advantages in selecting the best model hyperparameters. The particular models and associated hyperparameters used in the examples discussed below.

The Error Acceptance vs Model Error plot is computed from this step by applying a sequence of error acceptance values and tabulating or plotting the results. These plots identify the fraction of the dataset that are outliers in the sense that their error contribution is marginally larger than the error contribution of data records that fit the model. Also in practice, these plots can show more than one type of variation not explained by the model. The slope can vary as it converges to the slope of the model. These variations can assist in researching the nature of additional data-coded behavior that is unexplained by the model. The records that occupy the different slope intervals can be identified and their further investigation can provide insights that may help in constructing an even more robust model.

In an embodiment, upon training, as described above, two models have been computed:

$$\{y_{ref}\} = L\{(x,y)_{train}, x_{test}\}, \quad \text{Model 1}$$

where $\{y_{ref}\}$ is a reference model that is used as a basis to measure accuracy improvements; and $$\{y_{Base}\} = L\{(x,y)_{in}, x_{test}\}, \quad \text{Model 2}$$

where $\{y_{Base}\}$ is the DOBR base model, built from the converged outlier censored records and trained on non-outlier data $(x,y)_{in}$.

In embodiments, the errors associated with Model 1 and Model 2 are, e.g., $\varepsilon_{ref} = \|\{y_{ref}\}, \{y_{test}\}\|$ and $\varepsilon_{Base} = \|\{y_{Base}\}, \{y_{test}\}\|$, respectively.

Thus, in embodiments, the base model $\{y_{Base}\}$ suggests it might be a better predictor for non-outlier records. However, the test dataset is uncensored, containing both non-outliers and outliers. Therefore, is it uncertain if applying a non-outlier, customized model to uncensored test data will produce a better predictive model compared to $\{y_{ref}\}$. However, in many cases, $\varepsilon_{Base}$ may be observed to be either statistically equal to or greater than $\varepsilon_{ref}$.

In non-machine learning applications where the objective is to compute the best predictive model for a given dataset, the DOBR model, computed from the selected (non-outlier) records always produces a lower model error since the identified outlier records are omitted. In the limiting case of no outliers the DOBR model error equals the total model error since the datasets are the same.

However, in machine learning applications, the objective may be to develop a model using a subset of available data (training) and then measure its predictive accuracy on another subset (testing). But, in some embodiments, the DOBR methodology removes model outliers each iteration before computing model parameters. In machine learning model development this can be done in the training phase, but by definition, the target values in testing can only be used to measure the model's predictive accuracy without advanced knowledge of outliers. This observation means that the standard DOBR methodology may be generalized utilizing more of the DOBR model information computed in the training phase.

FIG. 11 is a block diagram of another exemplary computer-based system for machine learning with reduced bias in accordance with one or more embodiments of the present disclosure.

In embodiments, upon training, as described above, the following information is produced: the DOBR selected training dataset values for the non-outliers $(x,y)_{in}$, the DOBR training data selection vector for the non-outliers $\{I_{in}\}$, the DOBR selected training dataset values for the outliers $(x,y)_{out}$, and the DOBR training data selection vector for the outliers $\{1-I_{in}\}$.

In embodiments, DOBR classifies the training data into two mutually exclusive subsets. In addition, we also have the corresponding selection vectors that provide a binary: (non-outlier or outlier) classification value for each record in the training dataset, e.g., according to equation 24 below:

$$(x,y)_{in} \& (x,y)_{out}, \text{ where: } (x,y)_{train} = (x,y)_{in} + (x,y)_{out} \text{ and } I_{train} = I_{in} + I_{out}. \quad \text{Equation 24}$$

In embodiments, the complete set of the training data attributes, $x_{train}$, and the DOBR produced classifications, $\{I_{train}\}$ are used to construct/train a classifier machine learning model, C, e.g., stored in the model library 303. This model is applied to the testing dataset, $x_{test}$, to classify the testing data records as outliers or non-outliers based on the training dataset DOBR-established knowledge. For example, the classifier machine learning model C is implemented according to equation 25 below:

$$\{I_C\} = C[(I_{train}, x_{train}), x_{test}]. \quad \text{Equation 25}$$

Thus, in an embodiment, $\{I_C\}$ produces two testing predictive datasets; $x_{test_{in}}$ and $x_{test_{out}}$ where $I_{C_i} = 1$ or 0, respectively. The above information creates several possible "full dataset" predictive models for analysis of the test dataset. In some embodiments, the three that have shown the most predictive improvements for the entire dataset are:

$$\{y_1\} = \{y_{1_{in}}\} + \{y_{1_{out}}\}, \text{ where } \begin{cases} y_{1_{in}} = L[(x,y)_{in}, x_{test_{in}}] \\ y_{1_{out}} = L[(x,y)_{out}, x_{test_{out}}] \end{cases}, \quad \text{Model 3}$$

$$\{y_2\} = \{y_{2_{train-in}}\} + \{y_{2_{train-out}}\}, \quad \text{Model 4}$$

$$\text{where } \begin{cases} y_{2_{train-in}} = L[(x,y)_{train}, x_{test_{in}}] \\ y_{2_{train-out}} = L[(x,y)_{train}, x_{test_{out}}] \end{cases},$$

$$\{y_3\} = \{y_{2_{train-in}}\} + \{y_{1_{out}}\}. \quad \text{Model 5}$$

In some embodiments, for $\{y_1\}$, the machine learning model L 608, is defined by the non-outlier data, $(x,y)_{in}$ and applied to the DOBR test classified data $x_{test_{in}}$ to predict the non-outlier test values. The same procedure is done for the outlier data. In embodiments, the objective of this combination is to use the most precise predictive model with its corresponding dataset. In other words, this model tests the overall predictive accuracy of the non-outlier and outlier models applied separately on their respective datasets that were defined with the DOBR classification.

In some embodiments, for $\{y_2\}$, the machine learning model L 608, is defined by the training data, $(x,y)_{train}$ and is also applied to the DOBR test classified data $x_{test_{in}}$. This model uses the broad knowledge of $L(x,y)_{train}$ to predict the target values of the DOBR defined outlier and non-outlier x values. The purpose of this model is test the predictive accuracy of the full training model applied separately to the DOBR classified non-outlier and outlier datasets.

In some embodiments, the third model $\{y_3\}$, is a hybrid that joins the predictive characteristics of the previous two approaches. This model tests the predictive benefit, if any, of joining $L(x,y)_{train}$, the model 608 trained on the total training with $L(x,y)_{out}$, the specific model trained on the DOBR classified outliers in the training set applied to their respective, classified datasets. There are additional hybrid models that may be explored in further research.

In each of these three models and other embodiments, the complete test dataset is predicted utilizing both the DOBR classified non-outlier and outlier records. The ability of the DOBR method to improve machine learning model overall predictive accuracy is being tested with these models. But DOBR's primary benefit is to identify model outliers, remove them, and compute the best model predictor from the remaining non-outlier values. And by definition, DOBR defined outliers are records that contain variation not adequately described in the current variables (or features) given utilized machine learning model.

In some embodiments, with the outlier and non-outlier datasets computed, the analyst has at least three options or more. In an embodiment, a first option is to apply the base model, $\{y_{ref}\}$, and do not apply DOBR. This is data-driven strategy when the Risk Acceptance vs. Model Error curve is close to a linear relationship. In an embodiment, a second is to apply one or more of the models: $\{y_1\}$, $\{y_2\}$, or $\{y_3\}$, and combine e.g. average the results. In an embodiment, a third is to develop predictions for just the non-outlier records and further research the outlier data to develop a modeling strategy for this specialized new dataset—e.g. change the machine learning model or add variables to account for unexplained variation, etc.

Regarding option 3, there are several ways to compute the non-outlier dataset and two possible choices are mentioned here. One reason for the relatively large number of possibilities may be due to the non-linearity of many applied machine learning models. In general, $\{I_C\}*L(x,y)_{train}, x_{test}] \neq *L[(x,y)_{train}, \{I_C\}*x_{test}]$. This inequality may be due to the complexity of many machine learning models. Equality holds for linear regression, for example, but not as a general rule for machine learning models.

In embodiments, regarding non-outlier predictions, the DOBR method was not initially designed to improve the prediction of the complete dataset. By design, the method converges to the best set of outliers based on the provided model and dataset. The remaining data and model calculations provide improved accuracy but there is no guidance on how to make predictions for the outliers. The implicit decision is to apply a different model to the outlier dataset that reflects the unique data variations that are not present in the non-outlier model.

In embodiments two models are defined to test non-outlier prediction accuracy—removing the outliers from the analysis. The first choice for selecting the non-outlier dataset applies the DOBR classification vector, $\{I_C\}$, to the reference model, $\{y_{ref}\}$, according, e.g., model 6 below:

$$\{y_4\} = \{I_C\} * L[(x,y)_{train}, x_{test}] = \{I_C\} * \{y_{ref}\}. \quad \text{Model 6}$$

In embodiments, the reference model utilizes the complete training data-defined model to make predictions from the dataset, $x_{test}$. The classification vector is then applied to remove predicted outliers based on the DOBR method's knowledge obtained from the training dataset. This model applies DOBR to the most general or broad domain model.

In embodiments, the second model applies DOBR in the most narrow or "precise" manner by using the DOBR model created from the training stage from non-outlier training data, to only the records selected by the classification model, $\{I_C\}$, according, e.g., model 7 below:

$$\{y_5\} = L[(x,y)_{in}, \{I_C\}*x_{test}] = \{I_C\} * L[(x,y)_{in}, x_{test_{in}}] = \{y_{1_{in}}\}. \quad \text{Model 7}$$

There are other models that can be formed from the analytical formulations developed in this research and, depending on the problem, they may have significant predictability improvement potential. However, the models used here, $\{y_4\}$ and $\{y_5\}$, are limiting cases representing the broadest and narrowest versions in terms of training domain utilization and model definition.

In embodiments, to test the predictive accuracy of the DOBR developed models defined above, such as, e.g., Models 3-7, we use $\{y_{ref}\}$ as a comparison basis for models $\{y_1\}$, $\{y_2\}$, and $\{y_3\}$ (Models 3, 4 and 5, respectively). For $\{y_4\}$ and $\{y_5\}$ (Models 6 and 7, respectively), the model predictions for the non-outlier dataset, the comparison basis is $\{I_C\}*y_{test}$. Thus, in embodiments, error can be determined according to, e.g., equations 26, 27 and 28, below:

$$\varepsilon_{Ref} = \|\{y_{Ref}\}, \{y_{test}\}\| = \sqrt{\frac{1}{m}\sum_{i=1}^{m}(y_{Ref_i} - y_{test_i})^2}, \quad \text{Equation 27}$$

where $m$ = length of dataset, $$\varepsilon_k = \|\{y_k\}, \{y_{test}\}\| = \sqrt{\frac{1}{m}\sum_{i=1}^{m}(y_{k_i} - y_{test_i})^2}, \quad \text{Equation 28}$$

where $\begin{cases} k = 1, 2, 3 \\ m = \text{length of test dataset} \end{cases}$, $$\varepsilon_k = \|\{y_k\}, \{\breve{y}_{test}\}\| = \sqrt{\frac{1}{G}\sum_{i=1}^{G}(y_{k_i} - \breve{y}_{test_i})^2}, \quad \text{Equation 29}$$

where $\begin{cases} k = 4, 5 \\ G = \text{length of non-outlier dataset} \\ \breve{y}_{test} = \{I_C = 1\} * y_{test} \end{cases}$.

In the following examples of illustrative embodiments, the measure of DOBR's predictive accuracy is gauged by how much, (if any), $\varepsilon_1$, $\varepsilon_2$, and/or $\varepsilon_3$ are less than $\varepsilon_{Ref}$. For the non-outlier dataset errors, $\varepsilon_4$ and $\varepsilon_5$, the measure of improvement is the decrease in error relative to the outlier adjusted base error $\varepsilon_{Ref}$. The adjustment are described below with regards to the example results.

In some embodiments for machine learning examples of the exemplary inventive DOBR improvements, the accuracy of the previously defined five models may be tested with seven machine learning regression models: Linear Regression, k Nearest Neighbor, LASSO, Support Vector, Decision Tree, Bagging, and Random Forest. These machine learning regression models are examples of a broad spectrum of model constructs. Additional or alternative models are also contemplated, such as neural networks, clustering, ensemble models, among others and combinations thereof.

Linear regression is a method that gives analysts insights regarding the process where the coefficients (or the model parameters), can have a technical/process-related meaning. A model of the process, represented by an equation, must be supplied by the analyst and the coefficients are determined by minimizing the error between the predicted and the data supplied target values.

LASSO, an abbreviation for 'least absolute shrinkage and selection operator,' is a regression-related methodology where an addition term is added to the objective function. This term is the sum of the absolute values of the regression coefficients and it is minimized subject to a user supplied parameter. The purpose of this additional term is to add a penalty for increasing the value of variable (or feature) coefficients. The minimization only retains the dominant coefficients and can help in reducing the hard to interpret effects of variable (or feature) covariance or collinearity.

Decision Tree Regression can mimic human thinking and are intuitive and easy to interpret. The model chooses a decision tree construct that logically shows how the x values produce the target variable. The specific parameters like maximum depth and minimum samples per leaf are set by the analyst in the training/test machine learning exercise.

Random Forest Regression builds on the Decision Tree method. Just like forests are made with trees, a random forest regression model is made with groups of decision trees. The analyst defines the forest structure by supplying the of estimators (number of trees in the forest), some parameters similar to decision trees maximum depth of the trees, leaf characteristics, and technical parameters related to how the model error is computed and applied.

k-NN refers to k nearest neighbors methods where the predicted value is computed from the k nearest neighbors in the x (or feature) domain. Selecting the metric to measure distance and the specific number of nearest neighbors to use are the major parameters set by the analyst in tuning a model for predictions on a given dataset. It is a straightforward method that can work well for regression and classification predictions.

Support Vector Regression is a versatile, machine learning method that has several variations. Regression means fitting a model to data and the optimization is usually a minimization of error between predicted and the target variables. With support vector regression, the error criterion is generalized to say that if the error is less than some value 'ε', then we say that's 'close is good enough' and only errors greater than 'ε', are measured and optimized. In addition to this attribute, the method allows the data to be transformed into nonlinear domains with standard or in some cases, user-defined transformation functions or kernels. The multi-dimensional data structure is used where the objective is to compute robust predictions—not to model the data in the tradition spirit of regression.

Bagging Regression computes prediction estimates from drawing random subsets with replacement. Each random sample computes a decision tree (by default) prediction of the target variable. The final ensemble prediction value can be computed several ways—the average value is one example. The primary machine learning variables are the number of estimators in each ensemble, the number of variables (or features) and samples to draw to train each estimator, and selection/replacement guidelines. The method can reduce the variance compared other methods like decision tree regression.

The classifier model, $C[(I_{training}, x_{train}), x_{test}]$ is an illustrative example since it is applied to the DOBR non-outlier/outlier classifications and the training set x values to define non-outlier and outliers in the test dataset. This a critical step in DOBR's machine learning application since it transfers the knowledge of outliers from the training set to the testing or production dataset. If there are improper classifications, the utility of DOBR methodology to improve the accuracy of machine learning predictions is not realized.

Decision Tree, k-NN, Random Forest, and Bagging classifier models were tested for their classification accuracy. The Bagging and Random Forest models were selected and both models tuned to produce the correct error acceptance fraction for non-outliers. A more detailed classification analysis could suggest other models. An extensive classifier analysis, even though classification accuracy is paramount, is beyond the scope of this initial discussion.

Figure 12:
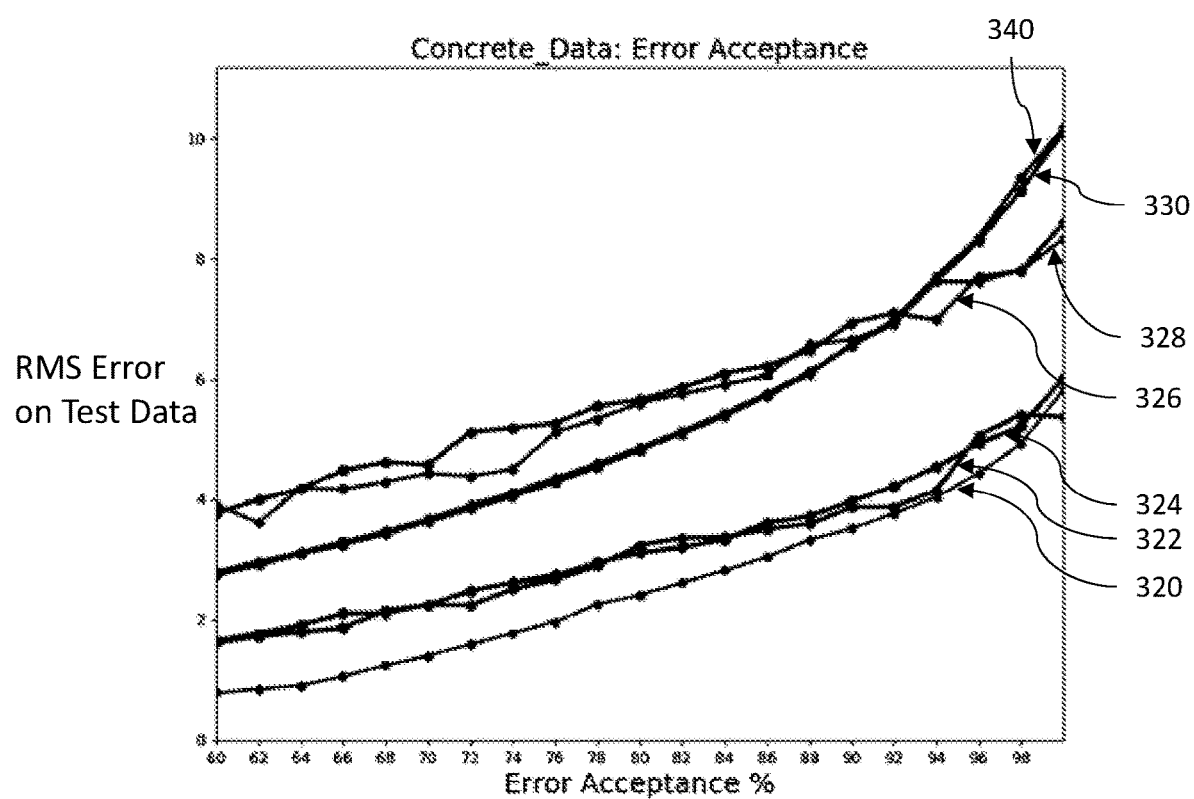
FIG. 12 depicts a graph illustrating an example of relationship between model error and an error acceptance criterion of some exemplary computer-based machine learning models with reduced bias for predicting concrete strength in accordance with one or more embodiments of the present disclosure.

FIG. 12 is a graph illustrating an example of relationship between model error and an error acceptance criterion of some exemplary computer-based machine learning models with reduced bias for predicting concrete strength in accordance with one or more embodiments of the present disclosure.

The first example uses the same dataset as described above with reference to concrete compression strength, where DOBR is applied to a complete dataset. As a short review, this dataset contains concrete compression strength as a function of its composition and exposure as defined by 8 quantitative input variables. The dataset has 1,030 records or instances and can be found at the University of California, Irvine machine learning repository archive.

The machine learning training exercise divides this dataset into a 70%:30% split with model tuning performed on the training dataset (70%) and the prediction results measured with the testing (30%) dataset.

The model tuning results for seven machine learning models in concrete compression strength prediction are given in Table 1, below.

TABLE 1

| | |
|---|---|
| Linear Regression | fit_intercept = False, normalize = False |
| LASSO | alpha = 4, fit_intercept = False |
| Decision Tree Regressor | max_depth = 6, min_samples_split = 2 |
| Random Forest Regressor | n_estimators = 3, min_samples_leaf = 30 |
| k-Neighbors Regressor | n_neighbors = 3 |
| SVR | C = 10, gamma = 0.0005, kernel = 'rbf' |
| Bagging Regressor | n_estimators = 25, max_samples = 35 |

Default model parameters (e.g., for Python 3.6) are not shown since they do not add information to the results. In embodiments, the tuning process is an exercise in selecting parameters that minimized training and testing dataset errors using the mean squared error as the indicator. More sophisticated algorithms could be applied but the straightforward approach was used simply to ensure the results did not over- or under-fit either dataset error.

In an embodiment, to apply DOBR, a determination the percentage of data, if any, where the error is excessively large is performed. In embodiments, the machine learning models are applied for a sequence of error acceptance fractions record the corresponding model errors. This is done solely for the training data set since the test data set is used only to measure the machine learning model's prediction accuracy. The data percentage included in the model, "error acceptance" refers to the amount of total model error the user is willing to acceptance and also indicates the fraction of data that the model adequately describes.

In embodiments, the error acceptance percentage sequence ranges from 100% to 60% in increments of 2.

Figure 13:
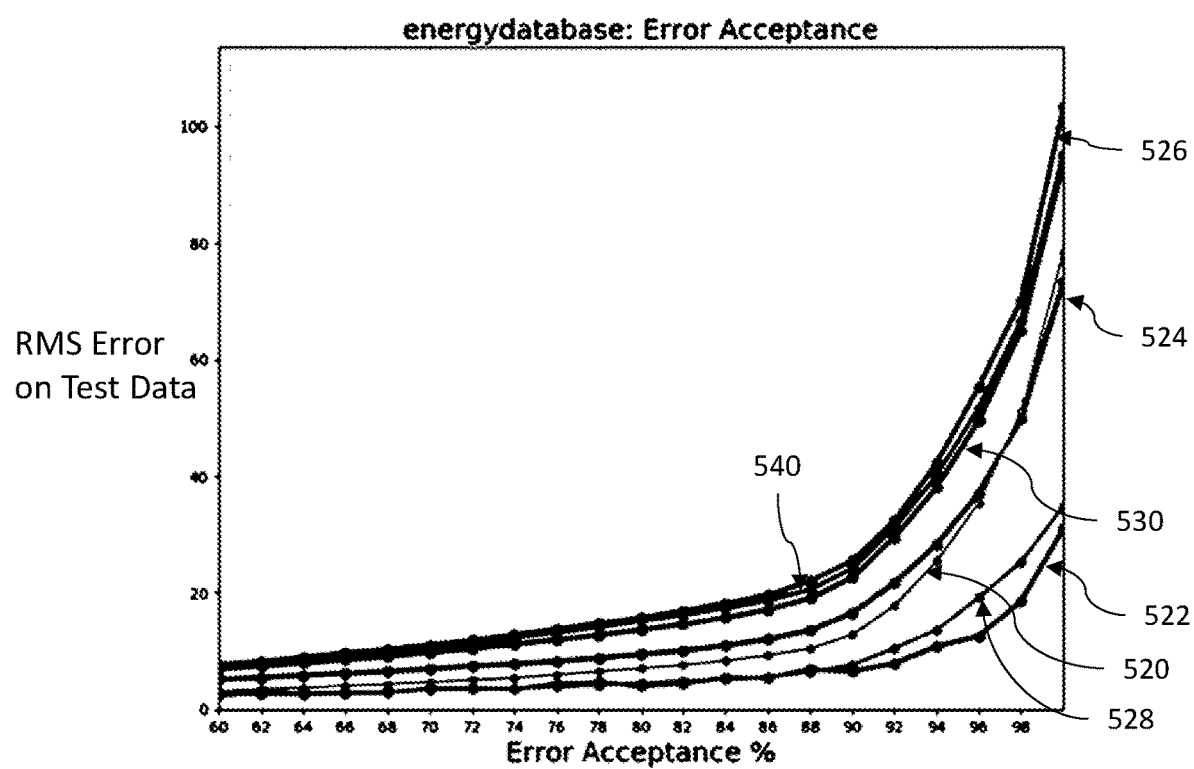
FIG. 13 depicts a graph illustrating an example of relationship between model error and an error acceptance criterion of some exemplary computer-based machine learning models with reduced bias for predicting energy use in accordance with one or more embodiments of the present disclosure.

FIG. 13 is a graph illustrating an example of relationship between model error and an error acceptance criterion of some exemplary computer-based machine learning models with reduced bias for predicting energy use in accordance with one or more embodiments of the present disclosure.

The second example contains appliance energy use data along with household environmental and lighting conditions with a sampling every 10 minutes for 4½ months. It is comprised of 29 attributes: 28 input variables and 1 output (target variable) and 19,735 records: The dataset and documentation can be found at the University of California, Irvine machine learning repository archive.

Similar to above, in embodiments, the model tuning results for seven machine learning models in appliance energy use prediction are given in Table 2, below.

TABLE 2

| Linear Regression | fit_intercept = False, normalize = False |
|---|---|
| LASSO | alpha = 4, fit_intercept = False, max_iter = 100000, tol = 0.01 |
| Decision Tree Regressor | max_depth = 22, min_samples_leaf = 2 |
| Random Forest Regressor | n_estimators = 6 |
| k-Neighbors Regressor | n_neighbors = 9 |
| SVR | C = 1000, gamma = 0.001, kernel = 'rbf' |
| Bagging Regressor | n_estimators = 20, max_samples = 15 |

In embodiments, default model parameters (e.g., for Python 3.6) are not shown since they do not add information to the results. The tuning process was an exercise in selecting parameters that minimized training and testing dataset errors using the mean squared error as the indicator. More sophisticated algorithms could be applied but the straightforward approach was used simply to ensure the results did not over- or under-fit either dataset error.

In an embodiment, to apply DOBR, a determination the percentage of data, if any, where the error is excessively large is performed. In embodiments, the machine learning models are applied for a sequence of error acceptance fractions record the corresponding model errors. This is done solely for the training data set since the test data set is used only to measure the machine learning model's prediction accuracy. The data percentage included in the model, "error acceptance" refers to the amount of total model error the user is willing to acceptance and also indicates the fraction of data that the model adequately describes.

In embodiments, error acceptance percentage sequence ranges from 100% to 60% in increments of 2.

FIG. 12 and FIG. 13 show, in part, the machine learning models' capability to adapt to high variation data. The closer the lines are to linear (being straight), the greater the model's ability to adequately describe the data which translates to fewer, if any outliers. The linear behavior for several models applied to the Concrete Data show they can almost completely adequately describe the entire training dataset. The nonlinearity of the results for the energy dataset suggest that there is a significant percentage of data records where models produce inaccurate predictions or outliers.

For each curve in the above concrete data plot, including, e.g., linear regression 530, LASSO 540, decision tree regression 522, random forest regression 528, k-neighbors regression 524, support vector regression (SVR) 520, and bagging regression 526, and in the above energy use data plot, including, e.g., linear regression 730, LASSO 740, decision tree regression 722, random forest regression 728, k-neighbors regression 724, support vector regression (SVR) 720, and bagging regression 726, the straight line defined by the low error acceptance percentages may extrapolated to determine the error acceptance value where the fraction of outliers begins, as per an embodiment of the present invention. This process could be automated but in practice, it may be performed by hand to ensure that the selected error acceptance value reflects the analyst's judgment.

The extrapolation exercise and error acceptance percentage selection is a relatively simple process but it has very important implications. It indicates how good the proposed model fits the data. The error acceptance value complement is the dataset percentage that are outliers, i.e., the percentage of records where the model fails to make relatively accurate predictions. This is important information in choosing the machine learning (or any model) for a given dataset and practical application. Table 3 represents the error acceptance values chosen for each mode for the two example datasets.

TABLE 3

|  | Concrete Compression | Appliance Energy Use |
|---|---|---|
| Linear Regression | 80% | 84% |
| LASSO | 80% | 84% |
| Decision Tree | 94% | 90% |
| Random Forest | 90% | 90% |
| k Nearest Neighbor | 88% | 84% |
| Support Vector | 94% | 84% |
| Bagging | 92% | 84% |

In embodiments, the predictive accuracy of just the DOBR selected values are compared to the reference model. This is the basic utility of DOBR since the method by itself does not provide any specific information about increasing the predictive accuracy for the complete dataset. Therefore, the DOBR analysis presents the analyst with a potential tradeoff: to have better predictive power for part of the dataset but with no information provided for outlier records. The question addressed in this section is how much, if any, are the DOBR selected results more accurate compared to the corresponding reference model test data predictions.

The reference error is computed for the complete dataset. The adjusted reference error values for comparison with the non-outlier datasets is computed by multiplying the complete reference error by the error acceptance value. For example, if the reference error is 10.0 and the error acceptance value is 80%, then the adjusted reference error is 10×80% or 8.0. The interpretation utilizes the definition of "error acceptance." If the non-outlier data is computed on 80% of the data for example, then 80% of the total error should still be remaining in the non-outlier data. This is the error acceptance definition.

The results measuring the predictive accuracy performance of the DOBR selected non-outliers is presented in Table 4 and Table 5, below, corresponding to, e.g., a concrete strength dataset and an energy dataset, respectively. The reference error is computed by multiplying the actual error acceptance percentages by the point estimates of $\|\{y_{Ref}\}, \{y_{test}\}\|$. The Random Forest classifier was not applied to the concrete dataset since it was judged not going to change the conclusions regarding DOBR's predictive accuracy improvement.

For all the following statistical, the results show the mean±a 95% confidence interval from 100 random trial selections of training and test data subsets. In some examples in the following tables the Support Vector results were computed from fewer iterations (5 or 10) for manage computing time issues.

TABLE 4

| | Actual Error Acceptance (%) | ‖{y_{Ref}}, {ỹ_{test}}‖ | Reference Error | ‖{y_4}, {y_{test}}‖ | ‖{y_5}, {y_{test}}‖ | {y_4} % Improvement | {y_5} % Improvement |
|---|---|---|---|---|---|---|---|
| Linear Regression | 81.2% | 10.49 ± 0.07 | 8.52 | 6.54 ± 0.08 | 7.80 ± 0.10 | 23.2% | 8.4% |
| LASSO | 81.6% | 10.61 ± 0.07 | 8.58 | 6.55 ± 0.07 | 7.90 ± 0.08 | 23.6% | 7.9% |
| Decision Tree | 96.0% | 7.89 ± 0.10 | 7.67 | 7.64 ± 0.10 | 7.45 ± 0.11 | 0.5% | 1.6% |
| Random Forest | 91.8% | 9.04 ± 0.10 | 8.30 | 8.36 ± 0.10 | 7.96 ± 0.11 | −0.7% | 4.2% |
| k Nearest Neighbor | 88.3% | 9.26 ± 0.10 | 8.18 | 8.44 ± 0.12 | 7.77 ± 0.10 | −3.2% | 5.0% |
| Support Vector | 93.9% | 9.84 ± 0.11 | 9.24 | 9.11 ± 0.11 | 8.57 ± 0.10 | 1.4% | 7.2% |
| Bagging | 96.5% | 9.02 ± 0.10 | 7.80 | 8.37 ± 0.10 | 7.86 ± 0.09 | −7.3% | −0.7% |

TABLE 5

| | Actual Error Acceptance (%) | ‖{y_{Ref}}, {y_{test}}‖ | Reference Error | ‖{y_4}, {y_{test}}‖ | ‖{y_5}, {y_{test}}‖ | {y_4} % Improvement | {y_5} % Improvement |
|---|---|---|---|---|---|---|---|
| Bagging | | | | | | | |
| Linear Regression | 87.2% | 93.99 ± 0.41 | 81.96 | 61.99 ± 0.38 | 59.48 ± 0.50 | 24.4% | 27.4% |
| LASSO | 86.9% | 94.87 ± 0.37 | 82.44 | 60.80 ± 0.42 | 59.53 ± 0.55 | 26.3% | 27.8% |
| Decision Tree | 92.3% | 92.06 ± 0.51 | 84.97 | 74.25 ± 0.52 | 67.08 ± 0.55 | 12.6% | 21.1% |
| Random Forest | 92.0% | 77.73 ± 0.36 | 71.51 | 61.48 ± 0.40 | 63.25 ± 0.49 | 14.0% | 11.6% |
| k Nearest Neighbor | 84.7% | 82.49 ± 0.38 | 69.87 | 52.71 ± 0.38 | 52.41 ± 0.50 | 24.6% | 25.0% |
| Support Vector | 86.7% | 82.59 ± 0.93 | 71.61 | 52.17 ± 1.67 | 54.81 ± 1.87 | 27.1% | 23.5% |
| Bagging | 88.5% | 103.40 ± 0.53 | 89.44 | 77.89 ± 0.71 | 59.28 ± 0.54 | 12.9% | 33.7% |
| Random Forest | | | | | | | |
| Linear Regression | 87.8% | 93.96 ± 0.39 | 82.33 | 60.42 ± 0.40 | 56.87 ± 0.52 | 26.6% | 30.9% |
| LASSO | 87.3% | 95.08 ± 0.47 | 83.00 | 59.48 ± 0.38 | 57.46 ± 0.52 | 28.4% | 30.8% |
| Decision Tree | 92.1% | 92.08 ± 0.53 | 84.81 | 73.63 ± 0.54 | 65.38 ± 0.47 | 13.2% | 22.9% |
| Random Forest | 92.3% | 77.59 ± 0.35 | 71.62 | 61.41 ± 0.31 | 62.07 ± 0.41 | 14.3% | 13.3% |
| k Nearest Neighbor | 84.9% | 82.50 ± 0.34 | 70.04 | 51.45 ± 0.39 | 49.83 ± 0.52 | 26.6% | 28.9% |
| Support Vector | 86.7% | 83.38 ± 1.32 | 72.29 | 52.41 ± 1.33 | 55.31 ± 1.60 | 27.5% | 23.5% |
| Bagging | 84.3% | 103.96 ± 0.59 | 87.64 | 65.51 ± 1.06 | 54.50 ± 0.52 | 25.3% | 37.8% |

Table 4 shows that there is little, if any predictive improvement using the DOBR selected records. This result is not surprising and in fact, is expected based on the shape of the error acceptance vs. model error curve shown in FIG. 12.

Also as expected, based on FIG. 13, Table 5 indicates there is considerable improvement in the DOBR selected predictions from the reference model values for both the Bagging and Random Forest classifiers, see FIG. 14A and FIG. 14B, respectively, below. The DOBR model, {y_5}={y_{1_{in}}} shows the most improvement suggesting the removal of outliers before model learning, coupled with the DOBR classification provides better results than just using the DOBR classification to the full (non-DOBR) model. The difference in improvement results between models shows that model choice is important. Even though this decision is made by the analyst, it is interesting to compare the prediction accuracy by model. Model run time and several other factors are also important and this research is not designed or intended to suggest the viability of one model over another.

The conclusion from Table 5 is clear and statistically significant. Given the potential for outlier bias, as indicated in FIG. 13-like plot, the machine learning model with the DOBR methodology can provide better predictive accuracy for the non-outlier records than by using the machine learning model without DOBR. Thus, an exemplary inventive computing system including a machine learning model with DOBR has improved accuracy and reduced error in making predictions, thus increasing the performance and efficiency of implementing the model. But the improvement may be achieved at a price: there may be no predictive value or consideration given to the identified outlier values. In embodiments, how the outlier records are modeled can vary based on the application.

Table 6 shows the predictive accuracy results for train/test samplings of the concrete compression strength dataset with the Bagging Classifier. The Random Forest Classifier was not applied to this dataset. The table displays the root mean square error (see, Equation 15) at a 95% confidence level between the test data and each of the models for 100 random selections of the training and test datasets.

TABLE 6

| | ‖{y_{Ref}}, {y_{test}}‖ | ‖{y_1}, {y_{test}}‖ | ‖{y_2}, {y_{test}}‖ | ‖{y_3}, {y_{test}}‖ |
|---|---|---|---|---|
| Linear Regression | 10.49 ± 0.07 | 9.2 ± 0.1 | 10.13 ± 0.08 | 9.58 ± 0.08 |
| LASSO | 10.51 ± 0.07 | 9.2 ± 0.1 | 10.25 ± 0.08 | 9.53 ± 0.09 |
| Decision Tree | 7.89 ± 0.10 | 7.9 ± 0.1 | 7.84 ± 0.11 | 7.98 ± 0.09 |
| Random Forest | 9.04 ± 0.10 | 9.04 ± 0.10 | 9.26 ± 0.12 | 9.40 ± 0.09 |
| k Nearest Neighbor | 9.26 ± 0.10 | 9.6 ± 0.1 | 9 06 ± 0.09 | 9.83 ± 0.11 |
| Support Vector | 9.84 ± 0.11 | 10.6 ± 0.2 | 10.09 ± 0.15 | 10.32 ± 0.11 |
| Bagging | 9.02 ± 0.10 | 9.3 ± 0.1 | 8.82 ± 0.12 | 9.44 ± 0.11 |

Linear Regression and LASSO produce the largest base or reference model errors. However, the $\{y_1\}$ models yield prediction accuracies statistically the same as all of the other models except Decision Tree. In this case, the Decision Tree model produces the best prediction accuracy and all of the models excluding Linear Regression and LASSO appear not to improve with the addition of DOBR.

Table 7 shows the increase (+) or decrease (−) in prediction accuracy of the DOBR models relative to the reference model in each case for, e.g, Concrete Compression Strength Prediction Accuracy Performance of DOBR Models: Bagging Classifier.

TABLE 7

|  | $\{y_1\}$ % Improvement | $\{y_2\}$ % Improvement | $\{y_3\}$ % Improvement |
|---|---|---|---|
| Linear Regression | 12.39% ± 0.55% | 3.44% ± 0.51% | 8.63% ± 0.47% |
| LASSO | 11.98% ± 0.60% | 2.44% ± 0.53% | 9.29% ± 0.42% |
| Decision Tree | −0.44% ± 1.07% | −2.54% ± 1.29% | −1.28% ± 0.77% |
| Random Forest | −6.73% ± 1.46% | −3.68% ± 0.41% | −6.17% ± 0.67% |
| k Nearest Neighbor | −4.17% ± 0.99% | 2.11% ± 0.66% | 0.23% ± 0.19% |
| Support Vector | −7.38% ± 1.37% | −2.61% ± 1.38% | −4.88% ± 0.29% |
| Bagging | −2.71% ± 1.17% | 2.11% ± 1.20% | 4.77% ± 0.98% |

These results are not surprising since the Model Error vs. Error Acceptance curves for Linear Regression and LASSO were the plots with the largest nonlinearity and the others are almost straight lines suggesting that the models adequately predict the target variable and outlier analysis is not required. And this is the message conveyed in Table 7. Model outputs regarding predicted concrete compressive strength is represented in Appendix A, attached herewith.

Now looking at the energy consumption prediction error results in Table 8 a different situation exists involving, e.g., Appliance Energy Consumption Prediction Errors For Bagging and Random Forest Classifiers. The Bagging, Linear Regression and LASSO models have largest reference prediction errors and the Random Forest Model the smallest. The DOBR model errors in the right three columns show, that in many cases, the DOBR models yield a higher the prediction accuracy than the reference models.

TABLE 8

|  | $\|\{y_{Ref}\}, \{y_{test}\}\|$ | $\|\{y_1\}, \{y_{test}\}\|$ | $\|\{y_2\}, \{y_{test}\}\|$ | $\|\{y_3\}, \{y_{test}\}\|$ |
|---|---|---|---|---|
| Bagging |  |  |  |  |
| Linear Regression | 93.99 ± 0.41 | 84.70 ± 0.39 | 86.47 ± 0.32 | 92.36 ± 0.47 |
| LASSO | 94.87 ± 0.37 | 84.87 ± 0.39 | 85.76 ± 0.32 | 94.06 ± 0.44 |
| Decision Tree | 92.06 ± 0.51 | 87.84 ± 0.54 | 93.34 ± 0.49 | 86.37 ± 0.52 |
| Random Forest | 77.73 ± 0.36 | 81.82 ± 0.39 | 80.57 ± 0.35 | 79.08 ± 0.41 |
| k Nearest Neighbor | 82.49 ± 0.38 | 84.75 ± 0.38 | 84.92 ± 0.33 | 82.31 ± 0.45 |
| Support Vector | 82.59 ± 0.93 | 79.27 ± 1.20 | 77.46 ± 1.10 | 84.29 ± 1.08 |
| Bagging | 103.40 ± 0.53 | 85.55 ± 0.46 | 92.52 ± 0.71 | 97.41 ± 0.58 |
| Random Forest |  |  |  |  |
| Linear Regression | 93.98 ± 0.39 | 81.95 ± 0.40 | 84.45 ± 0.33 | 91.75 ± 0.45 |
| LASSO | 95.08 ± 0.47 | 82.53 ± 0.46 | 83.93 ± 0.38 | 93.84 ± 0.54 |
| Decision Tree | 92.08 ± 0.53 | 87.11 ± 0.46 | 93.34 ± 0.49 | 85.71 ± 0.45 |
| Random Forest | 77.59 ± 0.35 | 79.34 ± 0.37 | 78.92 ± 0.35 | 78.14 ± 0.37 |
| k Nearest Neighbor | 82.50 ± 0.34 | 82.62 ± 0.31 | 83.59 ± 0.27 | 81.51 ± 0.39 |
| Support Vector | 83.38 ± 1.32 | 79.76 ± 1.5S | 77.77 ± 1.43 | 85.24 ± 1.42 |
| Bagging | 103.96 ± 0.59 | 85.94 ± 0.51 | 93.55 ± 0.79 | 97.76 ± 0.59 |

It is interesting to note that Bagging reference model has the largest reference error values but its DOBR augmented model results are generally in the same statistical ranges as the other models. Also for practical reasons the Support Vector model was run for only 10 iterations. This explains the increase in uncertainty across its model results.

The detailed improvement results are shown in Table 9 related to, e.g., Appliance Energy Consumption Prediction Accuracy Performance of DOBR Models. Note that at least one of the DOBR models produces some prediction accuracy increase for most of the machine learning models. However, there are also relatively large differences so there are no conclusive results regarding DOBR produced predictability improvement. From the Model Error vs. Error Acceptance curves for the energy data, all of the plots show nonlinearity behavior with the Random Forest and Decision Tree models having the smallest amount of curvature. And it appears than the models, particularly Random Forest, can adequately model this variation based on the results shown here. Model outputs regarding predicted energy use is represented in Appendix B, attached herewith.

TABLE 9

|  | $\{y_1\}$ % Improvement | $\{y_2\}$ % Improvement | $\{y_3\}$ % Improvement |
|---|---|---|---|
| Bagging |  |  |  |
| Linear Regression | 9.87% ± 0.27% | 7.98% ± 0.23% | 1.74% ± 0.11% |
| LASSO | 10.53% ± 0.23% | 9.59% ± 0.21% | 0.85% ± 0.10% |
| Decision Tree | 4.55% ± 0.56% | −1.41% ± 0.36% | 6.16% ± 0.45% |
| Random Forest | −5.28% ± 0.41% | −3.68% ± 0.41% | 1.74% ± 0.33% |
| k Nearest Neighbor | −2.74% ± 0.30% | −2.96% ± 0.29% | 0.23% ± 0.19% |
| Support Vector | 4.02% ± 0.93% | 6.21% ± 0.95% | −2.05% ± 0.24% |
| Bagging | 17.23% ± 0.42% | 10.48% ± 0.75% | 5.77% ± 0.48% |
| Random |  |  |  |

TABLE 9-continued

|  | {y₁} % Improvement | {y₂} % Improvement | {y₃} % Improvement |
| --- | --- | --- | --- |
| Forest |  |  |  |
| Linear Regression | 12.80% ± 0.27% | 10.14% ± 0.23% | 2.38% ± 0.12% |
| LASSO | 13.20% ± 0.24% | 11.71% ± 0.21% | 1.31% ± 0.12% |
| Decision Tree | 5.35% ± 0.58% | −1.40% ± 0.44% | 6.89% ± 0.41% |
| Random Forest | −2.28% ± 0.44% | −1.74% ± 0.39% | −0.73% ± 0.36% |
| k Nearest Neighbor | −0.16% ± 0.32% | −1.34% ± 0.30% | 1.20% ± 0.16% |
| Support Vector | 4.35% ± 0.98% | 6.73% ± 0.90% | −2.23% ± 0.27% |
| Bagging | 17.31% ± 0.47% | 9.98% ± 0.77% | 5.94% ± 0.48% |

Figure 14A:
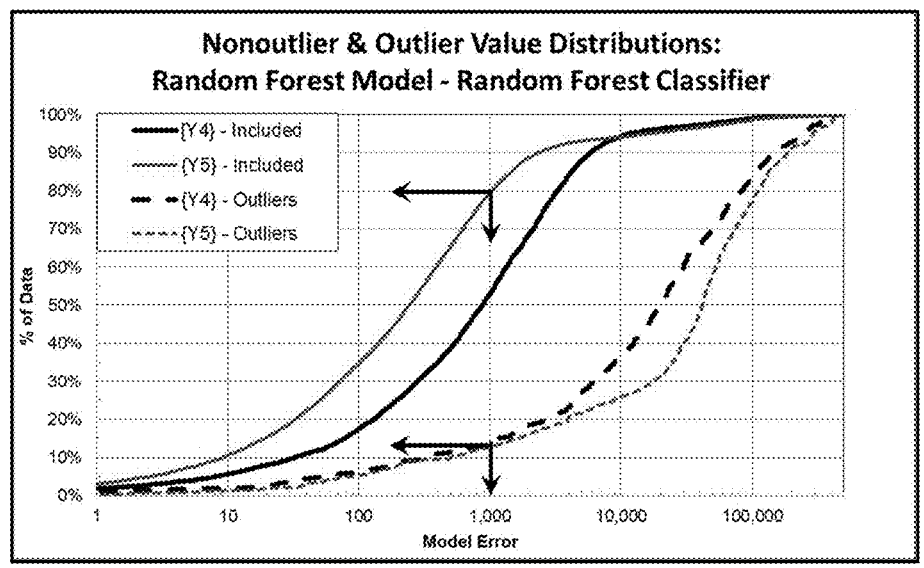
FIG. 14A and FIG. 14B illustrate plots of non-outlier and outlier distributions in classifier models according to an exemplary embodiment of an inventive exemplary computer based system with a DOBR classifier in accordance with one or more embodiments of the present disclosure.
Figure 14B:
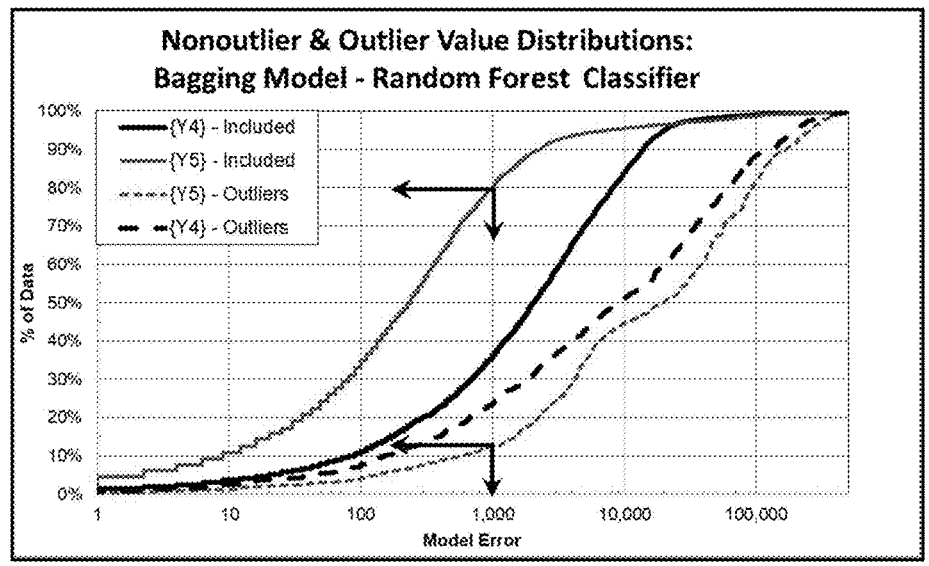

FIG. 14A and FIG. 14B illustrate plots of non-outlier and outlier distributions in classifier models according to an exemplary embodiment of an inventive exemplary computer based system with a DOBR classifier in accordance with one or more embodiments of the present disclosure.

The concrete dataset is relatively small so data plots can provide visual insights, but since DOBR has little value in this case, graphing this dataset doesn't improve our understanding as to how DOBR works. For the energy dataset predictions however, DOBR does produce some significant predictive improvements. But its relatively large size (13,814 training records, 5,921 testing records) makes direct scatter plot visualizations difficult to interpret. The scatter plots, like FIG. 9 and FIG. 10, with a large number of points can blot out any detail. The error improvement results presented in Table 3 are summations over the non-outlier datasets, but the question remains as to how the DOBR method and the classification model produce these results.

In embodiments, to address this question the error distributions for the two model representations can be analyzed: $\{y_4\}$, the Random Forest classifier (FIG. 14A) and $\{y_5\}$ the Bagging classifier (FIG. 14B) of the outlier and non-outlier datasets. In an embodiment, the non-outlier errors should be smaller than the outlier errors by design but the exemplary inventive DOBR model and the classification process are constructed from the training data exclusively so the testing dataset can contain information not previously seen. Consequently, the model and classification calculations may not be precise and the extent of classification errors can be visualized in these plots. This work is performed for the Linear and Bagging Regression models as these two approaches have the largest and smallest improvement benefits, respectively, presented in Tables 5.

For discussion the reference error value is highlighted in both plots of FIG. 14A and FIG. 14B. The top set of arrows show that 80% the non-outlier error values are less than 1,000 which says the 20% of the error values are >1,000. This lower set of arrows show also that for the outlier distributions, about 20% of outlier values have an error <1,000 or 80% has errors >1,000—which should be representative of outlier errors. Without having advance knowledge of the error acceptance percentage values, we cannot precisely computed the accuracy of the classification process but the above plots do suggest that even though misclassification occurs, most of the values are properly classified.

Figure 14C:
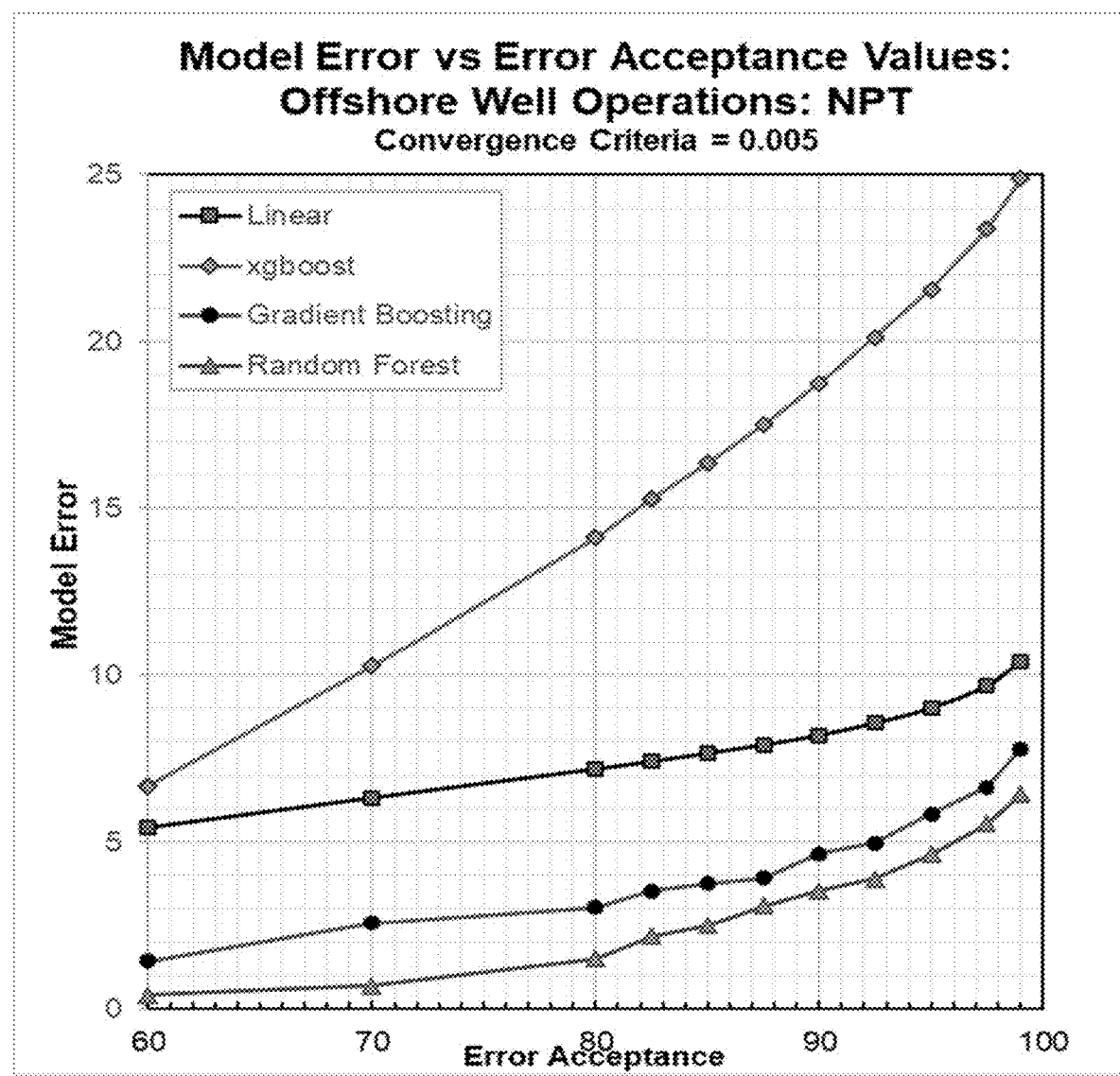
FIG. 14C illustrates plots of model error as a function of error acceptance values for an example use case of an exemplary embodiment of an inventive exemplary computer based system with a DOBR-trained machine learning model for predicting non-production time in well drilling in accordance with one or more embodiments of the present disclosure.

FIG. 14C illustrates plots of model error as a function of error acceptance values for an example use case of an exemplary embodiment of an inventive exemplary computer based system with a DOBR-trained machine learning model for predicting non-production time in well drilling in accordance with one or more embodiments of the present disclosure.

Offshore well drilling operations contain unique challenges for the oil and gas industries. In addition to the observable logistical and environmental risks from weather and ocean depths, there hidden downhole risks operating in high temperature, pressure, and vibration environments. Drilling times are held to tight schedules and delays due to downhole equipment failures (non-productive time or NPT) can represent significant revenue penalties.

To aid in managing NPT, a machine learning model is constructed to help predict future downtime events for the purpose of including these estimated delays into contract terms that set drilling goals. Looking at historical events including: Distance Drilled [feet], Hole Size [inch], Tool Size [inch], Location Pressure Severity, Max Dog Leg [deg/100 ft], Vibration Severity Category, Curvature Category, and NPT (hr).

Linear, xgboost, Gradient Boosting, and Random Forest regression models were applied to the downhole equipment failure data with a 80/20 train/test split to measure model predictive accuracy. Hyperband was used to tune the models and the pertinent parameter values shown in Table 10 below:

TABLE 10

| | |
| --- | --- |
| xgboost | eta = 0.76, max_depth = 4, min_child_weight = 0.43 |
| Gradient Boosting | learning_rate = 0.34, min_samples_split = 0.58, n_estimators = 13 |
| Random Forest | max_depth = 4, min_samples_leaf = 2, min_samples_split = 9, n_estimators = 6 |

The classification function that transfers the DOBR computed outlier information to the test dataset may be chosen as a random forest model with the number of estimators equal to, e.g., 5. This tuning activity is also accomplished in the training part of the analysis. The metric for parameter selection is to compute the percentage of correctly classified elements of the training set and compare it to the model's error acceptance value.

Linear regression is included in this analysis since it is the only model where the coefficients can provide engineering insights to help identify additional best practice refinements. The other models are more robust from a predictive perspective but offer little insights.

As discussed in this specification there are several DOBR-related models that can be constructed basic DOBR process. In this example three models are presented: M represents a given hyptertuned model.

Using the DOBR selected inliers and outliers of the training and test datasets:

| Pseudo-Code 8 |
| --- |
| DOBR_Model_testin = M (Data_xin_scrub, Data_yin_scrub ).predict(Data_xtestin_scrub<br>DOBR_Model_testout = M (Data_xout_scrub, Data_yout_scrub).predict(Data_xtestout_scrub)<br>BaseModel_yin, BaseModel_yout = IBaseModel | where Data_xin_scrub and Data_yin_scrub are the DOBR computed inliers from the training set, Data_xout_scrub and Data_yout_scrub are the DOBR computed outliers from the training set, DOBR_Model_testin and DOBR_Model_testout are the test dataset inliers and outliers, respectively, computed from the DOBR classification model, BaseModel_yin, BaseModel_yout are non-DOBR computed model results classified into inliers and outliers using the DOBR classification model, and I assigns BaseModel values to BaseModel_yin for DOBR defined inliers and to BaseModel_yin for DOBR defined outliers.

From these subsets the three DOBR models are:
a. DOBR_Model #1=[DOBR_Model$_{testin}$, DOBR_Model$_{testout}$]
b. DOBR_Model #2=[BaseModel$_{yin}$, DOBR_Model$_{testout}$]
c. DOBR_Model #3=[DOBR_Model$_{testin}$, BaseModel$_{yout}$]

Running the Error Acceptance percentage versus Model Error Curves for the aforementioned hypertuned models produces the curves as shown in FIG. 14C. The important property of these curves is their curvature—not the error values by themselves. In general, the more linear a given curve's slope over the domain (0,100%), the smaller the influence of outliers. For the offshore downhole equipment failure data, the curves appear linear up to about an error acceptance of 80% and then various nonlinear slopes appear. In analyzing the slope as a function of error acceptance values, the following table (Table 11) shows the determined error acceptance thresholds for the DOBR analysis.

TABLE 11

| Regression Model | Applied Error Acceptance % |
| --- | --- |
| Linear | 85.0 |
| xgboost | 85.0 |
| Gradient Boosting | 85.0 |
| Random Forest | 85.0 |

The models were all run with the computed hyperparameters and assigned Error Acceptance values. Model outputs regarding predicted NPT is represented in Appendix C, attached herewith, and the error results tabulated in Table 12 below:

TABLE 12

| Regression Model | Base (no DOBR) error | DOBR Model #1 | DOBR Model #2 | DOBR Model #3 |
| --- | --- | --- | --- | --- |
| Linear | 16.4 | 14.0 | 14.9 | 15.6 |
| xgboost | 11.1 | 10.6 | 10.0 | 11.6 |
| Gradient Boosting | 16.9 | 10.5 | 17.8 | 9.6 |
| Random Forest | 13.9 | 9.0 | 9.0 | 13.4 |

Now that we have the non-DOBR model alongside the three DOBR models we are in a position to select which model to use in production for future predictions. Overall, the linear model offers the lowest predictive accuracy and DOBR Models #1 or #2 offer the best. At this point the analyst can balance these accuracy figures with other practical considerations, e.g. computing time to select model to apply to future predictions.

While the results for the use of DOBR to train and implement machine learning models for application in predicting concrete compressive strain and in predicting energy, other applications are also contemplated.

For example, image rendering and visualization may leverage machine learning models to automatically predict and implement rendering parameters based on, e.g., medical data, as described in U.S. Pat. No. 10,339,695, herein incorporated by reference in its entirety for all purposes. DOBR may be employed to train and implement machine learning models for content-based rendering. A medical dataset representing a three-dimensional region of a patient may be employed as input data. Using DOBR, outliers from a training medical dataset may be removed such that the machine learning model may be trained on non-outlier data according to the DOBR techniques described above. The machine-learned model is trained with deep learning of the non-outlier data from the training medical dataset to extract features from the medical dataset and to output values for two or more physically-based rendering parameters based on input of the medical dataset. In some embodiments, the physically-based rendering parameters are controls for consistent data handling, lighting design, viewing design, material propriety, or internal renderer property. A physically-based renderer renders a photorealistic image of the three-dimensional region of the patient using the output values resulting from the applying.

In another example application of DOBR for training and implementing machine learning models, a machine learning model may be trained with the DOBR techniques described above to generate a control command for a machine to output the control command, as described in U.S. Pat. No. 10,317,854, herein incorporated by reference in its entirety for all purposes. In such an example, a simulator may perform a simulation of a work operation of the machine based on the control command. The simulator may generate a complete data set for training the machine learning model by simulating physical actions of the machine based on the control command. Such a dataset may be processed using the DOBR iterations to ensure any outlier simulations are removed when training the model parameters including the work operation data, control command data and machine data used as input for each simulation.

Other examples of the application of DOBR for training and implement machine learning models may include, e.g., a Software-as-a-Service implementation for on-demand model training and deployment, outlier dataset analytics with outlier trained models, grid energy optimization modeling, user content recommendation modeling for optimizing user engagement, among other implementations. Some examples are described in further detail below:

SaaS Implementation for Custom ML Training

Figure 15:
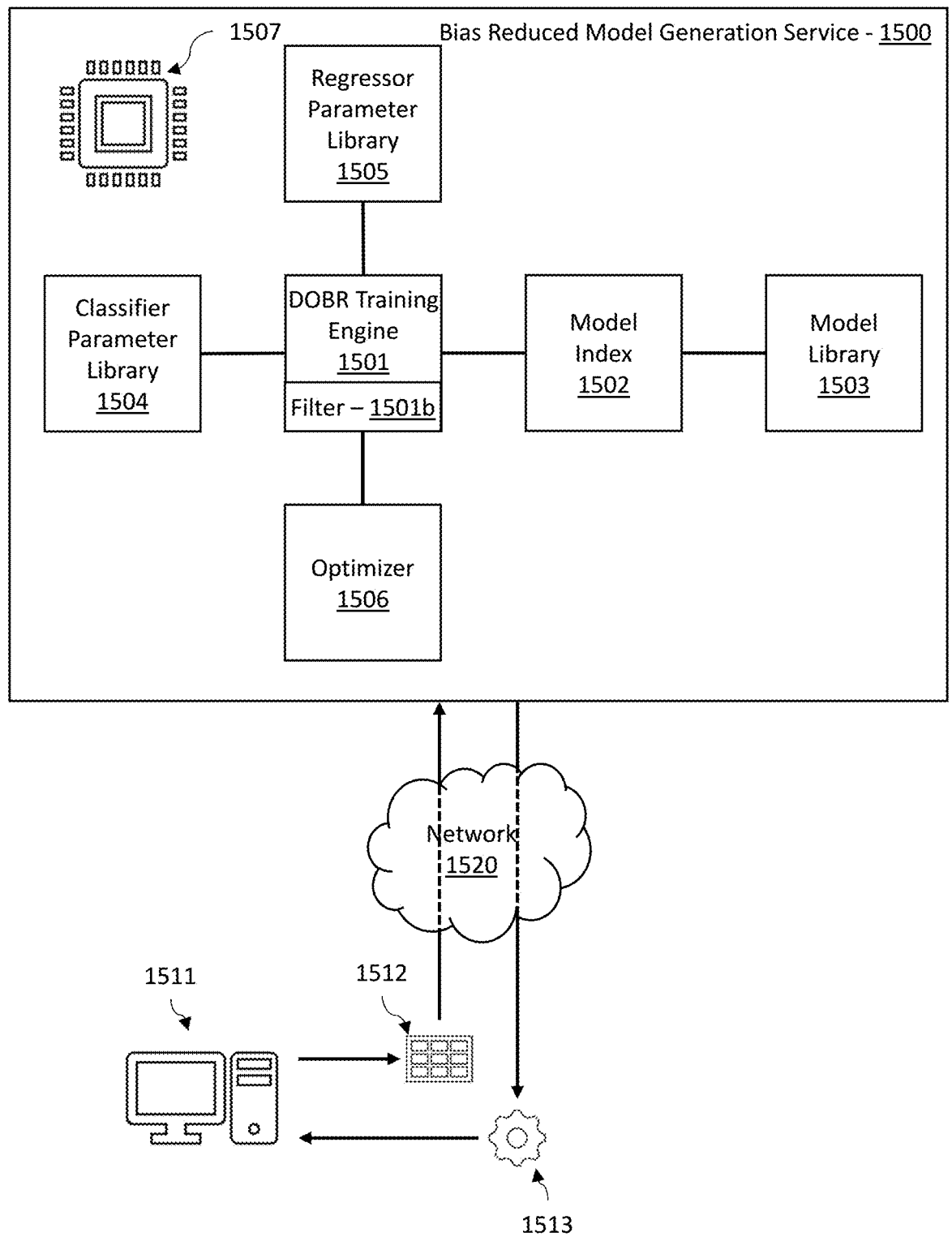
FIG. 15 illustrates a block diagram of an exemplary inventive bias reduced model generation service for machine learning model training and deployment in accordance with one or more embodiments of the present disclosure.

FIG. 15 illustrates a block diagram of an exemplary inventive bias reduced model generation service for machine learning model training and deployment in accordance with one or more embodiments of the present disclosure.

In some embodiments, a bias reduced model generation service 1500 may be implemented as Software-as-a-Service (SaaS) by including components for dynamic outlier bias reduction (DOBR) in training datasets for the training and deployment of one or more machine learning model(s). In some embodiments, DOBR provides an iterative process to remove outlier records subject to a pre-defined criterion. This condition is the user-defined error acceptance value expressed as a percentage. It refers to how much error the user is willing to accept in the model based potentially on their insights and other analysis results that will be described later in this discussion. A value of 100% signifies that all of the error is accepted and no records will be removed in the DOBR process. If 0% is chosen, then all of the records are removed. Generally, error acceptance values in the range of 80 to 95% have been observed for industrial applications.

In some embodiments, a user may interact with the bias reduced model generation service 1500 to initiate a request for a machine learning model. In some embodiments, the bias reduced model generation service 1500 may receive the request, train machine learning models based on the request and return to the user a trained machine learning model for use towards the user's purpose.

In some embodiments, the user may use a computing device 1511 to communicate with the bias reduced model generation service 1500, e.g., via a network 1520. In some embodiments the computing device 1511 may send a model request 1512 to the bias reduced model generation service 1500 to request a custom trained model. Accordingly, the model request 1512 may include requested model attributes, such as, e.g., the error acceptance value for DOBR dataset filtering, a model type (e.g., classification, object detection, natural language processor, data prediction, time-series prediction, computer vision, etc.), model memory limits, or any other requested model attributes or any combination thereof. In some embodiments, the model request 1512 may also include training data for the modelling task for which the custom trained model is to be used. For example, for a grid energy optimization model, the request may include a package of electrical power demand data according to, e.g., time of day, day of the week, day of the month, month of the year, season, weather, location, population density, among other electrical power demand data. For another example, for content and advertising recommendation models for surfacing online content to one or more users, the request may include a package of user engagement data including, e.g., click rates, click frequency, times spent on content, content location on page, content screen area, content type or classification, among other user engagement data, in combination with user data such as user characteristics, including e.g., browser, location, age, or other user characteristics or any combination thereof.

In some embodiments, the computing device 1511 may send the model request 1512 with the training data to the bias reduced model generation service 1500 over the network 1520 using any suitable electronic request. In some embodiments, the model request 1512 may be communicated to the bias reduced model generation service 1500 via, e.g., a suitable application programming interface (API), messaging protocol, or other communication technology. In some embodiments, the model request 1512 may be communicated across, e.g., a direct interface between the computing device 1511 and the bias reduced model generation service 1500 or across the network 1520 (such as a local area network (LAN), wide area network (WAN), Internet, intranet, or other network and combinations thereof), or a combination thereof. In some embodiments, the connection may include, e.g., hard wired connections (e.g., fiber optic cabling, coaxial cabling, copper wire cabling, ethernet, etc.), wireless connections (e.g., WiFi, Bluetooth, Zigbee, Z-Wave, cellular networking such as 5G, 4G, Long Term Evolution (LTE), 3G, High-Speed Downlink Packet Access (HSPA), Global System for Mobile Communications (GSM), Code-division multiple access (CDMA) or other technologies, and combinations thereof), or combination thereof.

administer the error acceptance value via a user input device 1508 and view results via a display device 1512, among other user interaction behaviors using the display device 1512 and user input device 1508. Based on the error acceptance value, the bias reduced model generation service 1500 may analyze a dataset 1511 received into a database 1510 or other storage in communication with the bias reduced model generation service 1500. The bias reduced model generation service 1500 may receive the dataset 1511 via the database 1510 or other storage device and make predictions using one or more machine learning models with dynamic outlier bias reduction for improved accuracy and efficiency.

In some embodiments, the bias reduced model generation service 1500 includes a combination of hardware and software components, including, e.g., storage and memory devices, cache, buffers, a bus, input/output (I/O) interfaces, processors, controllers, networking and communications devices, an operating system, a kernel, device drivers, among other components. In some embodiments, a processor 1507 is in communication with multiple other components to implement functions of the other components. In some embodiments, each component has time scheduled on the processor 1507 for execution of component functions, however in some embodiments, each component is scheduled to one or more processors in a processing system of the processor 1507. In other embodiments, each component has its own processor included therewith.

In some embodiments, components of the bias reduced model generation service 1500 may include, e.g., a DOBR training engine 1501 in communication with a model index 1502 and model library 1503, a regressor parameter library 1505, a classifier parameter library 1504 and a DOBR filter 1506, among other possible components. Each component may include a combination of hardware and software to implement component functions, such as, e.g., memory and storage devices, processing devices, communications devices, input/output (I/O) interfaces, controllers, networking and communications devices, an operating system, a kernel, device drivers, a set of instructions, among other components.

In some embodiments, the DOBR training engine 1501 includes a model engine for instantiating and executing machine learning models. The DOBR training engine 1501 may access models for instantiation in a model library 1503 through the use of a model index 1502. For example, the model library 1503 may include a library of machine learning models that may be selectively accessed and instantiated for use by an engine such as the DOBR training engine 1501. In some embodiments, the model library 1503 may include machine learning models such as, e.g., a support vector machine (SVM), a Linear Regressor, a Lasso model, Decision Tree regressors, Decision Tree classifiers, Random Forest regressors, Random Forest classifiers, K Neighbors regressors, K Neighbors classifiers, Gradient Boosting regressors, Gradient Boosting classifiers, among other possible classifiers and regressors.

In some embodiments, based on the model attributes of the model request 1512, the DOBR training engine 1501 may select a set of model architectures. For example, some models may be smaller than others, and thus based on a maximize size requirement in the model request 1512, the DOBR training engine 1501 may use the model index 1502 to identify model architectures in the model library 1503 conforming the maximize size requirement. Similarly, a model type or task type may be used to identify model architectures. For examples, the DOBR training engine 1501 may select a set of model architectures listed for use with classification tasks, regression tasks, time-series prediction tasks, computer vision tasks, or any other task.

Accordingly, in some embodiments, to facilitate access to the library of machine learning models in the model library 1503, the DOBR training engine 1501 may employ the model index 1502. In some embodiments, the model index 1502 may index each model with reference to a model identifier, a model type, a set of task types, a memory footprint, among other model architecture characteristics.

For example, models including, e.g., Linear Regression, XGBoost Regression, Support Vector Regression, Lasso, K Neighbors Regression, Bagging Regression, Gradient Boosting Regression, Random Forest Regression, Decision Tree Regression, among other regression models and classification models, may be indexed by a number identifier and labeled with a name.

In some embodiments, the software instructions are stored within a memory of the respective model library 1503 or model index 1502 and buffered in a cache for provision to the processor 1507. In some embodiments, the DOBR training engine 1501 may utilize the model index 1502 by accessing or calling the index via communications and/or I/O devices, the use the index to call models as functions from the model library 1503 via communications and/or I/O devices.

In some embodiments, to facilitate optimization and customization of the models called by the DOBR training engine 1501, the bias reduced model generation service 1500 may record model parameters in, e.g., memory or storage, such as, e.g., hard drives, solid state drives, random access memory (RAM), flash storage, among other storage and memory devices. For example, regressor parameters may be logged and adjusted in a regressor parameter library 1505. Thus, the regressor parameter library 1505 may include storage and communication hardware configured with sufficient memory and bandwidth to store, adjust and communicate a multitude of parameters for multiple regressors, e.g., in real time. For example, for each regression machine learning model instantiated by the DOBR training engine 1501, respective parameters may be initialized and updated in the regressor parameter library 1505. In some embodiments, a user, via the model request 1512 from the computing device 1511, may establish an initial set of parameters in addition to the training data. However, in some embodiments, the initial set of parameters may be predetermined or stochastic (e.g., randomly initialized). Upon instantiation of a regression machine learning model, the DOBR training engine 1501 may correlate a model selected from the model index 1502 to a set of parameters in the regressor parameter library 1505. For example, the DOBR training engine 1501 may call a set of parameters according to, e.g., an identification (ID) number associated with a given regression model.

Similarly, in some embodiments, classifier parameters may be logged and adjusted in a classifier parameter library 1504. Thus, the classifier parameter library 1504 may include storage and communication hardware configured with sufficient memory and bandwidth to store, adjust and communicate a multitude of parameters for multiple classifiers, e.g., in real time. For example, for each classification machine learning model instantiated by the DOBR training engine 1501, respective parameters may be initialized and updated in the classifier parameter library 1504. In some embodiments, a user, via the user input device 1508, may establish an initial set of parameters. However, in some embodiments, the initial set of parameters may be predetermined or stochastic (e.g., randomly initialized). Upon instantiation of a classification machine learning model, the DOBR training engine 1501 may correlate a model selected from the model index 1502 to a set of parameters in the classifier parameter library 1504. For example, the DOBR training engine 1501 may call a set of parameters according to, e.g., an identification (ID) number associated with a given regression model.

In some embodiments, by calling and receiving a set of models from a model library 1503 via the model index 1502 and respective parameters from the regressor parameter library 1505 and/or the classifier parameter library 1504, the DOBR training engine 1501 may load one or more instantiated and initialized models, e.g., into a cache or buffer of the DOBR training engine 1501. In some embodiments, the training dataset may be ingested from the model request 1512, and the DOBR training engine 1501 may train each model in the set of models using the iterative DOBR training procedure.

In some embodiments, for example, the processor 1507 or a processor in the DOBR training engine 1501 may utilize each model to transform the training dataset into, e.g., a respective prediction of, for example, a predicted grid electrical power demand based on each input datapoint of, e.g., time of day, day of the week, day of the month, month of the year, season, weather, location, population density, among other electrical power demand data. The predicted outputs may be compared against the actual power demand of the training dataset.

Similarly, for example, the DOBR training engine 1501 may train the set of models to model user engagement according to content attributes based on the training dataset of the model request 1512. For example, the set of models may be used to predict a predicted user engagement based on inputs from the training dataset including, e.g., e.g., content location on page, content screen area, content type or classification, among other user engagement data, in combination with user data such as user characteristics, including e.g., browser, location, age, or other user characteristics or any combination thereof. The predicted user engagement may then be compared to the actual user engagement for each input according to the training dataset based on user engagement metrics such as, e.g., click rates, click frequency, times spent on content, among other user engagement metrics or any combination thereof However, in some embodiments, outliers in the training dataset from the model request 1512 may reduce the accuracy of the implemented models, thus increasing the number of training iterations to achieve an accurate set of parameters for a given model in a given application. To improve accuracy and efficiency, the DOBR training engine 1501 may include a DOBR filter 1501b to dynamically test data point errors in the training dataset to determine outliers. Thus, outliers may be removed to provide a more accurate or representative of the training dataset from the model request 1512. In some embodiments the DOBR filter 1501b may provide an iterative mechanism for removing outlier data points subject to a pre-defined criterion, e.g., the user-define error acceptance value described above and provided, e.g., by a user via the user input device 1508. In some embodiments, the user-defined error acceptance value expressed as a percentage where, e.g., a value of 100% signifies that all of the error is accepted and no data points will be removed by the filter 1501b, while a value of, e.g., 0% results in all of the data points being removed. In some embodiments, the filter 1501b may be configured with an error acceptance value in the range of between, e.g., about 80% and about 95%.

In some embodiments, the DOBR filter 1501b works in conjunction with an optimizer 1506, which is configured to determine error and optimize parameters for each model in the regressor parameter library 1505 and the classifier parameter library 1504. Thus, in some embodiments, the optimizer 1506 may determine model and communicate the error to the filter 1501b of the DOBR training engine 1501. Thus, in some embodiments, the optimizer 1506 may include, e.g., storage and/or memory devices and communication devices with sufficient memory capacity and bandwidth to receive the dataset 1511 and model predictions and determine, e.g., outliers, convergence, error, absolute value error, among other error measures.

In some embodiments, the DOBR training engine 1501 selects and trains multiple models using the DOBR filter 1501b and the training dataset from the model request 1512, the DOBR training engine 1501 may compare error rates between each model in a last iteration of training. Thus, the DOBR training engine 1501 may check each model for a lowest error rate using an outlier reduced dataset of the training dataset. The model having the lowest error may be considered the highest performing model, and thus may be selected for deployment. In some embodiments, the DOBR training engine 1501 may select a set of models including only one model. In such a scenario, the DOBR training engine 1501 can skip the step for comparing error rates and use the one model for deployment.

In some embodiments, to facilitate deployment, the bias reduced model generation service 1500 may return the selected model, trained using the filter 1501b for dynamic outlier bias reduced training, to the computing device 1511 as a production ready model 1513. In some embodiments, the production ready model 1513 may include the model architecture selected according to the model request 1512 and the trained parameters for the model. Thus, in some embodiments, the bias reduced model generation service 1500 may provide a SaaS solution for on demand training and deployment of machine learning models, custom selected and trained for a user's particular task and/or production environment. Thus, a user may simply develop artificially intelligent software products without needing to building the machine learning model from scratch. Moreover, the use of DOBR improves on the accuracy and efficiency of model training by dynamically removing outliers from the supplied training dataset to reduce bias and error in the model.

Outlier Dataset Analytics

Figure 16A:
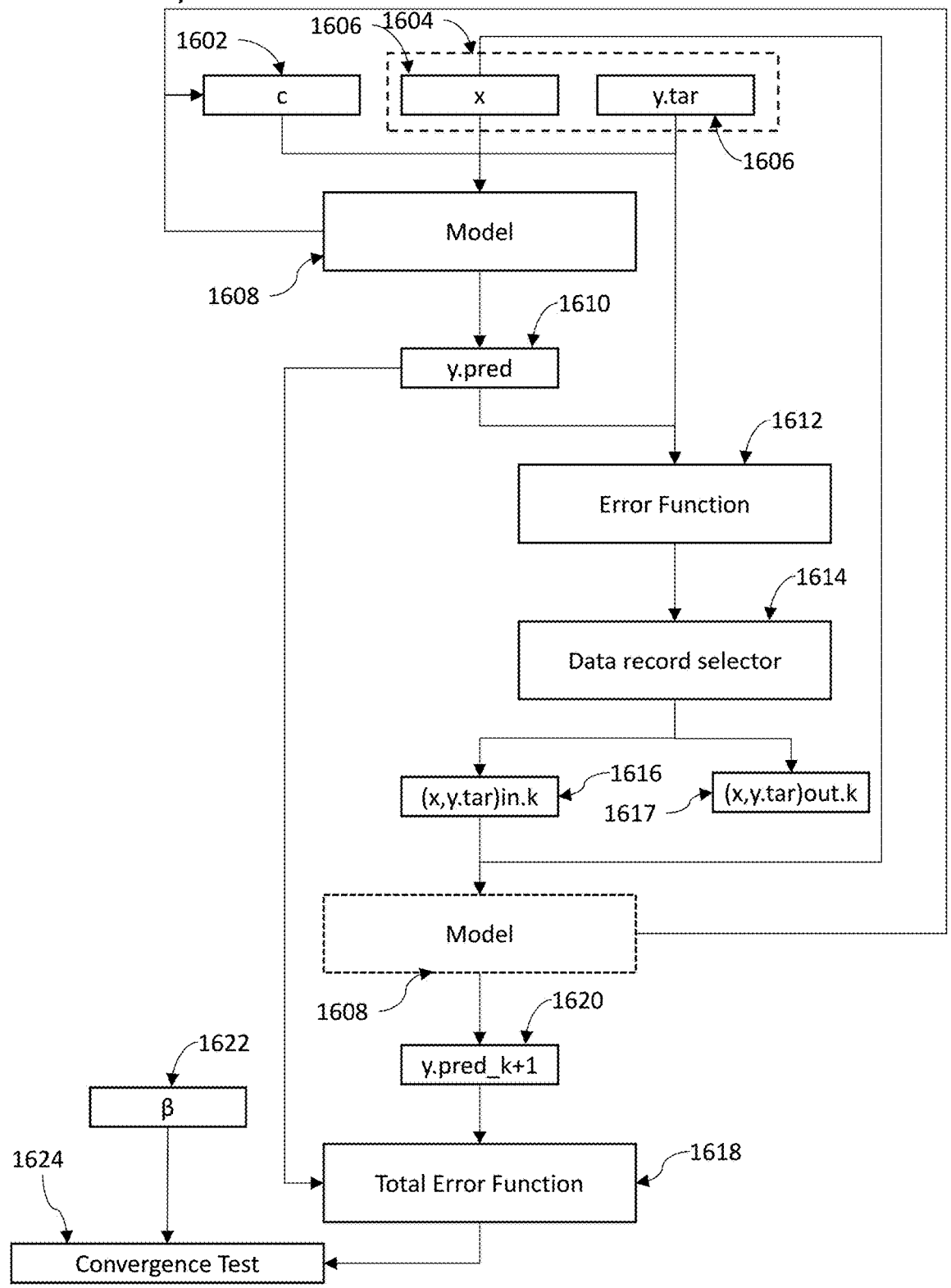
FIGS. 16A and 16B depict a dynamic outlier bias reduction for outlier dataset modelling according to an illustrative methodology in accordance with one or more embodiments of the present disclosure.
Figure 16B:
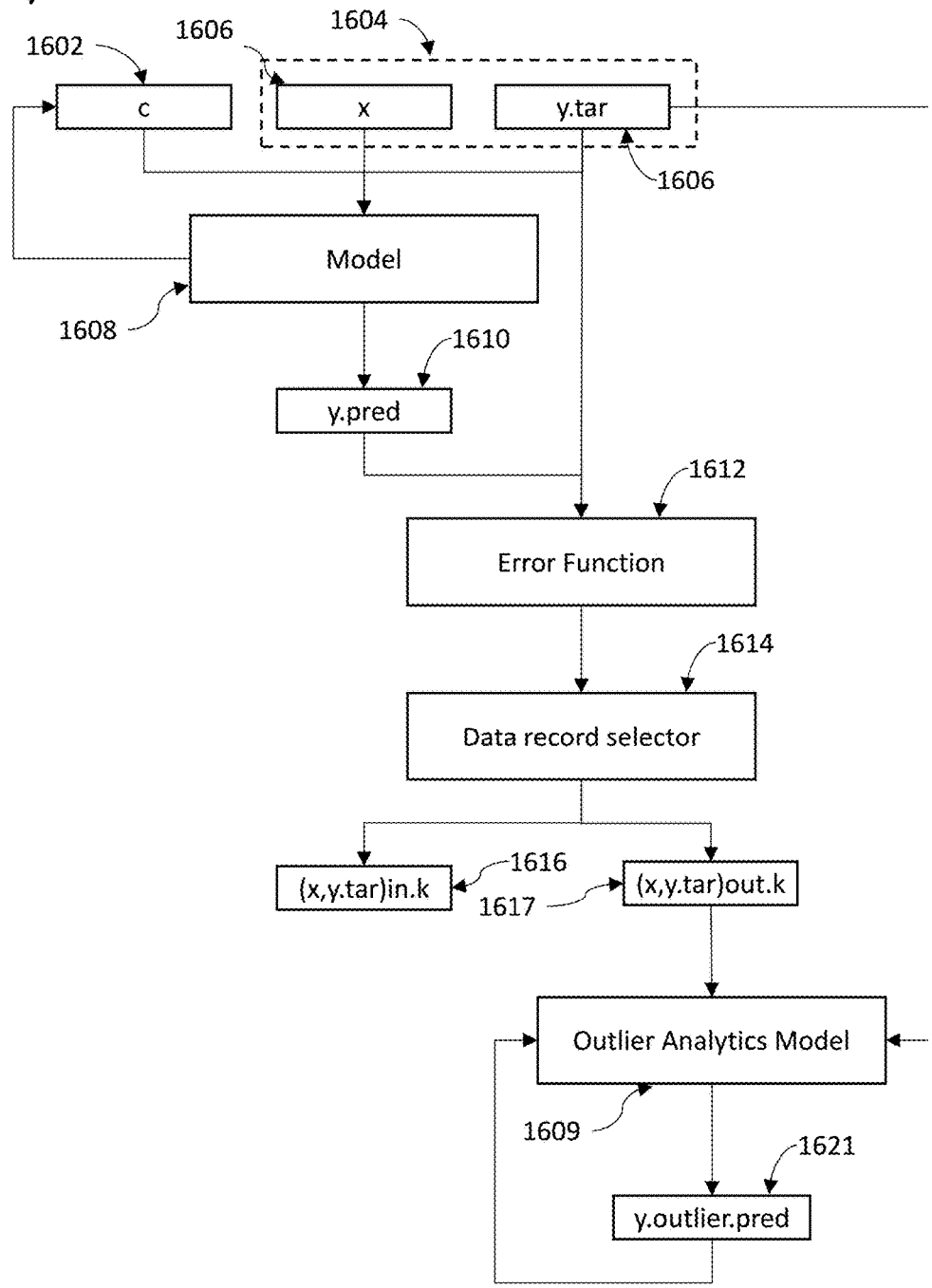

FIGS. 16A and 16B depict a dynamic outlier bias reduction for outlier dataset modelling according to an illustrative methodology in accordance with one or more embodiments of the present disclosure.

In some embodiments, one or more models can be trained to predict an output according to a given input x 1606. In some embodiments, DOBR, such as the DOBR training engine 1501 and filter 1501b described above, provides an iterative process to remove outlier records subject to a pre-defined criterion. This condition is the user-defined error acceptance value expressed as a percentage. It refers to how much error the user is willing to accept in the model based potentially on their insights and other analysis results that will be described later in this discussion. A value of 100% signifies that all of the error is accepted and no records will be removed in the DOBR process. If 0% is chosen, then all of the records are removed. Generally, error acceptance values in the range of 80 to 95% have been observed for industrial applications.

In some embodiments, as described, bias reduction through the iterative and dynamic outlier reduction in training machine learning models may provide efficient and powerful training for more accurate machine learning models. In some embodiments, in addition to modelling an outlier reduced dataset, machine learning models as well as other analytic models may be applied to the outlier dataset. Such modelling of the outlier dataset may yield insight into abnormal situations such as extreme events, externalities, anomalies, and root causes of such abnormal situations.

In some embodiments, outlier analysis using DOBR may include pre-analysis where the error acceptance criterion ($\propto$) is selected, such as $\propto=80\%$. In some embodiments, the error acceptance criterion, $C(\propto)$ may be defined according to, e.g., equation 1 as described above. In some embodiments, while other functional relationships may be used to set $C(\alpha)$, the percentile function is an intuitive guide in understanding why the model includes or excludes certain data records, such as equation 2 as described above. Since the DOBR procedure is iterative, in an embodiment, a convergence criterion may be defined, such as, e.g., 0.5%.

In an embodiment, given a dataset $\{x, y_{tar}\}$ 1604, a solution model M 1608, and an error acceptance criterion $\propto$ 1624, DOBR can be implemented to reduce bias in training the model M 1608. In some embodiments, the solution model M 1608 is implemented by a model engine, including, e.g., a processing device and a memory and/or storage device. According to an embodiment, the exemplary methodology computes model coefficients, M(c) 1602 and model estimates $\{y_{pred}\}$ 1610 for all records applying the solution model, M 1608, to the complete input dataset $\{x, y_{tar}\}$ 1604 according to, e.g., equation 3 as described above.

Then, according to an illustrative embodiment, a total error function 1618 computes initial model total error $e_0$ according to, e.g., equation 16 as described above. In some embodiments, the total model error may include a model prediction error aggregating individual errors of the prediction of each datapoint in the total dataset. Accordingly, the error function 1612 may also compute model errors according to, e.g., equation 5 as described above.

In some embodiments, the model errors are employed to determine a data record selection vector $\{I_k\}$ according to, e.g., equation 6 as described above. In some embodiments, the data record section vector may include a binary classification based on a percentile of each model error for each data record in a distribution of the model errors. In some embodiments, the data record selection vector includes a percentile threshold, above which data records are classified as outliers, and equal to or below which data records are classified as non-outliers. According to an illustrative embodiment, the error function 1612 computes a new data record selection vector $\{I_k\}$ according to, e.g., equation 6 as described above to define the outlier dataset 1617 and the non-outlier dataset 1616. According to an illustrative embodiment, a data record selector 1614 computes the non-outlier data records to be included in model computation by selecting only records where the record selection vector is equal to 1, according to, e.g., equation 7 as described above.

Then, according to an illustrative embodiment, the model 1608 with the latest coefficients 1602 computes new predicted values 1620 and model coefficients 1602 from the DOBR selected data records 1616 according to, e.g., equation 8 as described above.

Then, according to an illustrative embodiment, the model 1608 using the new model coefficients, compute new prediction values 1620 for the complete dataset. This step reproduces computing the predicted values 1620 for the DOBR selected records in the formal steps, but in practice the new model can be applied to just the DOBR removed records according to, e.g., equation 9 as described above. Then, according to an illustrative embodiment, the total error function 1618 computes model total error according to, e.g., equation 10 as described above.

Then, according to an illustrative embodiment, a convergence test 1624 tests model convergence according to, e.g., equation 11 described above using the convergence criteria 1622 (β), such as, e.g., 0.5%. In some embodiments, the convergence test 1624 may terminate the iterative process if, for example, the percent error is less than, e.g., 0.5%. Otherwise, the process may return to the initial dataset 1604.

In some embodiments, the outlier analytics model 1609 may also utilize current coefficients to computes new predicted outlier values 1621 and outlier model coefficients from the outlier dataset 1617 according to, e.g., equation 8 as described above. In some embodiments, similar to the model 1608, the outlier analytics model 1609 may updated at each iterative step in dynamic outlier bias reduction. In some embodiments, the outlier analytics model 1609 may be trained after the all iterative steps in dynamic outlier bias reduction have been completed and convergence on the convergence criteria 1622 has occurred for the model 1608. Thus, the outlier analytics model 1609 may be trained against outlier data records to model bias-inducing outliers.

In some embodiments, the outlier analytics model 1609 may include, e.g., a suitable machine learning model for modelling the outlier data records, such as, e.g., a regression model or a classifier model. For example, the outlier analytics model 1609 may include, e.g., Decision Trees, Random forest, Naïve Bayes, K-Nearest Neighbor, Support vector machine, Neural network (convolutional neural network and/or recurrent neural network), or any other model or any combination thereof. In some embodiments, by training the outlier analytics model 1609 with the outlier data records, the outlier analytics model 1609 may ingest new data records to determine a likelihood of outlier behavior. For example, extreme weather events may be predicted based on weather condition inputs provided to the outlier analytics model 1609 trained on outlier weather events. Accordingly, the outlier analytics model 1609 may include a binary classifier model to classify data records as either a likely outlier or not a likely outlier based on a predicted probability value. In some embodiments, where the predicted probability value exceeds a threshold probability value, the associated data records may be classified as a likely outlier. Such predictions may be used to inform predictions by the model 1608 or other analyses based on the associated data record.

In some embodiments, rather than a machine learning model, the outlier analytics model 1609 may include a statistical model for characterizing, e.g., a frequency of outliers under given conditions, a ratio of the frequency of outliers to the frequency of non-outliers under given conditions, or other charactization. In some embodiments, the frequencies and/or ratios may be based on, e.g., average values of the data records for the given conditions, median values of the data records for the given conditions, or other statistical aggregation for of the data records under given conditions.

For example, the outlier data records 1617 may be clustered according to a clustering model of the outlier analytics model 1609, such as, e.g., k-means clustering, distribution modelling (e.g., Bayesian distributions, mixture modeling, Gaussian modelling, etc.) or other cluster analysis or any combination thereof. As a result, the outlier analytics model 1609 may group outlier data records 1617 together according to similarities for use in, e.g., root cause analysis or other analyses or any combination thereof.

DOBR for Grid Energy Optimization

Figure 17A:
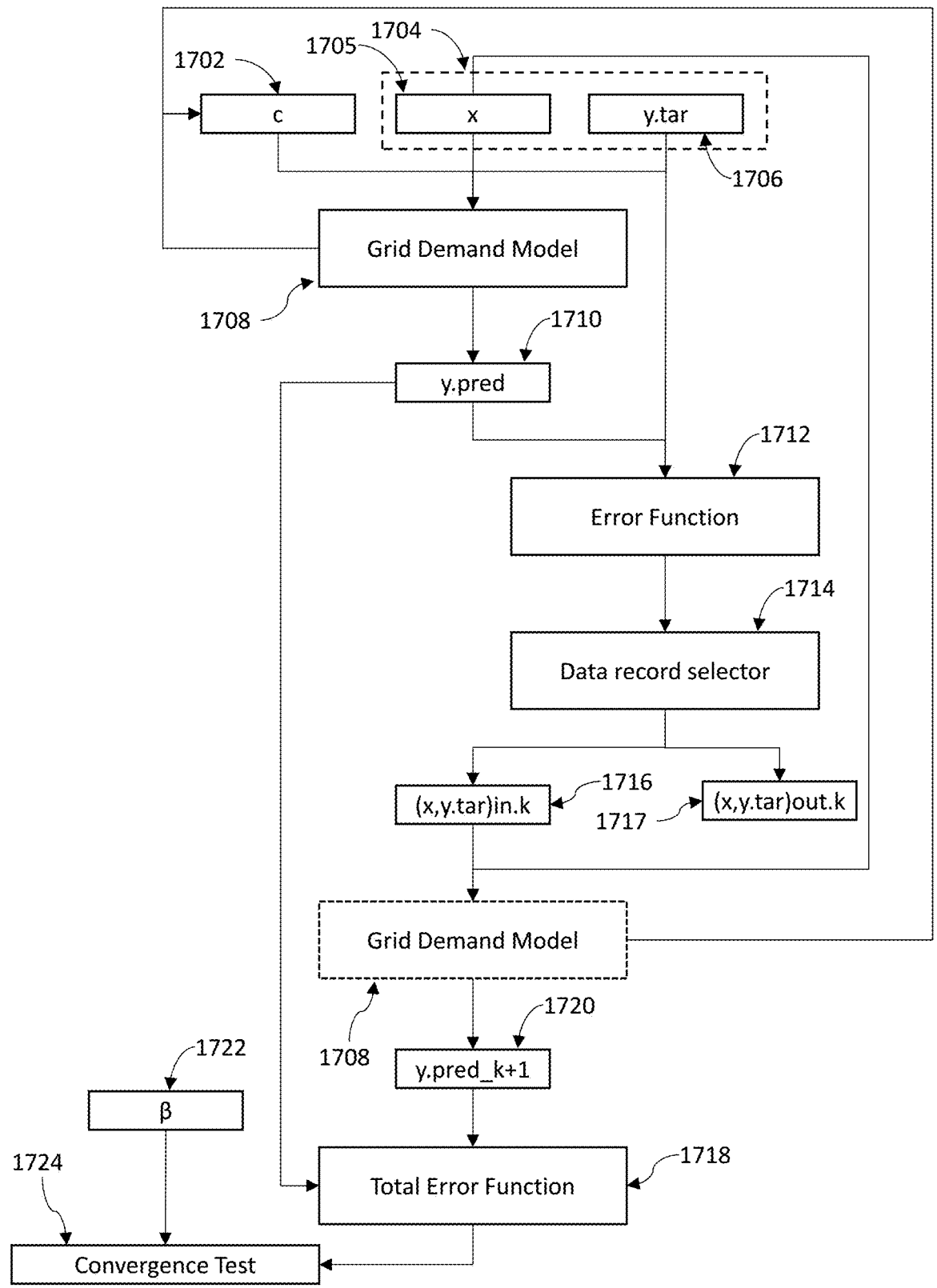
FIGS. 17A through 17C depict a dynamic outlier bias reduction for grid energy demand prediction and energy supply optimization according to an illustrative methodology in accordance with one or more embodiments of the present disclosure.
Figure 17B:
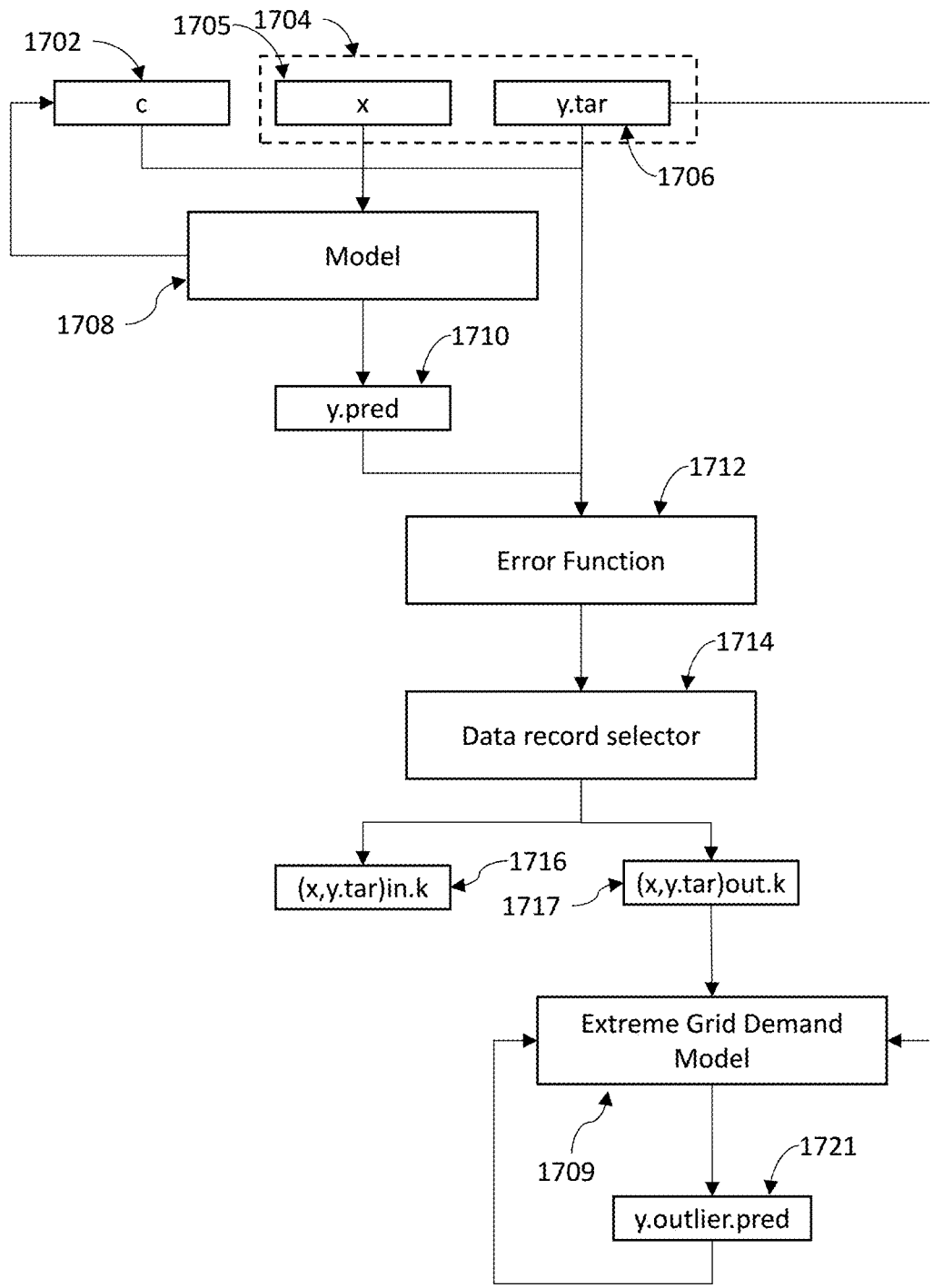
Figure 17C:
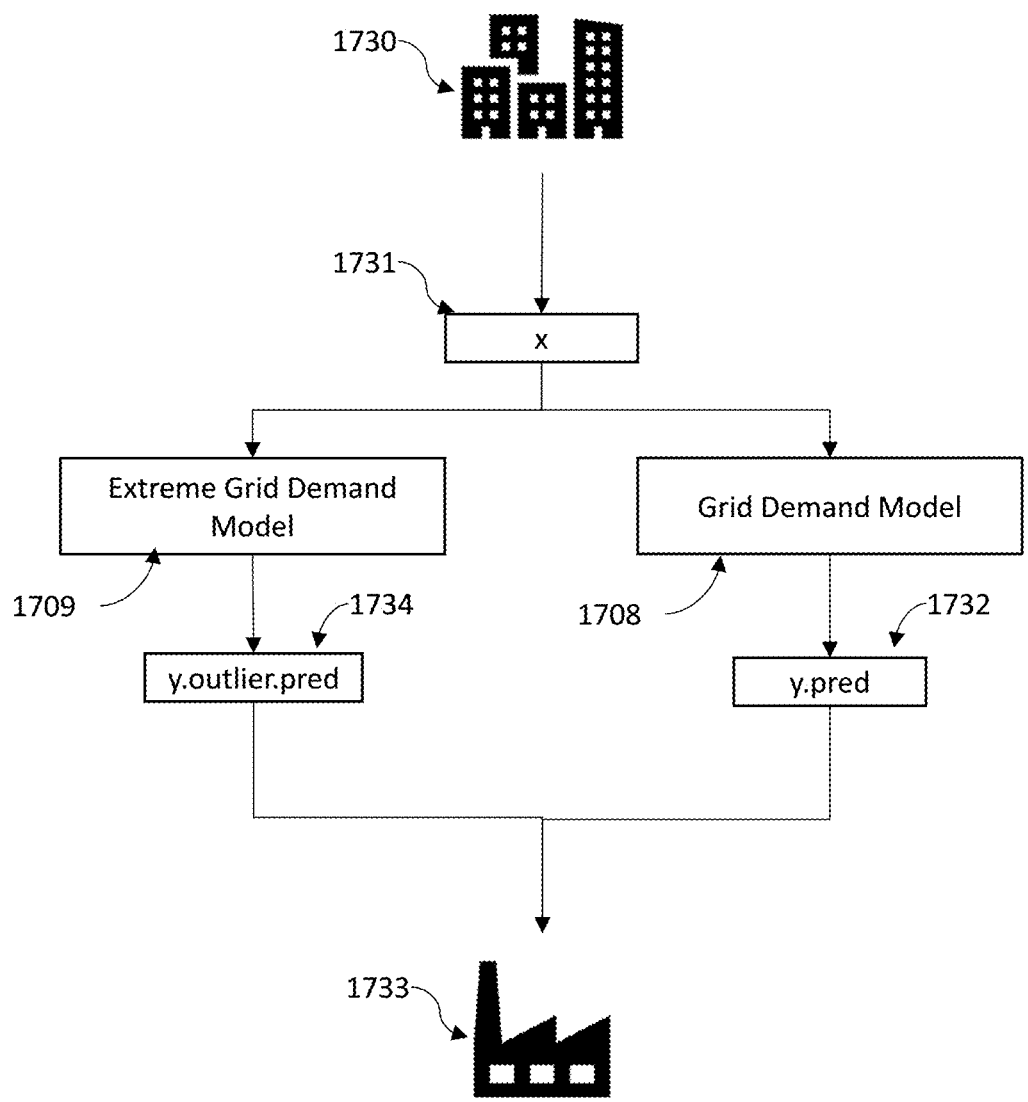

FIGS. 17A through 17C depict a dynamic outlier bias reduction for grid energy demand prediction and energy supply optimization according to an illustrative methodology in accordance with one or more embodiments of the present disclosure.

In some embodiments, one or more models can be trained to predict an output according to a given input x 1706. In some embodiments, DOBR, such as the DOBR training engine 1501 and filter 1501b described above, provides an iterative process to remove outlier records subject to a pre-defined criterion. This condition is the user-defined error acceptance value expressed as a percentage. It refers to how much error the user is willing to accept in the model based potentially on their insights and other analysis results that will be described later in this discussion. A value of 100% signifies that all of the error is accepted and no records will be removed in the DOBR process. If 0% is chosen, then all of the records are removed. Generally, error acceptance values in the range of 80 to 95% have been observed for industrial applications.

In some embodiments, as described, bias reduction through the iterative and dynamic outlier reduction in training machine learning models may provide efficient and powerful training for more accurate machine learning models. In some embodiments, in addition to modelling an outlier reduced dataset, machine learning models as well as other analytic models may be applied to the outlier dataset. Such modelling of the outlier dataset may yield insight into abnormal situations such as extreme events, externalities, anomalies, and root causes of such abnormal situations.

Referring to FIG. 17A, in some embodiments, a grid energy demand model 1708 may be trained to predict grid energy demand for power supply and storage optimization. An excess of electrical power supply produced by a power generation facility may go unutilized, thus wasting the material, resources and money needed to supply the energy. However, a deficiency in electrical power supply may have drastic consequences including blackouts and brownouts that may limited to a given area or may be more widespread depending on the degree of the deficiency. Thus, the grid demand model 1708 is advantageously trained to more accurately predict energy demand can provide improvements to power supply management and optimization to improve resource utilization efficiency and reduce power outages.

Accordingly, in some embodiments, a DOBR model training process, e.g., by the DOBR training engine 1501 described above, may be supplied with grid energy demand training data 1704 to train the grid demand model 1708 without outlier bias. In some embodiments, the training data may include historical energy data records, where each record has an independent variable 1705 and a target output variable 1706.

In some embodiments, independent variable 1706 may include grid condition data, such as, e.g., time of day, day of the week, day of the month, month of the year, season, weather, location, population density, among other electrical power demand data and grid condition data. In some embodiments, the target output variable 1706 of each data record may include, e.g., grid electrical power demand over a given period or at a given time. In some embodiments, the given period or given time may include, e.g., an instantaneous date and time, a period of a day, such as, e.g., morning, afternoon, night, two hour periods of the day, three hour periods of the day, four hour periods of the day, six hour periods of the day, eight hour periods of the day, twelve hour periods of the day, day of the week, day of the month, month of the year, or any other period for which to assess grid energy demand.

In some embodiments, outlier analysis using DOBR may include pre-analysis where the error acceptance criterion (∝) 1702 is selected, such as ∝=80%. In some embodiments, the error acceptance criterion, $C(\infty)$ may be defined according to, e.g., equation 1 as described above. In some embodiments, while other functional relationships may be used to set $C(\alpha)$, the percentile function is an intuitive guide in understanding why the model includes or excludes certain data records, such as equation 2 as described above. Since the DOBR procedure is iterative, in an embodiment, a convergence criterion 1724 may be defined, such as, e.g., 0.5%.

In some embodiments, each data record of the grid energy demand training data 1704 may be provided to the grid demand model 1708 to generate a predicted output variable 1710 for each independent variable 1705. In some embodiments, the target output variable 1706 and the predicted output variable 1710 may include a grid demand level, such as, e.g., a kilowatt (kW), gigawatt (GW), a terawatt (TW) or other unit of electrical power. Accordingly, to learn and predict outputs according to the grid conditions data of the independent variable 1705, the grid demand model 1708 may employ a suitable regression machine learning model. For example, the grid demand model 1708 may include, e.g., Ridge regression, Lasso regression, Decision Tree, Random forest, K-Nearest Neighbor, Support vector machine, Neural network (recurrent neural network), or any other suitable regression model or any combination thereof. In some embodiments, DOBR can be implemented to reduce bias in training the grid demand model M 1708 to more accurately predict future grid demand levels without outlier bias.

In some embodiments, the grid demand model M 1708 is implemented by a model engine, including, e.g., a processing device and a memory and/or storage device. According to an embodiment, the exemplary methodology computes model coefficients, M(c) 1702 and model estimates $\{y_{pred}\}$ 1710 for all records applying the grid demand model M 1708, to the complete input dataset $\{x, y_{tar}\}$ 1704 according to, e.g., equation 3 as described above.

Then, according to an illustrative embodiment, a total error function 1718 computes initial model total error $e_0$ according to, e.g., equation 17 as described above. In some embodiments, the total model error may include a model prediction error aggregating individual errors of the predicted grid demand level compared to the target grid demand level of the target output variable 1706 for each independent variable 1705. Accordingly, the error function 1712 may also compute model errors according to, e.g., equation 5 as described above.

In some embodiments, the model errors are employed to determine a data record selection vector $\{I_k\}$ according to, e.g., equation 6 as described above. In some embodiments, the data record section vector may include a binary classification based on a percentile of each model error for each data record in a distribution of the model errors. In some embodiments, the data record selection vector includes a percentile threshold, above which data records are classified as outliers, and equal to or below which data records are classified as non-outliers. According to an illustrative embodiment, the error function 1712 computes a new data record selection vector $\{I_k\}$ according to, e.g., equation 6 as described above to define the outlier dataset 1717 and the non-outlier dataset 1716. According to an illustrative embodiment, a data record selector 1714 computes the non-outlier data records to be included in model computation by selecting only records where the record selection vector is equal to 1, according to, e.g., equation 7 as described above.

Then, according to an illustrative embodiment, the grid demand model 1708 with the latest coefficients 1702 computes new predicted grid demand values 1720 and model coefficients 1702 from the DOBR selected data records 1716 according to, e.g., equation 8 as described above.

Then, according to an illustrative embodiment, the grid demand model 1708 using the new model coefficients, compute new grid demand values 1720 for the complete dataset. This step reproduces computing the new grid demand values 1720 for the DOBR selected records in the formal steps, but in practice the new model can be applied to just the DOBR removed records according to, e.g., equation 9 as described above. Then, according to an illustrative embodiment, the total error function 1718 computes model total error according to, e.g., equation 10 as described above.

Then, according to an illustrative embodiment, a convergence test 1724 tests model convergence according to, e.g., equation 11 described above using the convergence criteria 1722 ($\beta$), such as, e.g., 0.5%. In some embodiments, the convergence test 1724 may terminate the iterative process if, for example, the percent error is less than, e.g., 0.5%. Otherwise, the process may return to the initial dataset 1704.

In some embodiments, to facilitate power supply determinations, a risk of an extreme power requirement due to external factors may be determined through an analysis of the outlier dataset resulting from the end of the DOBR process. In some embodiments, as shown in FIG. 17C, an extreme grid demand model 1709 may be trained on the outlier grid demand dataset 1717 determined by the data record selector 1714. In some embodiments, the extreme grid demand model 1709 is trained to ingest an independent variable 1705 of the outlier dataset 1717 and predict a risk 1721 of an extreme grid demand condition. For example, in some embodiments, certain conditions may be correlated with increased risk of outlier data that constitutes abnormally high or abnormally low grid demand as defined by the outlier data record selector 1714.

In some embodiments, the extreme grid demand model 1709 may utilize the target variable 1706 of the training data set 1704 to determine an error of the predicted risk 1721 and updated model coefficients for the extreme grid demand model 1709. Thus, the extreme grid demand model 1709 may be trained to predict a degree of risk of an extreme grid demand level.

In some embodiments, referring to FIG. 17B, a new grid condition data record 1731 can be measured for a power grid 1730. For example, in some embodiments, the grid condition data record 1731 may include, e.g., e.g., time of day, day of the week, day of the month, month of the year, season, weather, location, population density, among other electrical power demand data characterizing the power grid 1730.

In some embodiments, according to the model coefficients resulting from the termination of the iterative DOBR process, the grid demand model 1708 may predict a future demand level 1732. For example, in some embodiments, the prediction may include, e.g., a grid demand level over a next hour, two hours, three hours, four hours, six hours, eight hours, twelve hours, twenty four hours, two days, week, two weeks, month, or other prediction period. Accordingly, the grid demand model 1708 may produce a future projected grid demand level.

In some embodiments, the extreme grid demand model 1709 may also receive the new grid condition data record 1731 measured for the power grid 1730. In some embodiments, the extreme grid demand model 1709 may ingest the grid condition data record 1731 and produce a prediction of an extreme grid demand risk 1734, such as, e.g., a probability of value of an extreme grid condition occurring based on the training on outlier demand levels according to grid conditions.

In some embodiments, a power generation facility 1733 may receive the projected grid demand level 1732 and the extreme grid demand risk 1734 to optimize power generation. In some embodiments, the power generation facility 1733 may dynamically scale power generation and power storage to compensate for projected increases or decreases in the demand. In some embodiments, the dynamic scaling may include an optimization function that minimizes power generation surplus while minimizing a risk of power generation deficiency. For example, the power generation facility 1733 may balance a cost of a surplus against a frequency or extent of a deficiency, thus ensuring that adequate power is generated without wasting resources. In some embodiments, the power generation facility 1733 may further adjust dynamic scaling where the extreme grid demand risk 1734 is high, such as, e.g., above 50%, above 60%, above 75% or other suitable threshold risk. For example, the power generation facility 1733 may generate and store an additional buffer of electrical power (e.g., using batteries or other power storage mechanism) where the risk of an extreme demand event is high. As a result, the power generation facility 1733 may improve grid power supply management to reduce the risk of a power deficiency while also reducing resource inefficiencies.

DOBR for User Engagement with Recommended Content

Figure 18A:
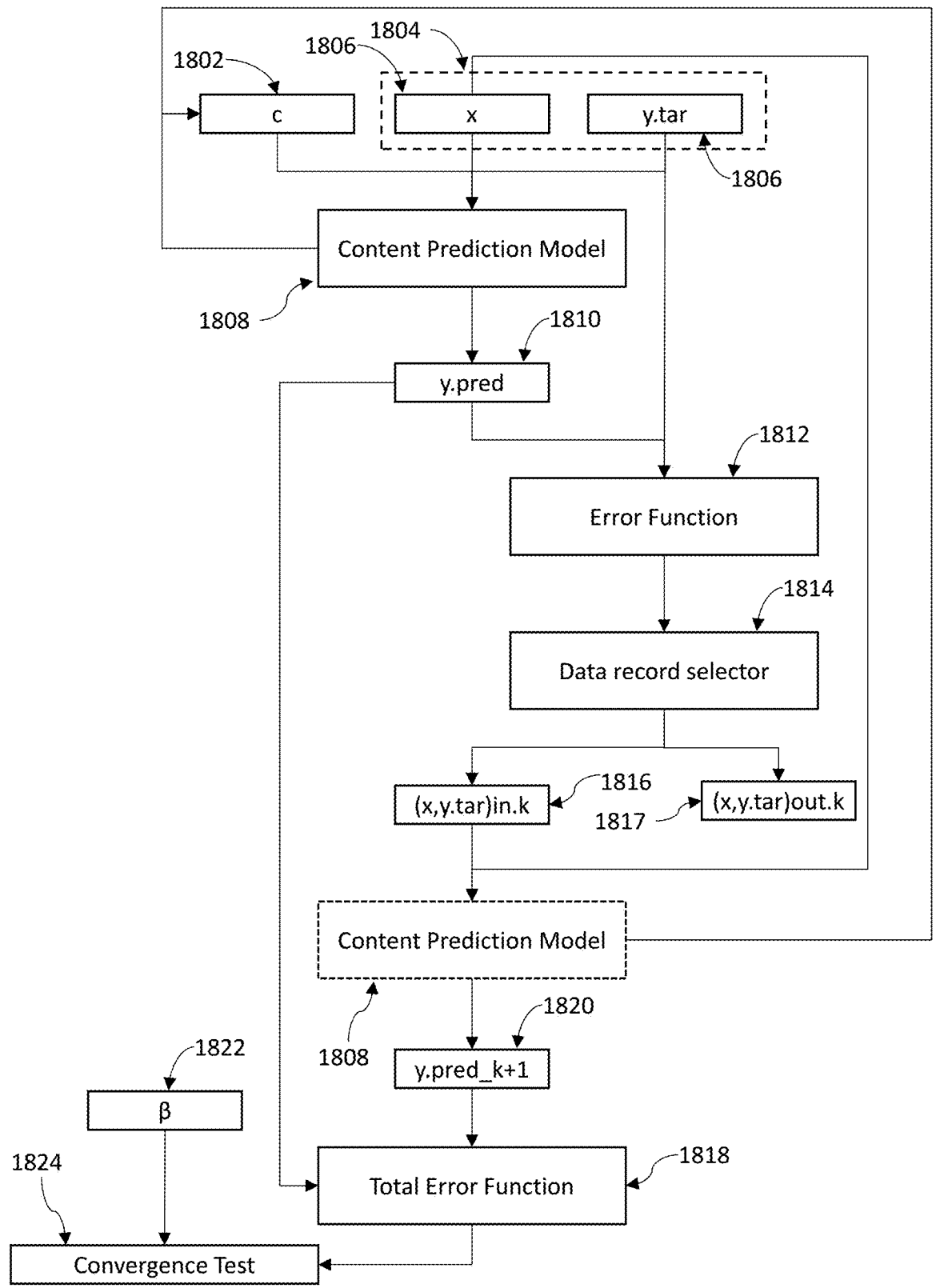
FIGS. 18A and 18B depict a dynamic outlier bias reduction for user engagement-optimized content recommendation prediction according to an illustrative methodology in accordance with one or more embodiments of the present disclosure.
Figure 18B:
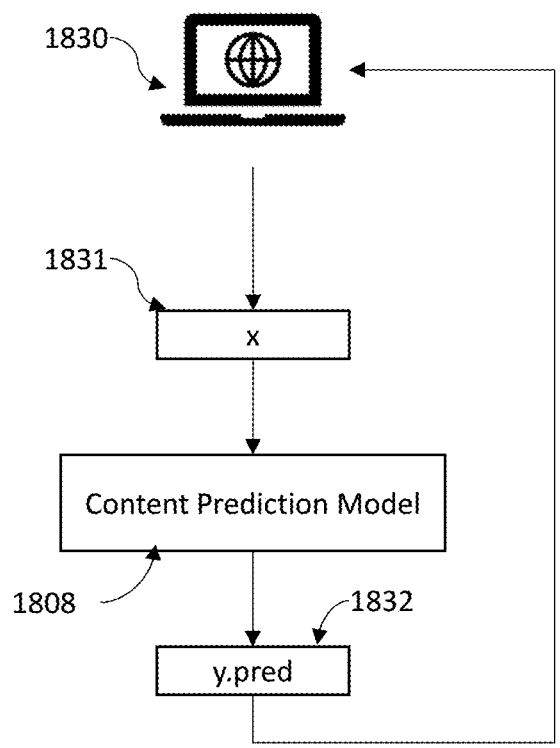

FIGS. 18A and 18B depict a dynamic outlier bias reduction for user engagement-optimized content recommendation prediction according to an illustrative methodology in accordance with one or more embodiments of the present disclosure.

In some embodiments, one or more models can be trained to predict an output according to a given input x 1706. In some embodiments, DOBR, such as the DOBR training engine 1501 and filter 1501b described above, provides an iterative process to remove outlier records subject to a pre-defined criterion. This condition is the user-defined error acceptance value expressed as a percentage. It refers to how much error the user is willing to accept in the model based potentially on their insights and other analysis results that will be described later in this discussion. A value of 100% signifies that all of the error is accepted and no records will be removed in the DOBR process. If 0% is chosen, then all of the records are removed. Generally, error acceptance values in the range of 80 to 95% have been observed for industrial applications.

In some embodiments, referring to FIG. 18A, bias reduction through the iterative and dynamic outlier reduction in training machine learning models may provide efficient and powerful training for more accurate machine learning models. For example, in some embodiments, a content prediction model 1808 may be trained to predict content recommendations and/or content placement to users of computing devices and software applications. For example, internet advertisements may be placed on a web page being browsed by a user according to advertising content, or media content may be recommended in a media streaming application. The content predictions may be trained according to optimization of user engagement with content during a browsing session. Thus, the content prediction model 1808 is advantageously trained to more accurately predict content recommendations and placement for greater user engagement.

Accordingly, in some embodiments, a DOBR model training process, e.g., by the DOBR training engine 1501 described above, may be supplied with user engagement training data 1804 to train the content prediction model 1808 without outlier bias. In some embodiments, the training data may include characteristics of each user and the degree of engagement with content that each user encountered, where each record has an independent variable 1805 and a target output variable 1806.

In some embodiments, independent variable 1806 may include user characteristics data, such as, e.g., user data such as user characteristics, including e.g., browser, location, age, or other user characteristics or any combination thereof, and user engagement metrics such as e.g., click rates, click frequency, times spent on content, among other user engagement metrics or any combination thereof. In some embodiments, the target output variable 1806 of each data record may include content characteristics, e.g., content source, content location on page, content screen area, content type or classification.

In some embodiments, outlier analysis using DOBR may include pre-analysis where the error acceptance criterion ($\alpha$) 1802 is selected, such as $\alpha=80\%$. In some embodiments, the error acceptance criterion, $C(\alpha)$ may be defined according to, e.g., equation 1 as described above. In some embodiments, while other functional relationships may be used to set $C(\alpha)$, the percentile function is an intuitive guide in understanding why the model includes or excludes certain data records, such as equation 2 as described above. Since the DOBR procedure is iterative, in an embodiment, a convergence criterion 1824 may be defined, such as, e.g., 0.5%.

In some embodiments, each data record of the user engagement training data 1804 may be provided to the content prediction model 1808 to generate a predicted output variable 1810 for each independent variable 1805. In some embodiments, the target output variable 1806 and the predicted output variable 1810 may include content characteristics for identifying content to surface to the user such as, e.g., content source, content location on page, content screen area, content type or classification. Accordingly, to learn and predict outputs according to the user characteristics data of the independent variable 1805, the content prediction model 1808 may employ a suitable classifier machine learning model such as, e.g., a multi-label classifier. For example, the content prediction model 1808 may include, e.g., collaborative filtering, logistic regression, Decision Tree, Random forest, K-Nearest Neighbor, Support vector machine, Neural network (e.g., a convolutional neural network), or any other suitable classifier model or any combination thereof. In some embodiments, DOBR can be implemented to reduce bias in training the content prediction model M 1808 to more accurately predict future grid demand levels without outlier bias.

In some embodiments, the content prediction model M 1808 is implemented by a model engine, including, e.g., a processing device and a memory and/or storage device. According to an embodiment, the exemplary methodology computes model coefficients, M(c) 1802 and model estimates $\{y_{pred}\}$ 1810 for all records applying the content prediction model M 1808, to the complete input dataset $\{x, y_{tar}\}$ 1804 according to, e.g., equation 3 as described above.

Then, according to an illustrative embodiment, a total error function 1818 computes initial model total error $e_0$ according to, e.g., equation 18 as described above. In some embodiments, the total model error may include a model prediction error aggregating individual errors of the predicted content characteristics compared to the target content characteristics of the target output variable 1806 for each independent variable 1805. Accordingly, the error function 1812 may also compute model errors according to, e.g., equation 5 as described above.

For example, in some embodiments, the predicted output variable 1810 may be compared against the target variable 1806 to assess error in the prediction. In some embodiments, the error may be influenced by an optimizer that employs a loss function to maximize user engagement metrics, such as, e.g., click rates, click frequency, times spent on content, among other user engagement metrics or any combination thereof. Accordingly, the error based on a difference between the predicted output variable 1810 and the target variable 1806 according to user engagement levels may be used to update the coefficients of the content prediction model 1808.

In some embodiments, the model errors are employed to determine a data record selection vector $\{I_k\}$ according to, e.g., equation 6 as described above. In some embodiments, the data record section vector may include a binary classification based on a percentile of each model error for each data record in a distribution of the model errors. In some embodiments, the data record selection vector includes a percentile threshold, above which data records are classified as outliers, and equal to or below which data records are classified as non-outliers. According to an illustrative embodiment, the error function 1812 computes a new data record selection vector $\{I_k\}$ according to, e.g., equation 6 as described above to define the outlier dataset 1817 and the non-outlier dataset 1816. According to an illustrative embodiment, a data record selector 1814 computes the non-outlier data records to be included in model computation by selecting only records where the record selection vector is equal to 1, according to, e.g., equation 7 as described above.

Then, according to an illustrative embodiment, the content prediction model 1808 with the latest coefficients 1802 computes new predicted content characteristics 1820 and model coefficients 1802 from the DOBR selected data records 1816 according to, e.g., equation 8 as described above.

Then, according to an illustrative embodiment, the content prediction model 1808 using the new model coefficients, compute new content characteristics 1820 for the complete dataset. This step reproduces computing the new content characteristics 1820 for the DOBR selected records in the formal steps, but in practice the new model can be applied to just the DOBR removed records according to, e.g., equation 9 as described above. Then, according to an illustrative embodiment, the total error function 1818 computes model total error according to, e.g., equation 10 as described above.

Then, according to an illustrative embodiment, a convergence test 1824 tests model convergence according to, e.g., equation 11 described above using the convergence criteria 1822 ($\beta$), such as, e.g., 0.5%. In some embodiments, the convergence test 1824 may terminate the iterative process if, for example, the percent error is less than, e.g., 0.5%. Otherwise, the process may return to the initial dataset 1804.

In some embodiments, referring to FIG. 18B, new user characteristics 1831 of a user viewing content on a user computing device 1830. For example, in some embodiments, the user characteristics 1831 may include, e.g., e.g., browser, software application, device identifier, location, age, or other user characteristics or any combination thereof characterizing the user at the user computing device 1830.

In some embodiments, according to the model coefficients resulting from the termination of the iterative DOBR process, the content prediction model 1808 may predict content characteristics 1832 for content to be displayed to the user to maximize user engagement. For example, in some embodiments, the prediction may include, e.g., a content source, content location on page, content screen area, content type or classification or any combination thereof. Accordingly, the content prediction model 1808 may produce a content recommendation and placement to maximize engagement.

In some embodiments, the user computing device 1820 may receive content selected according to the content characteristics 1832 to display the content to the user. Accordingly, the user computing device 1830 may automatically receive dynamically selected content to maximize user engagement for, e.g., improved advertising revenue, more accurate advertising subject matter, media (e.g., music, video, music, imagery, social media content, etc.) that more closely matches the user's behavior, etc. Accordingly, the DOBR process can improve the content prediction model 1808 to provide content according to the content characteristics 1832 with reduced bias due to outlier behavior.

In some embodiments and, optionally, in combination of any embodiment described above or below, the exemplary DOBR machine learning model may be based at least in part on is Monte Carlo method of computational algorithms (e.g., the Solovay-Strassen type algorithms, the Baillie-PSW type algorithms, the Miller-Rabin type algorithms, and/or Schreier-Sims type algorithms) that may consider the historical quality data for the desired non-outlier data. In some embodiments and, optionally, in combination of any embodiment described above or below, the exemplary DOBR machine learning model may be continuously trained by, for example without limitation, applying at least one machine learning technique (such as, but not limited to, decision trees, boosting, support-vector machines, neural networks, nearest neighbor algorithms, Naive Bayes, bagging, random forests, etc.) to the collected and/or compiled sensor data (e.g., various type of visual data about environmental and/or cargo's physical/visual appearance). In some embodiments and, optionally, in combination of any embodiment described above or below, an exemplary neutral network technique may be one of, without limitation, feedforward neural network, radial basis function network, recurrent neural network, convolutional network (e.g., U-net) or other suitable network. In some embodiments and, optionally, in combination of any embodiment described above or below, an exemplary implementation of Neural Network may be executed as follows:

i) Define Neural Network architecture/model,
    ii) Transfer the input data to the exemplary neural network model,
    iii) Train the exemplary model incrementally,
    iv) determine the accuracy for a specific number of timesteps,
    v) apply the exemplary trained model to process the newly-received input data,
    vi) optionally and in parallel, continue to train the exemplary trained model with a predetermined periodicity.

In some embodiments and, optionally, in combination of any embodiment described above or below, the exemplary trained neural network model may specify a neural network by at least a neural network topology, a series of activation functions, and connection weights. For example, the topology of a neural network may include a configuration of nodes of the neural network and connections between such nodes. In some embodiments and, optionally, in combination of any embodiment described above or below, the exemplary trained neural network model may also be specified to include other parameters, including but not limited to, bias values/functions and/or aggregation functions. For example, an activation function of a node may be a step function, sine function, continuous or piecewise linear function, sigmoid function, hyperbolic tangent function, or other type of mathematical function that represents a threshold at which the node is activated. In some embodiments and, optionally, in combination of any embodiment described above or below, the exemplary aggregation function may be a mathematical function that combines (e.g., sum, product, etc.) input signals to the node. In some embodiments and, optionally, in combination of any embodiment described above or below, an output of the exemplary aggregation function may be used as input to the exemplary activation function. In some embodiments and, optionally, in combination of any embodiment described above or below, the bias may be a constant value or function that may be used by the aggregation function and/or the activation function to make the node more or less likely to be activated.

In some embodiments and, optionally, in combination of any embodiment described above or below, an exemplary connection data for each connection in the exemplary neural network may include at least one of a node pair or a connection weight. For example, if the exemplary neural network includes a connection from node N1 to node N2, then the exemplary connection data for that connection may include the node pair <N1, N2>. In some embodiments and, optionally, in combination of any embodiment described above or below, the connection weight may be a numerical quantity that influences if and/or how the output of N1 is modified before being input at N2. In the example of a recurrent network, a node may have a connection to itself (e.g., the connection data may include the node pair <N1, N1>).

In some embodiments and, optionally, in combination of any embodiment described above or below, the exemplary trained neural network model may also include a species identifier (ID) and fitness data. For example, each species ID may indicate which of a plurality of species (e.g., cargo's loss categories) the model is classified in. For example, the fitness data may indicate how well the exemplary trained neural network model models the input sensory data set. For example, the fitness data may include a fitness value that is determined based on evaluating the fitness function with respect to the model. For example, the exemplary fitness function may be an objective function that is based on a frequency and/or magnitude of errors produced by testing the exemplary trained neural network model on the input sensory data set. As a simple example, assume the input sensory data set includes ten rows, that the input sensory data set includes two columns denoted A and B, and that the exemplary trained neural network model outputs a predicted value of B given an input value of A. In this example, testing the exemplary trained neural network model may include inputting each of the ten values of A from the input sensor data set, comparing the predicted values of B to the corresponding actual values of B from the input sensor data set, and determining if and/or by how much the two predicted and actual values of B differ. To illustrate, if a particular neural network correctly predicted the value of B for nine of the ten rows, then the exemplary fitness function may assign the corresponding model a fitness value of 9/10=0.9. It is to be understood that the previous example is for illustration only and is not to be considered limiting. In some embodiments, the exemplary fitness function may be based on factors unrelated to error frequency or error rate, such as number of input nodes, node layers, hidden layers, connections, computational complexity, etc.

In some embodiments and, optionally, in combination of any embodiment described above or below, the present disclosure may utilize several aspects of at least one of:

U.S. Pat. No. 8,195,484, entitled Insurance product, rating system and method;

U.S. Pat. No. 8,548,833, entitled Insurance product, rating system and method;

U.S. Pat. No. 8,554,588, entitled Insurance product, rating system and method;

U.S. Pat. No. 8,554,589, entitled Insurance product, rating system and method;

U.S. Pat. No. 8,595,036, entitled Insurance product, rating system and method;

U.S. Pat. No. 8,676,610, entitled Insurance product, rating system and method;

U.S. Pat. No. 8,719,059, entitled Insurance product, rating system and method;

U.S. Pat. No. 8,812,331, entitled Insurance product, rating and credit enhancement system and method for insuring project savings.

At least some aspects of the present disclosure will now be described with reference to the following numbered clauses:

Clause 1. A method comprising:

receiving, by at least one processor, a training data set of target variables representing at least one activity-related attribute for at least one user activity;

receiving, by the at least one processor, at least one bias criteria used to determine one or more outliers;

determining, by the at least one processor, a set of model parameters for a machine learning model comprising:

(1) applying, by the at least one processor, the machine learning model having a set of initial model parameters to the training data set to determine a set of model predicted values;

(2) generating, by the at least one processor, an error set of data element errors by comparing the set of model predicted values to corresponding actual values of the training data set;

(3) generating, by the at least one processor, a data selection vector to identify non-outlier target variables based at least in part on the error set of data element errors and the at least one bias criteria;

(4) utilizing, by the at least one processor, the data selection vector on the training data set to generate a non-outlier data set;

(5) determining, by the at least one processor, a set of updated model parameters for the machine learning model based on the non-outlier data set; and (6) repeating, by the at least one processor, steps (1)-(5) as an iteration until at least one censoring performance termination criterion is satisfied so as to obtain the set of model parameters for the machine learning model as the updated model parameters, whereby each iteration re-generates the set of predicted values, the error set, the data selection vector, and the non-outlier data set using the set of updated model parameters as the set of initial model parameters;

training, by the at least one processor, based at least in part on the training data set and the data selection vector, a set of classifier model parameters of an outlier classifier machine learning model to obtain a trained outlier classifier machine learning model that is configured to identify at least one outlier data element;

applying, by the at least one processor, the trained outlier classifier machine learning model to a data set of activity-related data for the at least one user activity to determine:
  i) a set of outlier activity-related data in the data set of activity-related data, and
  ii) a set of non-outlier activity-related data in the data set of activity-related data; and
applying, by the at least one processor, the machine learning model to the set of non-outlier activity-related data elements to predict future activity-related attribute related to the at least one user activity.

Clause 2. A system comprising:
  at least one processor in communication with a non-transitory computer-readable storage medium having software instructions stored thereon, wherein the software instructions, when executed, cause the at least one processor to perform steps to:
    receive a training data set of target variables representing at least one activity-related attribute for at least one user activity;
    receive at least one bias criteria used to determine one or more outliers;
    determine a set of model parameters for a machine learning model comprising:
      (1) apply the machine learning model having a set of initial model parameters to the training data set to determine a set of model predicted values;
      (2) generate an error set of data element errors by comparing the set of model predicted values to corresponding actual values of the training data set;
      (3) generate a data selection vector to identify non-outlier target variables based at least in part on the error set of data element errors and the at least one bias criteria;
      (4) utilize the data selection vector on the training data set to generate a non-outlier data set;
      (5) determine a set of updated model parameters for the machine learning model based on the non-outlier data set; and
      (6) repeat steps (1)-(5) as an iteration until at least one censoring performance termination criterion is satisfied so as to obtain the set of model parameters for the machine learning model as the updated model parameters, whereby each iteration re-generates the set of predicted values, the error set, the data selection vector, and the non-outlier data set using the set of updated model parameters as the set of initial model parameters;
    train, based at least in part on the training data set and the data selection vector, a set of classifier model parameters of an outlier classifier machine learning model to obtain a trained outlier classifier machine learning model that is configured to identify at least one outlier data element;
    apply the trained outlier classifier machine learning model to a data set of activity-related data for the at least one user activity to determine:
      i) a set of outlier activity-related data in the data set of activity-related data, and
      ii) a set of non-outlier activity-related data in the data set of activity-related data; and
    apply the machine learning model to the set of non-outlier activity-related data elements to predict future activity-related attribute related to the at least one user activity.

Clause 3. The systems and methods of clauses 1 and/or 2, further comprising:
  applying, by the at least one processor, the data selection vector to the training data set to determine an outlier training data set;
  training, by the at least one processor, using the outlier training data set, at least one outlier-specific model parameter of at least one outlier-specific machine learning model to predict outlier data values; and
  utilizing, by the at least one processor, the outlier-specific machine learning model to predict outlier activity-related data values for the set of outlier activity-related data.

Clause 4. The systems and methods of clauses 1 and/or 2, further comprising:
  training, by the at least one processor, using the training data set, generalized model parameters of a generalized machine learning model to predict data values;
  utilizing, by the at least one processor, the generalized machine learning model to predict outlier activity-related data values for the set of outlier activity-related data; and
  utilizing, by the at least one processor, the generalized machine learning model to predict the activity-related data values.

Clause 5. The systems and methods of clauses 1 and/or 2, further comprising:
  applying, by the at least one processor, the data selection vector to the training data set to determine an outlier training data set;
  training, by the at least one processor, using the outlier training data set, an outlier-specific model parameters of an outlier-specific machine learning model to predict outlier data values;
  training, by the at least one processor, using the training data set, generalized model parameters of a generalized machine learning model to predict data values;
  utilizing, by the at least one processor, the outlier-specific machine learning model to predict outlier activity-related data values for the set of outlier activity-related data; and
  utilizing, by the at least one processor, the outlier-specific machine learning model to predict the activity-related data values.

Clause 6. The systems and methods of clauses 1 and/or 2, further comprising:
  training, by the at least one processor, using the training data set, generalized model parameters of a generalized machine learning model to predict data values;
  utilizing, by the at least one processor, the generalized machine learning model to predict the activity-related data values for the set of activity-related data;
  utilizing, by the at least one processor, the outlier classifier machine learning model to identify outlier activity-related data values of the activity-related data values; and
  removing, by the at least one processor, the outlier activity-related data values.

Clause 7. The systems and methods of clauses 1 and/or 2, wherein the training data set comprises the at least one activity-related attribute of concrete compressive strength as a function of concrete composition and concrete curing exposure.

Clause 8. The systems and methods of clauses 1 and/or 2, wherein the training data set comprises the at least one activity-related attribute of energy use data as a function of household environmental conditions and lighting conditions.

Clause 9. The systems and methods of clauses 1 and/or 2, further comprising:
  receiving, by the at least one processor, an application programming interface (API) request to generate a prediction with at least one data element; and instantiating, by the at least one processor, at least one cloud computing resource to schedule execution of the machine learning model;

utilizing, by the at least one processor according to the schedule for execution, the machine learning model to predict at least one activity-related data element value for the at least one data element; and returning, by the at least one processor, the at least one activity-related data element value to a computing device associated with the API request.

Clause 10. The systems and methods of clauses 1 and/or 2, wherein the training data set comprises the at least one activity-related attribute of three-dimensional patient imagery of a medical dataset; and wherein the machine learning model is configured to predict the activity-related data values comprising two or more physically-based rendering parameters based on the medical dataset.

Clause 11. The systems and methods of clauses 1 and/or 2, wherein the training data set comprises the at least one activity-related attribute of simulated control results for electronic machine commands; and wherein the machine learning model is configured to predict the activity-related data values comprising control commands for the electronic machine.

Clause 12. The systems and methods of clauses 1 and/or 2, further comprising:

splitting, by the at least one processor, the set of activity-related data into a plurality of subsets of activity-related data;

determining, by the at least one processor, an ensemble model for each subset of activity-related data of the plurality of subsets of activity-related data;

wherein the machine learning model comprises an ensemble of models;

wherein each ensemble model comprises a random combination of models from the ensemble of models;

utilizing, by the at least one processor, each ensemble model separately to predict ensemble-specific activity-related data values;

determining, by the at least one processor, an error for each ensemble model based on the ensemble-specific activity-related data values and known values; and selecting, by the at least one processor, a highest performing ensemble model based on a lowest error.

Publications cited throughout this document are hereby incorporated by reference in their entirety. While one or more embodiments of the present disclosure have been described, it is understood that these embodiments are illustrative only, and not restrictive, and that many modifications may become apparent to those of ordinary skill in the art, including that various embodiments of the inventive methodologies, the inventive systems/platforms, and the inventive devices described herein can be utilized in any combination with each other. Further still, the various steps may be carried out in any desired order (and any desired steps may be added and/or any desired steps may be eliminated).

What is claimed is:

1. A method comprising:

receiving, by at least one processor from at least one computing device associated with at least one production environment, a production-ready model request comprising a training data set of data records, having actual values;

wherein each data record comprising an independent variable and a target variable;

wherein each data record comprises an actual value associated with the target variable;

determining, by the at least one processor, at least one bias criteria;

selecting, by the at least one processor, at least one machine learning model based at least in part on the production-ready model request;

determining, by the at least one processor, a set of model parameters for the at least one machine learning model, comprising:

(1) applying, by the at least one processor, the at least one machine learning model having a set of initial model parameters to the training data set to determine a set of model predicted values;

(2) generating, by the at least one processor, an error set of data element errors by comparing each model predicted value in the set of model predicted values to a corresponding actual value of the actual values of each data record in the training data set;

(3) generating, by the at least one processor, a data selection vector to identify non-outlier target variables based at least in part on the error set of data element errors and the at least one bias criteria;

(4) applying, by the at least one processor, the data selection vector to the training data set to generate a non-outlier data set;

(5) determining, by the at least one processor, a set of updated model parameters for the at least one machine learning model based on the non-outlier data set; and (6) repeating, by the at least one processor, at least one iteration of steps (1)-(5) until at least one censoring performance termination criterion is satisfied so as to obtain the set of model parameters for the at least one machine learning model as the updated model parameters, whereby each iteration re-generates the set of predicted values, the error set, the data selection vector, and the non-outlier data set using the set of updated model parameters as the set of initial model parameters;

determining, by the at least one processor, a production-ready machine learning model of the at least one machine learning model based at least in part on a total error of the error set of data element errors; and transmitting, by the at least one processor, the production-ready machine learning model to the at least one computing device for use in the at least one production environment.

2. The method of claim 1, further comprising:

selecting, by the at least one processor, at least one outlier analytics machine learning model based at least in part on the production-ready model request;

determining, by the at least one processor, a set of outlier analytics model parameters for the at least one outlier analytics machine learning model comprising:

(7) applying, by the at least one processor, the at least one outlier analytics machine learning model having a set of initial model parameters to the training data set to determine a set of outlier analytics model predicted values; and (8) generating, by the at least one processor, an outlier analytics error set of outlier analytics data element errors by comparing the set of outlier analytics model predicted values to corresponding actual values of the training data set;

(9) repeating, by the at least one processor, steps (7)-(8) as a part of the at least one iteration until the at least one censoring performance termination criterion is satisfied for the at least one machine learning model; and transmitting, by the at least one processor, the outlier analytics machine learning model to the at least one computing device for use in the at least one production environment to predict a likelihood of outlier events.

3. The method of claim 1, wherein the independent variable of each data record comprises an electrical grid state;
wherein the electrical grid state
comprises: a time of day
identifier,
a date identifier,
a weather identifier,
a location identifier,
a population density value,
or any combination thereof,
wherein the target variable comprises a grid energy demand value; and
wherein the at least one machine learning model comprises at least one energy demand prediction machine learning model trained to predict grid energy demand value based at least in part on subsequent electrical grid states.

4. The method of claim 3, further comprising:
selecting, by the at least one processor, at least one extreme demand machine learning model based at least in part on the production-ready model request;
determining, by the at least one processor, a set of extreme demand model parameters for the at least one extreme demand machine learning model comprising:
  (7) applying, by the at least one processor, the at least one extreme demand machine learning model having a set of initial model parameters to the training data set to determine a set of extreme demand model predicted values; and
  (8) generating, by the at least one processor, an extreme demand error set of extreme demand data element errors by comparing the set of extreme demand model predicted values to corresponding actual values of the training data set;
  (9) repeating, by the at least one processor, steps (7)-(8) as a part of the at least one iteration until the at least one censoring performance termination criterion is satisfied for the at least one machine learning model; and
transmitting, by the at least one processor, the extreme demand machine learning model to the at least one computing device for use in the at least one production environment to predict a likelihood of extreme grid demand.

5. The method of claim 1, wherein the independent variable of each data record comprises user characteristics;
wherein the user characteristics comprise:
  a browser identifier,
  a location identifier,
  an age identifier, or
  any combination thereof,
wherein the target variable
comprises;
  an identifier of content source,
  an identifier of content location on a web page,
  an identifier of content screen area,
  a content type identifier,
  a classification identifier, or
  any combination thereof, and wherein the at least one machine learning model comprises at least one content prediction machine learning model trained to predict a content recommendation based at least in part on subsequent user characteristics.

6. A method comprising:
transmitting, by at least one processor of at least one computing device associated with at least one production environment, a production-ready model request comprising a training data set of data records to at least one automated model generation processor;
  wherein each data record comprising an independent variable and a target variable;
  wherein each data record comprises an actual value associated with the target variable;
receiving, by the at least one processor from the at least one automated model generation processor, a production-ready machine learning model, having actual values;
wherein the production-ready machine learning model is selected from at least one machine learning model based at least in part on a total error of an error set of data element errors;
wherein the total error is based at least in part on at least one iteration performed by the at least one automated model generation processor, the at least one iteration comprising:
  determining a set of model parameters for the at least one machine learning model comprising:
    (1) applying the at least one machine learning model having a set of initial model parameters to the training data set to determine a set of model predicted values;
    (2) generating the error set of data element errors by comparing each model predicted value in the set of model predicted values to a corresponding actual value of the actual values of each data record in the training data set;
    (3) generating a data selection vector to identify non-outlier target variables based at least in part on the error set of data element errors and at least one bias criteria;
    (4) applying the data selection vector to the training data set to generate a non-outlier data set;
    (5) determining a set of updated model parameters for the at least one machine learning model based on the non-outlier data set; and
    (6) repeating at least one iteration of steps (1)-(5) until at least one censoring performance termination criterion is satisfied so as to obtain the set of model parameters for the at least one machine learning model as the updated model parameters, whereby each iteration re-generates the set of predicted values, the error set, the data selection vector, and the non-outlier data set using the set of updated model parameters as the set of initial model parameters.

7. The method of claim 6, further comprising receiving, by the at least one processor, an outlier analytics machine learning model for use in the at least one production environment to predict a likelihood of outlier events;
wherein the at least one iteration further comprises:
  selecting at least one outlier analytics machine learning model based at least in part on the production-ready model request;
  determining a set of outlier analytics model parameters for the at least one outlier analytics machine learning model comprising:

(7) applying the at least one outlier analytics machine learning model having a set of initial model parameters to the training data set to determine a set of outlier analytics model predicted values; and (8) generating an outlier analytics error set of outlier analytics data element errors by comparing the set of outlier analytics model predicted values to corresponding actual values of the training data set; and (9) repeating steps (7)-(8) as a part of the at least one iteration until the at least one censoring performance termination criterion is satisfied for the at least one machine learning model.

8. The method of claim 6, wherein the independent variable of each data record comprises an electrical grid state;

wherein the electrical grid state
comprises: a time of day identifier,
a date identifier,
a weather identifier,
a location identifier,
a population density value, or
any combination thereof,
wherein the target variable comprises a grid energy demand value; and
wherein the at least one machine learning model comprises at least one energy demand prediction machine learning model trained to predict grid energy demand value based at least in part on subsequent electrical grid states.

9. The method of claim 8, further comprising receiving, by the at least one processor, an extreme demand machine learning model for use in the at least one production environment to predict a likelihood of extreme grid demand;

wherein the at least one iteration further comprises:
selecting at least one extreme demand machine learning model based at least in part on the production-ready model request;
determining a set of extreme demand model parameters for the at least one extreme demand machine learning model comprising:

(7) applying the at least one extreme demand machine learning model having a set of initial model parameters to the training data set to determine a set of extreme demand model predicted values; and (8) generating an extreme demand error set of extreme demand data element errors by comparing the set of extreme demand model predicted values to corresponding actual values of the training data set; and (9) repeating steps (7)-(8) as a part of the at least one iteration until the at least one censoring performance termination criterion is satisfied for the at least one machine learning model.

10. The method of claim 6, wherein the independent variable of each data record comprises user characteristics;
wherein the user characteristics
comprise: a browser identifier,
location identifier,
an age identifier, or
any combination thereof;

wherein the target variable
comprises;
an identifier of content source,
an identifier of content location on a web page,
an identifier of content screen area,
a content type identifier,
a classification identifier, or
any combination thereof; and
wherein the at least one machine learning model comprises at least one content prediction machine learning model trained to predict a content recommendation based at least in part on subsequent user characteristics.

11. A system comprising:
at least one processor configured to execute software instructions that cause the at least one processor to perform steps to:
receive, from at least one computing device associated with at least one production environment, a production-ready model request comprising a training data set of data records, having actual values;
wherein each data record comprising an independent variable and a target variable;
wherein each data record comprises an actual value associated with the target variable;
determine at least one bias criteria;
select at least one machine learning model based at least in part on the production-ready model request;
determine a set of model parameters for the at least one machine learning model comprising:

(1) apply the at least one machine learning model having a set of initial model parameters to the training data set to determine a set of model predicted values;

(2) generate an error set of data element errors by comparing eh model predicted value in the set of model predicted values to a corresponding actual value of the actual values of each data record in the training data set;

(3) generate a data selection vector to identify non-outlier target variables based at least in part on the error set of data element errors and the at least one bias criteria;

(4) apply the data selection vector to the training data set to generate a non-outlier data set;

(5) determine a set of updated model parameters for the at least one machine learning model based on the non-outlier data set; and (6) repeat at least one iteration of steps (1)-(5) until at least one censoring performance termination criterion is satisfied so as to obtain the set of model parameters for the at least one machine learning model as the updated model parameters, whereby each iteration re-generates the set of predicted values, the error set, the data selection vector, and the non-outlier data set using the set of updated model parameters as the set of initial model parameters;

determine a production-ready machine learning model of the at least one machine learning model based at least in part on a total error of the error set of data element errors; and transmit the production-ready machine learning model to the at least one computing device for use in the at least one production environment.

12. The system of claim 11, wherein the at least one processor is further configured to execute software instructions that cause the at least one processor to perform steps to:
- select at least one outlier analytics machine learning model based at least in part on the production-ready model request;
- determine a set of outlier analytics model parameters for the at least one outlier analytics machine learning model comprising:
  - (7) apply the at least one outlier analytics machine learning model having a set of initial model parameters to the training data set to determine a set of outlier analytics model predicted values; and
  - (8) generate outlier analytics error set of outlier analytics data element errors by comparing the set of outlier analytics model predicted values to corresponding actual values of the training data set;
  - (9) repeat steps (7)-(8) as a part of the at least one iteration until the at least one censoring performance termination criterion is satisfied for the at least one machine learning model; and
- transmit the outlier analytics machine learning model to the at least one computing device for use in the at least one production environment to predict a likelihood of outlier events.

13. The system of claim 11, wherein the independent variable of each data record comprises an electrical grid state;
- wherein the electrical grid state
  - comprises: a time of day identifier,
  - a date identifier,
  - a weather identifier,
  - a location identifier,
  - a population density value, or
  - any combination thereof;
- wherein the target variable comprises a grid energy demand value; and
- wherein the at least one machine learning model comprises at least one energy demand prediction machine learning model trained to predict grid energy demand value based at least in part on subsequent electrical grid states.

14. The system of claim 13, wherein the at least one processor is further configured to execute software instructions that cause the at least one processor to perform steps to:
- select at least one extreme demand machine learning model based at least in part on the production-ready model request;
- determine a set of extreme demand model parameters for the at least one extreme demand machine learning model comprising:
  - (7) apply the at least one extreme demand machine learning model having a set of initial model parameters to the training data set to determine a set of extreme demand model predicted values; and
  - (8) generate an extreme demand error set of extreme demand data element errors by comparing the set of extreme demand model predicted values to corresponding actual values of the training data set;
  - (9) repeat steps (7)-(8) as a part of the at least one iteration until the at least one censoring performance termination criterion is satisfied for the at least one machine learning model; and
- transmit the extreme demand machine learning model to the at least one computing device for use in the at least one production environment to predict a likelihood of extreme grid demand.

15. The system of claim 11, wherein the independent variable of each data record comprises user characteristics;
- wherein the user characteristics
  - comprise: a browser identifier,
  - a location identifier,
  - an age identifier, or
  - any combination thereof;
- wherein the target variable
- comprises;
  - an identifier of content source,
  - an identifier of content location on a web page,
  - an identifier of content screen area,
  - a content type identifier,
  - a classification identifier, or
  - any combination thereof; and
- wherein the at least one machine learning model comprises at least one content prediction machine learning model trained to predict a content recommendation based at least in part on subsequent user characteristics.

16. A system comprising:
- at least one processor of at least one computing device associated with at least one production environment, wherein the at least one processor is configured to execute software instructions that cause the at least one processor to perform steps to:
  - transmit a production-ready model request comprising a training data set of data records to at least one automated model generation processor;
    - wherein each data record comprising an independent variable and a target variable;
    - wherein each data record comprises an actual value associated with the target variable;
  - receive, from the at least one automated model generation processor, a production-ready machine learning model, having actual values;
    - wherein the production-ready machine learning model is selected from at least one machine learning model based at least in part on a total error of an error set of data element errors;
    - wherein the total error is based at least in part on at least one iteration performed by the at least one automated model generation system, the at least one iteration comprising:
      - determining a set of model parameters for the at least one machine learning model comprising:
        - (1) applying the at least one machine learning model having a set of initial model parameters to the training data set to determine a set of model predicted values;
        - (2) generating the error set of data element errors by comparing each model predicted value in the set of model predicted values to a corresponding actual value of the actual values of each data record in the training data set;
        - (3) generating a data selection vector to identify non-outlier target variables based at least in part on the error set of data element errors and at least one bias criteria;
        - (4) applying the data selection vector to the training data set to generate a non-outlier data set;

(5) determining a set of updated model parameters for the at least one machine learning model based on the non-outlier data set; and
(6) repeating at least one iteration of steps (1)-(5) until at least one censoring performance termination criterion is satisfied so as to obtain the set of model parameters for the at least one machine learning model as the updated model parameters, whereby each iteration re-generates the set of predicted values, the error set, the data selection vector, and the non-outlier data set using the set of updated model parameters as the set of initial model parameters.

17. The system of claim 16, wherein the at least one processor is further configured to execute software instructions that cause the at least one processor to perform steps to receive an outlier analytics machine learning model for use in the at least one production environment to predict a likelihood of outlier events;
wherein the at least one iteration further comprises:
selecting at least one outlier analytics machine learning model based at least in part on the production-ready model request;
determining a set of outlier analytics model parameters for the at least one outlier analytics machine learning model comprising:
(7) applying the at least one outlier analytics machine learning model having a set of initial model parameters to the training data set to determine a set of outlier analytics model predicted values; and
(8) generating an outlier analytics error set of outlier analytics data element errors by comparing the set of outlier analytics model predicted values to corresponding actual values of the training data set; and
(9) repeating steps (7)-(8) as a part of the at least one iteration until the at least one censoring performance termination criterion is satisfied for the at least one machine learning model.

18. The system of claim 16, wherein the independent variable of each data record comprises an electrical grid state;
wherein the electrical grid state
comprises: a time of day
identifier,
a date identifier,
a weather identifier,
a location identifier,
a population density value, or
any combination thereof,
wherein the target variable comprises a grid energy demand value; and
wherein the at least one machine learning model comprises at least one energy demand prediction machine learning model trained to predict grid energy demand value based at least in part on subsequent electrical grid states.

19. The system of claim 18, wherein the at least one processor is further configured to execute software instructions that cause the at least one processor to perform steps to receive an extreme demand machine learning model for use in the at least one production environment to predict a likelihood of extreme grid demand;
wherein the at least one iteration further comprises:
selecting at least one extreme demand machine learning model based at least in part on the production-ready model request;
determining a set of extreme demand model parameters for the at least one extreme demand machine learning model comprising:
(7) applying the at least one extreme demand machine learning model having a set of initial model parameters to the training data set to determine a set of extreme demand model predicted values; and
(8) generating an extreme demand error set of extreme demand data element errors by comparing the set of extreme demand model predicted values to corresponding actual values of the training data set; and
(9) repeating steps (7)-(8) as a part of the at least one iteration until the at least one censoring performance termination criterion is satisfied for the at least one machine learning model.

20. The system of claim 16, wherein the independent variable of each data record comprises user characteristics;
wherein the user characteristics comprise:
a browser identifier,
a location identifier,
an age identifier, or
any combination thereof;
wherein the target variable
comprises;
an identifier of content source,
an identifier of content location on a web page,
an identifier of content screen area,
a content type identifier,
a classification identifier, or
any combination thereof; and
wherein the at least one machine learning model comprises at least one content prediction machine learning model trained to predict a content recommendation based at least in part on subsequent user characteristics.

* * * * *